United States Patent
Parker

(10) Patent No.: US 7,462,848 B2
(45) Date of Patent: Dec. 9, 2008

(54) OPTICS FOR GENERATION OF HIGH CURRENT DENSITY PATTERNED CHARGED PARTICLE BEAMS

(75) Inventor: N. William Parker, Pleasanton, CA (US)

(73) Assignees: Multibeam Systems, Inc., Santa Clara, CA (US); Tokyo Electron Limited, Tokyo (JP)

(*) Notice: Subject to any disclaimer, the term of this patent is extended or adjusted under 35 U.S.C. 154(b) by 632 days.

(21) Appl. No.: 10/962,049

(22) Filed: Oct. 7, 2004

(65) Prior Publication Data

US 2006/0145097 A1    Jul. 6, 2006

Related U.S. Application Data

(60) Provisional application No. 60/509,582, filed on Oct. 7, 2003, provisional application No. 60/582,014, filed on Jun. 21, 2004.

(51) Int. Cl.
*H01J 1/50* (2006.01)
(52) U.S. Cl. .................. 250/492.23; 250/492.2
(58) Field of Classification Search ............ 250/492.22, 250/396 ML, 492.1–492.3
See application file for complete search history.

(56) References Cited

U.S. PATENT DOCUMENTS

| | | | |
|---|---|---|---|
| 4,243,866 A | | 1/1981 | Pfeiffer et al. |
| 4,514,638 A | | 4/1985 | Lischke et al. |
| 5,371,774 A | * | 12/1994 | Cerrina et al. ............... 378/34 |
| 5,455,427 A | * | 10/1995 | Lepselter et al. ....... 250/492.23 |
| 5,756,237 A | * | 5/1998 | Amemiya ..................... 430/5 |
| 5,817,442 A | * | 10/1998 | Okino .......................... 430/30 |
| 5,847,959 A | | 12/1998 | Veneklasen et al. |
| 5,981,962 A | | 11/1999 | Groves et al. |
| 6,355,994 B1 | | 3/2002 | Andeen et al. ............. 310/15 |
| 6,466,301 B1 | * | 10/2002 | Yui et al. ................... 355/53 |
| 6,556,702 B1 | * | 4/2003 | Rishton et al. ............. 382/144 |
| 6,614,035 B2 | | 9/2003 | Hartley |
| 6,635,402 B2 | * | 10/2003 | Yahiro ....................... 430/296 |
| 6,734,428 B2 | | 5/2004 | Parker et al. ............... 250/310 |
| 6,872,958 B2 | | 3/2005 | Andeen et al. |
| 6,878,936 B2 | | 4/2005 | Kienzle et al. |
| 6,903,345 B2 | * | 6/2005 | Ono et al. ............... 250/396 R |
| 7,084,414 B2 | | 8/2006 | Wieland et al. |

(Continued)

OTHER PUBLICATIONS

Mauer, J.L., Pfeiffer, H.C., Stickel, W., "Electronic Optics of an Electron-Beam Lithographic System," Abstract, IBM J. Res. Develop., Nov. 1977, pp. 514-521.

(Continued)

*Primary Examiner*—Jack I. Berman
*Assistant Examiner*—Andrew Smyth
(74) *Attorney, Agent, or Firm*—David H. Jaffer; Pillsbury Winthrop Shaw Pittman LLP

(57) ABSTRACT

A direct-write electron beam lithography system employing a patterned beam-defining aperture to enable the generation of high current-density shaped beams without the need for multiple beam-shaping apertures, lenses and deflectors is disclosed. Beam blanking is accomplished without the need for an intermediate crossover between the electron source and the wafer being patterned by means of a double-deflection blanker, which also facilitates proximity effect correction. A simple type of "moving lens" is utilized to eliminate off-axis aberrations in the shaped beam. A method for designing the patterned beam-defining aperture is also disclosed.

44 Claims, 57 Drawing Sheets

U.S. PATENT DOCUMENTS

2002/0127050 A1  9/2002  Andeen et al. .............. 403/220
2003/0066963 A1  4/2003  Parker et al.

OTHER PUBLICATIONS

Takahasi, Y., Yamada, A, Oae, Y., Yasuda, H., and Kawashima, K., "Electron beam lithography system with new correction techniques," J. Vac. Sci Technol. B 10(6), Nov./Dec. 1992, pp. 2794-2798.

Pfeiffer, H.C., Groves, T.R., Newman, T.H., "High Throughput, high-resolution electron-beam lithography," IBM J. Res. Develop., vol. 32, No. 4, Jul. 1999, pp. 494-500.

Van Der Mast, K.D., Pijper, F.J., and Barth, J.E., "A flexible beamshaper," Abstract, Microelectronic Engineering 5 (1986), Elsevier Science Publishers B.V. (North Holland), pp. 115-122.

* cited by examiner (a)
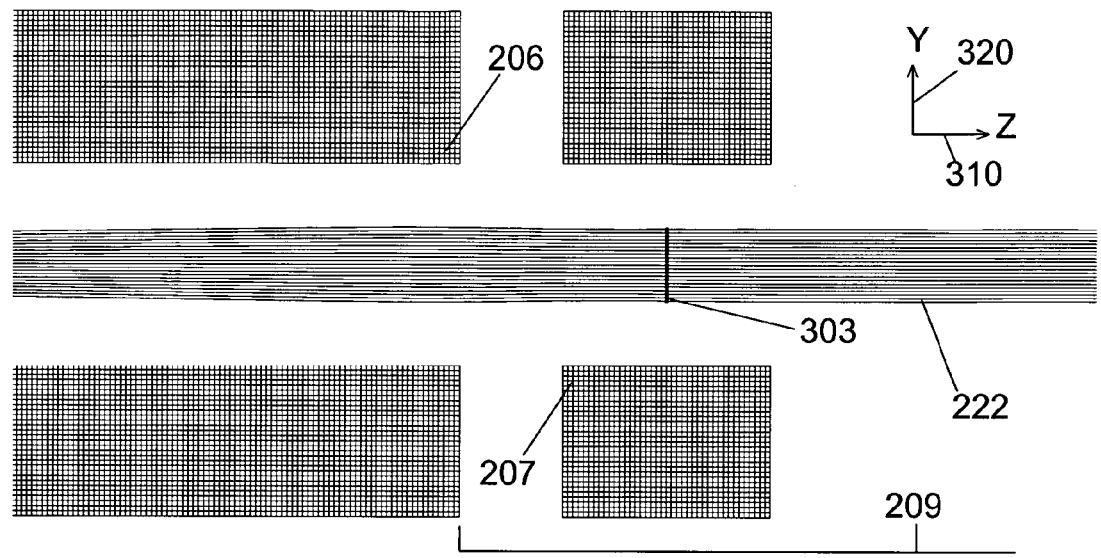
(b)
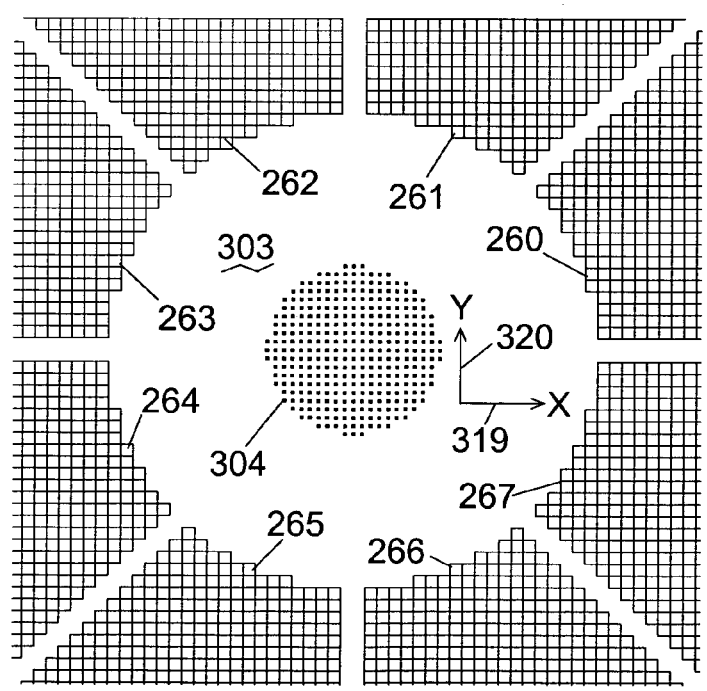
FIG. 3B

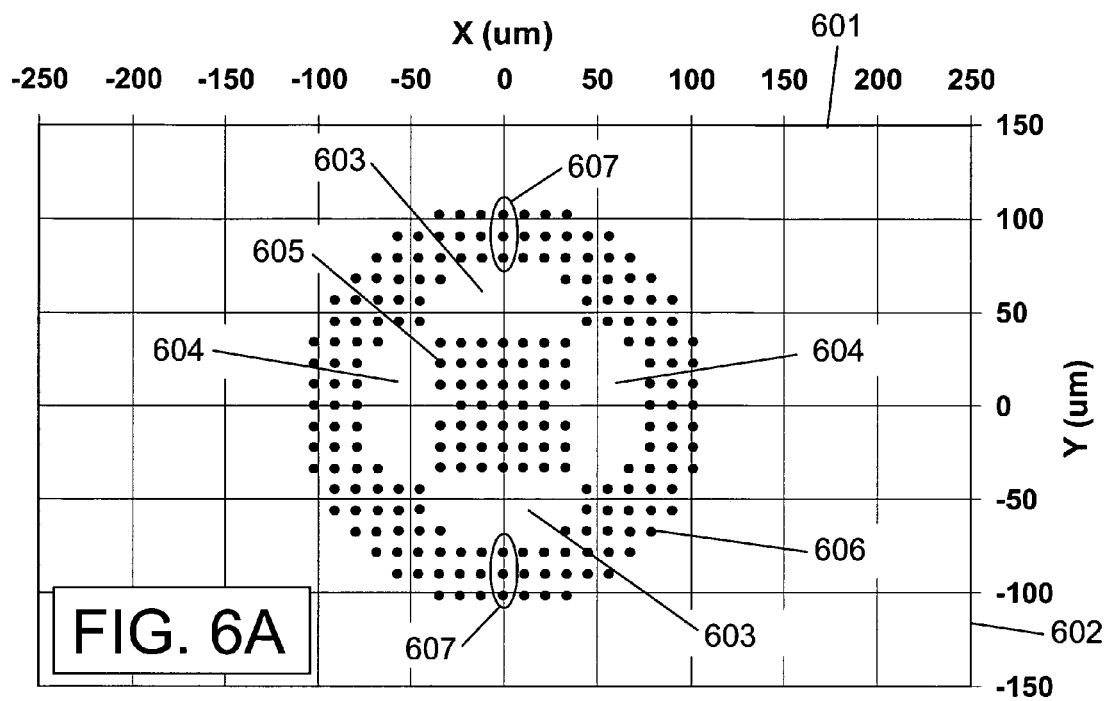
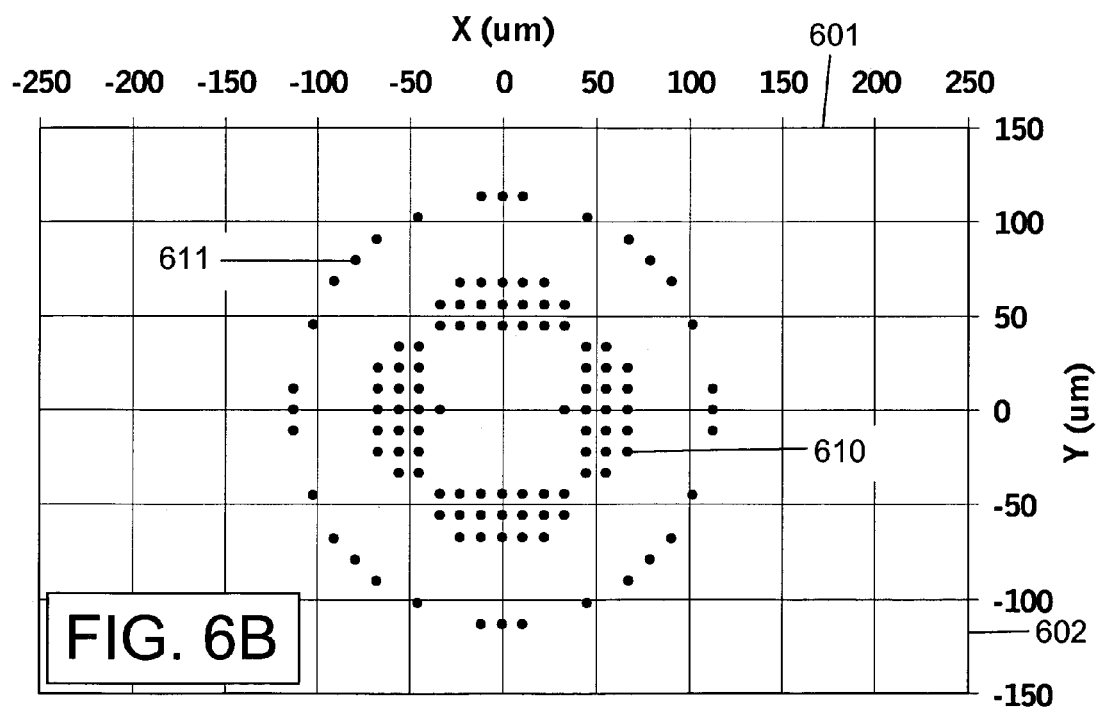

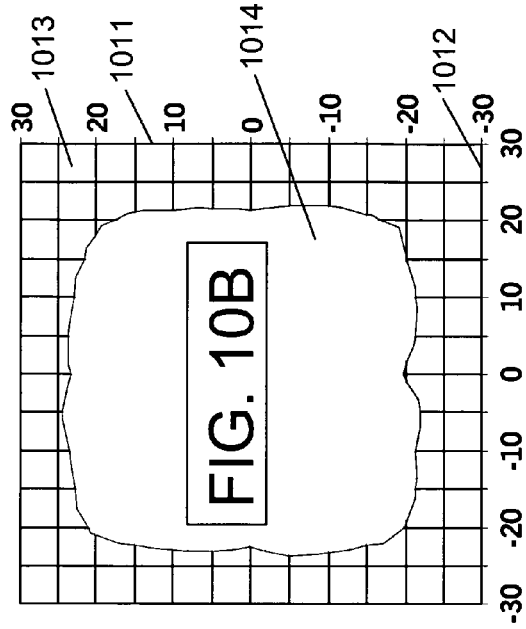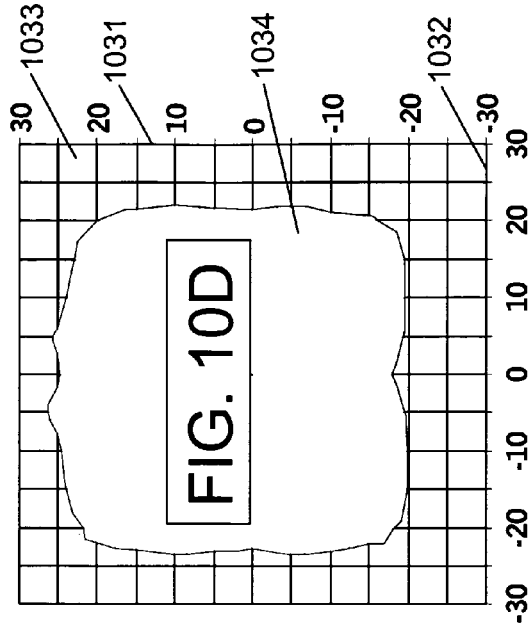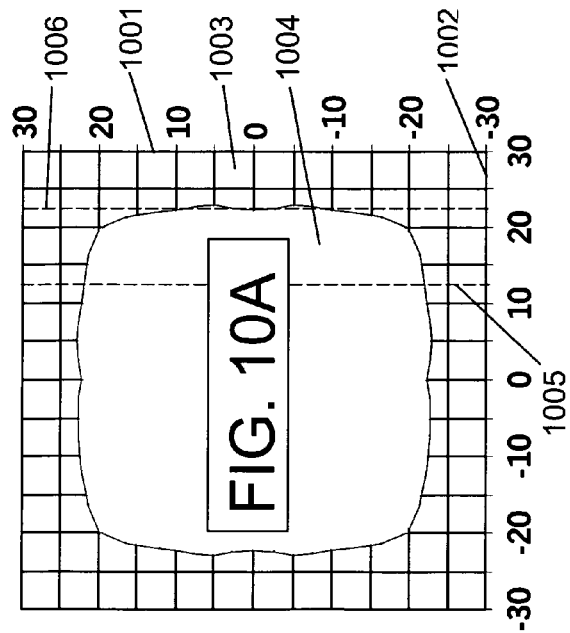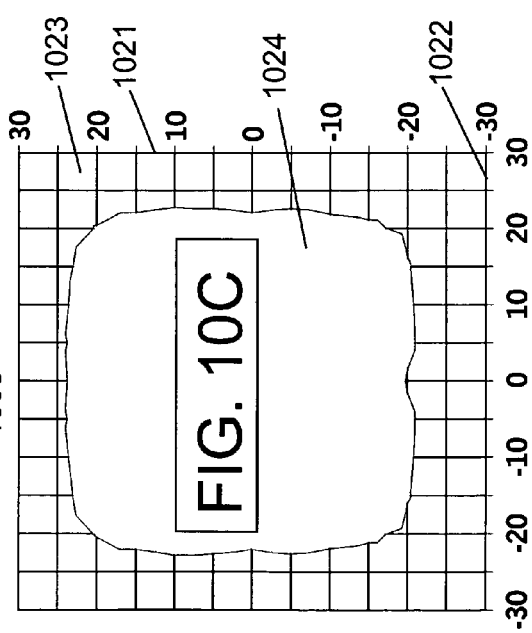

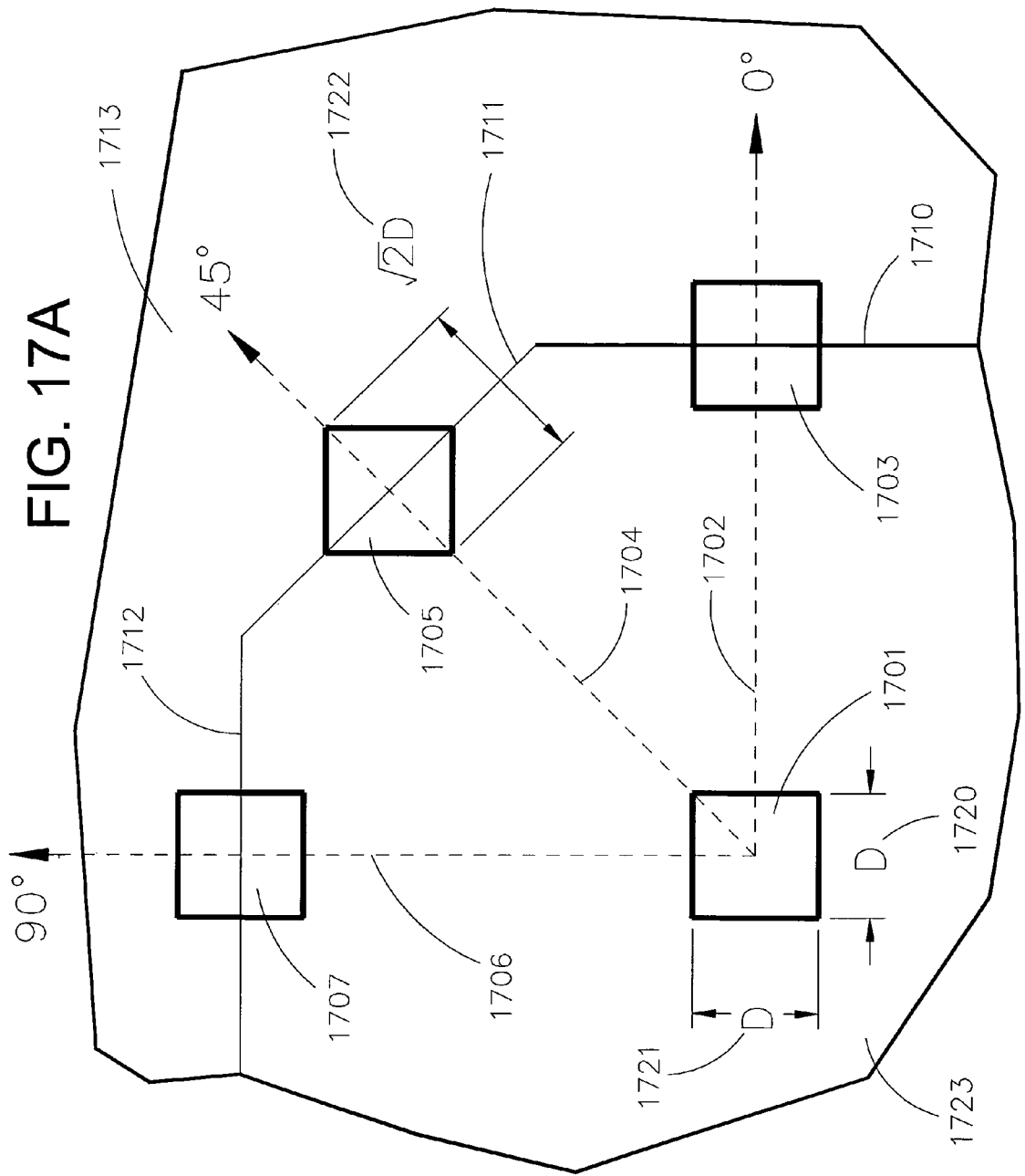

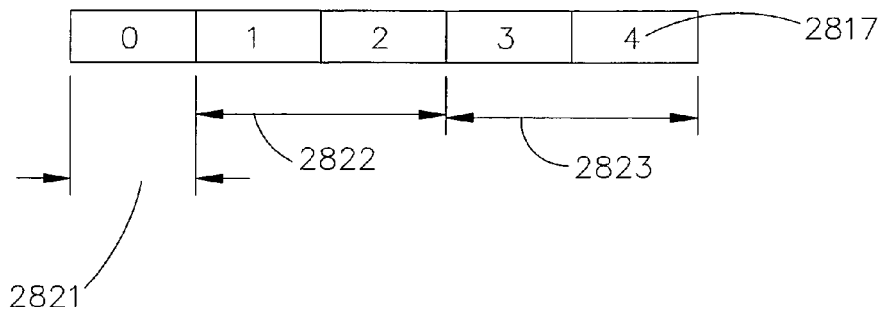
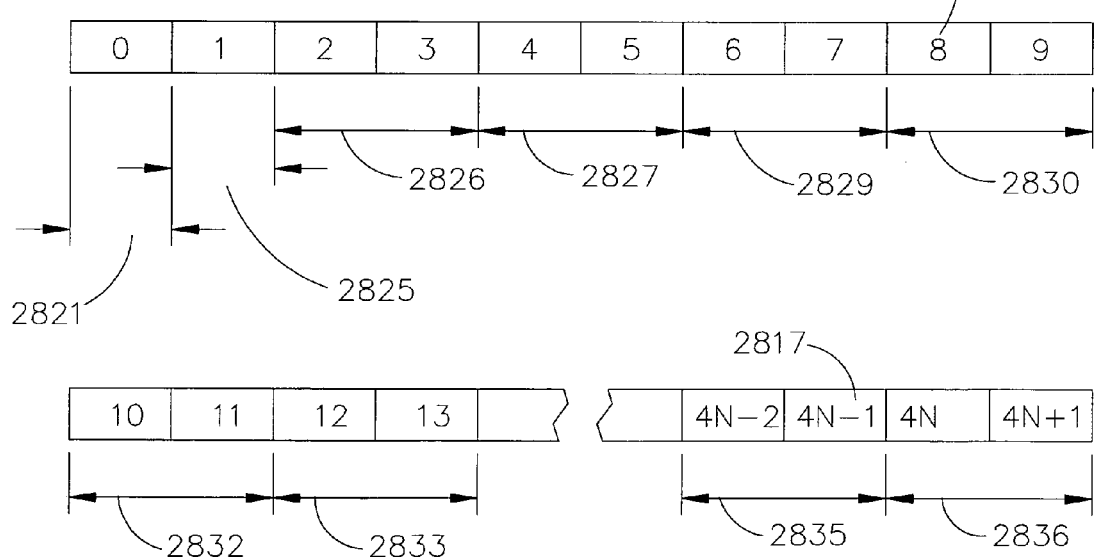
FIG. 28C

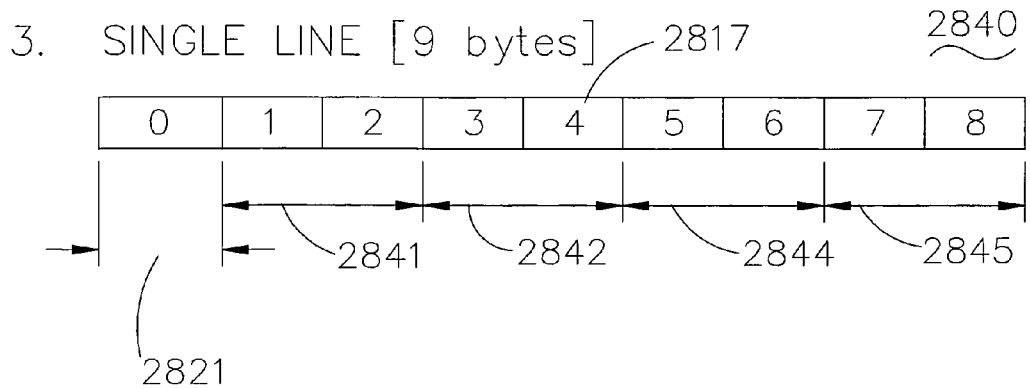
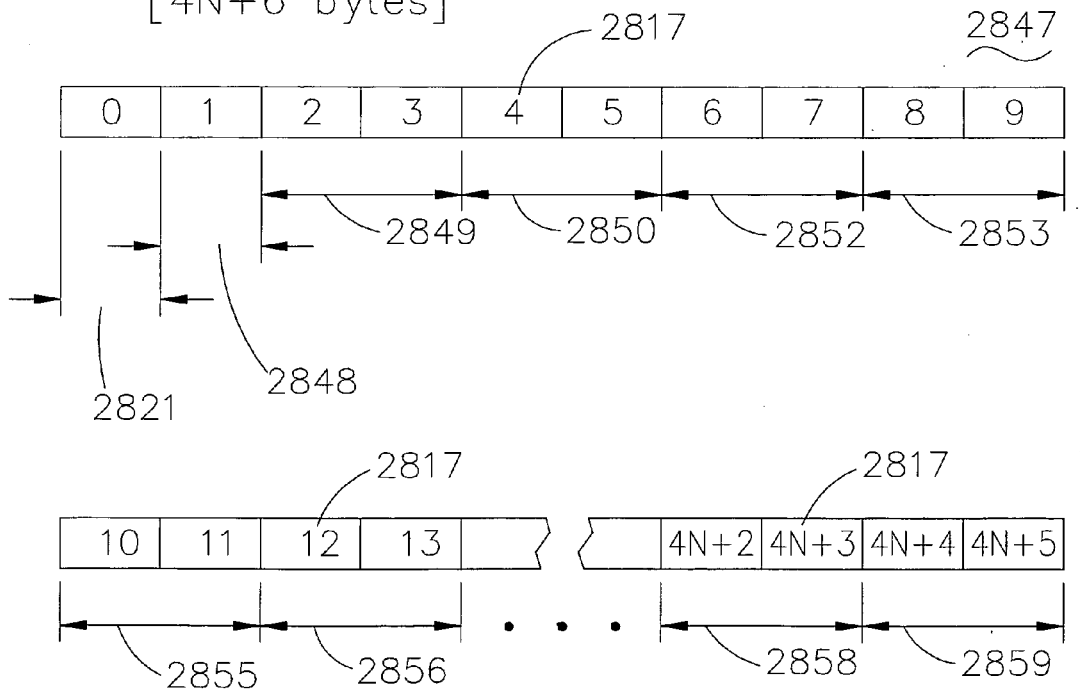
FIG. 28D

5. FILL SUBFIELD [1 byte]
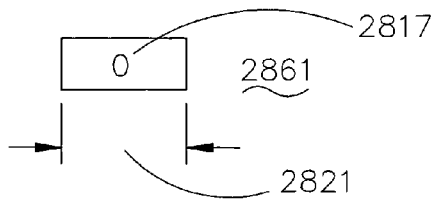
6. RECTANGLE [9 bytes]
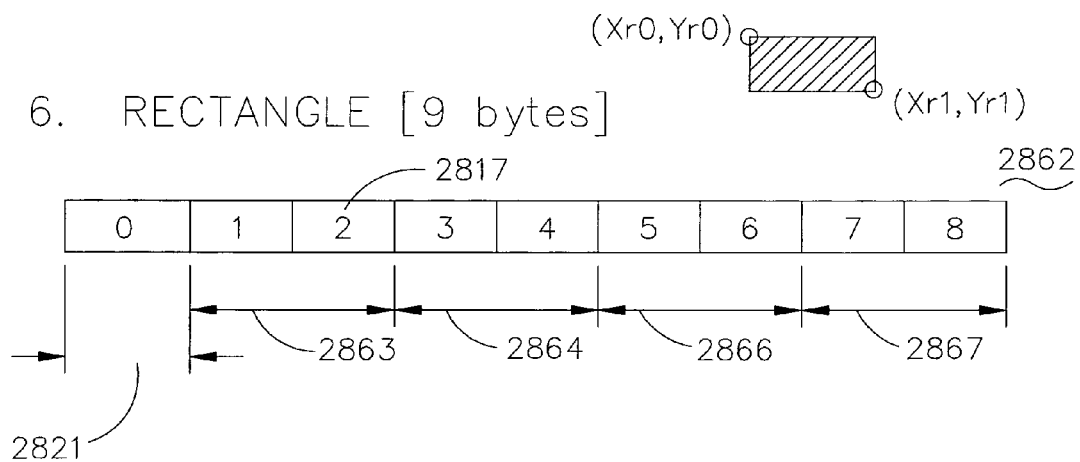
7. TRIANGLE (type a) [9 bytes]
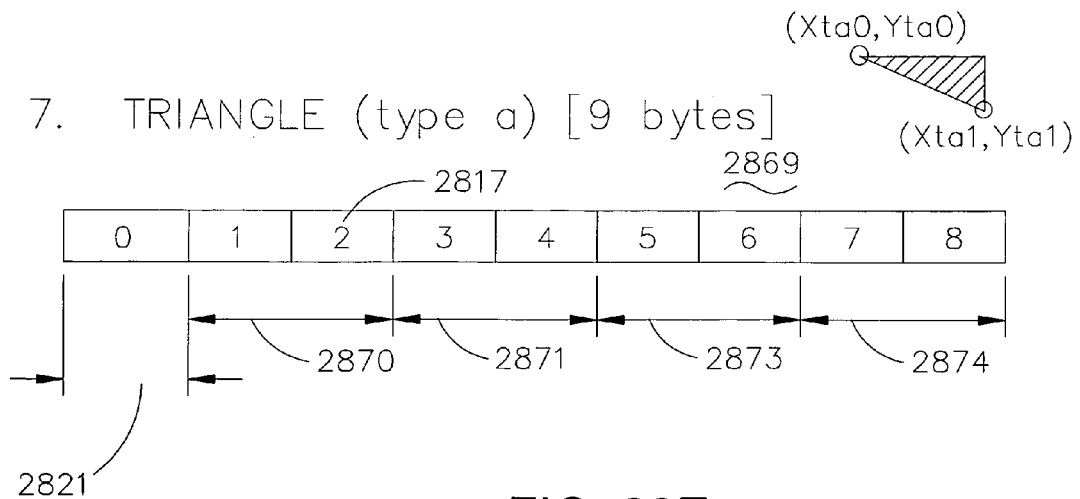
FIG. 28E

OPTICS FOR GENERATION OF HIGH CURRENT DENSITY PATTERNED CHARGED PARTICLE BEAMS

CROSS-REFERENCE TO RELATED APPLICATIONS

This application claims the benefit of U.S. Provisional Application Ser. No. 60/509,582 filed Oct. 7, 2003 and U.S. Provisional Application Ser. No. 60/582,014 filed Jun. 21, 2004, both incorporated by reference herein.

BACKGROUND OF THE INVENTION

1. Field of the Invention

This invention relates to the field of charged particle optics, and in particular to methods and systems for generation of high current density shaped electron beams.

2. Description of the Related Art

The use of electron beams to lithographically pattern semiconductor masks, reticles and wafers is an established technique. The different writing strategies used may be characterized by a few key parameters:

BEAM POSITIONING STRATEGY

There are two main approaches to the positioning of electron beams for the exposure of resist during the lithographic process:
(a) Raster Scanning, where the beam is moved on a regular two-dimensional lattice pattern. This method has the advantage that the scan electronics is typically simpler, but the disadvantage is that the beam may spend large amounts of time moving across areas not needing to be exposed. In addition, in order to accomplish very precise pattern edge placement, sophisticated gray-scale and/or multiple-pass scanning may be required.
(b) Vector Scanning where the beam is moved two-dimensionally directly to areas to be written. This method has the advantage of reduced time over areas not needing to be exposed, but the disadvantage of more complicated and expensive deflection electronics. Precise pattern edge placement is also easier, utilizing the beam placement capability on a 2D address grid much smaller than the beam size.

Each approach is advantageous in certain circumstances, the optimum choice depending on the pattern critical dimensions, pattern density (% of area to be written), and also on the profile of the beam current distribution (see below).

BEAM SHAPE CONTROL

There are two well-known approaches to the shaping of the electron beam used to expose the resist on the substrate:
(a) Gaussian beams are characterized by the highest current densities (typically >2000 A/cm$^2$) since in these systems, an image of the electron source is focused onto the substrate surface, thereby taking full advantage of the high brightness of the source. A key disadvantage of Gaussian beams is their long tails of current, stretching far outside the central beam diameter—only 50% of the beam current at the substrate falls within the FWHM of a two-dimensional Gaussian distribution.
(b) Shaped Beams are formed by electron optical columns typically having several intermediate shaping apertures, combined with additional deflectors and lenses to form a focused image of the aperture(s) on the substrate surface. These systems typically have beam current densities orders-of-magnitude lower (e.g. 20-50 A/cm$^2$) than for the Gaussian beams. An advantage of these systems is the reduced current tails outside the desired beam shape, making patterning less susceptible to process fluctuations. Another advantage is that effectively a large number of pixels may be written simultaneously since the area of, the variable shaped beam may be large in comparison to a single pixel.

There is a need in the semiconductor industry to achieve the highest patterning throughputs, both for mask and reticle writing as well as potentially for the direct writing of wafers. Either of the two approaches to beam positioning can be combined with either of the two approaches to beam shaping, but none of these four combinations is capable of fully meeting the semiconductor industry's needs. Clearly there is a need for an electron lithography system having high throughput (at least several wafers/hour or less than an hour to write a reticle), combined with the ability to patters very small CDs with edge placement accuracies <CD/8, as well as the simplest possible electron optical design to ensure adequate system reliability, long mean-time-between-failures (MTBF) and short mean-time-to-repair (MTTR).

SUMMARY OF THE INVENTION

A charged particle optical apparatus for generating a high current density shaped beam is disclosed herein. This apparatus utilizes a charged particle optical column design, typical of those used to generate high current density Gaussian beams, with the addition of a patterned beam-defining aperture which can be customized for insertion at various positions in the column. One example of a charged particle optical column design would employ two lenses, wherein a charged particle source emits a diverging beam of charged particles which are then formed into a roughly parallel charged particle beam by the first lens. The second lens then focuses the roughly parallel charged particle beam onto the surface of a substrate with a generally Gaussian current distribution, having a high current density at the center and long tails extending out in all directions from the center of the beam. In this example, the patterned beam-defining aperture could be positioned between the two lenses. Based on the design requirements of the pattern to be written, a beam shape at the substrate is determined. The shape of the patterned beam-defining aperture (PBDA) is then developed in a multi-step method disclosed herein. The PBDA shape must meet two requirements: (1) it should transmit a large portion of charged particles in the beam which would fall within the predetermined beam shape, and (2) it should block transmission of a large portion of charged particles in the beam which would fall outside the predetermined beam shape.

In a charged particle optical system employing the present invention, a number of additional components may be included, such as:

A Beam blanker—used to turn the beam on and off by deflecting the beam onto a blanking aperture. In the embodiment of the present invention illustrated herein, the PBDA also functions as the blanking aperture.

Deflectors—used to move the beam across the surface of the substrate in order to pattern an area. In this embodiment, a double-deflection main deflector moves the beam to the centers of 2 μm square subfields. Within each subfield, a subfield deflector consisting of a single octupole deflects the beam.

Moving Lenses—in order to minimize off-axis aberrations in the shaped beam, the effective optical axis of the second lens is displaced off-axis to match the beam deflection due to the mainfield deflector.

Stigmator—used to correct for imperfections in the optical column arising from mechanical defects or positioning errors in various elements.

The design method for the patterned beam-defining aperture starts with data about the pattern to be written (such as the IC dimensions and layout on the wafer, the critical dimensions of the IC, alignment mark designs, etc.) and combines this data with the optical characteristics of the charged particle beam column to determine the optimal shaped beam sizes to enable the patterns to be written with maximum efficiency (i.e., highest throughput). The PBDA design is then developed, first as an ideal shape, and then with modifications to enable it to be manufactured. After a proposed PBDA design is found, it is tested using the same procedure used to originally develop the design, typically employing charged particle design software using ray-tracing to simulate actual charged particles under the influence of electric and magnetic fields shaped by the electrodes and pole-pieces of the optical column.

The shaped beam generated by this column is characterized by improved current profile edge sharpness relative to a Gaussian beam, as well as a nearly square current distribution at the resist exposure dose (the latter being very desirable for lithography applications). Advantages of this apparatus include the ability to generate a shaped beam without the added complexity of shaping apertures, deflectors and lenses typically found, in variable-shaped beam columns. In addition, current densities approaching those of Gaussian beam systems are achieved, greatly reducing resist exposure times and enhancing writing throughputs in lithography applications.

A method is described for designing the patterned beam-defining aperture (PBDA). The core of this method involves ray tracing to determine which rays in the charged particle beam contribute to a desired beam profile at the substrate at a number of positions across the substrate surface, followed by a design process for a patterned beam-defining aperture which transmits rays contributing to the. desired beam profile and blocks rays falling outside the desired profile. Further innovative aspects of the invention are described in the following paragraphs.

Blanking System—the apparatus disclosed herein employs a unique blanking system which does not require the use of an intermediate crossover between the electron source and the wafer. A double-deflection blanker is used to project the effective blanking plane back to the position of the virtual source. This is advantageous since the absence of an intermediate crossover substantially reduces space charge beam spreading arising from electron-electron interactions. A further advantage of the double-deflection blanker geometry is the ability to blank beams over a much wider range of beam sizes—in prior art designs, since the (single) blanker had to be positioned at the cross-over for conjugate blanking, it was not possible to achieve the wide range of beam sizes (<30 nm to >120 nm) possible with the present invention since such a wide size range necessitates moving the cross-over to various (widely-spaced) positions along the optical axis in order to vary the column magnification. Another novel aspect of the blanking system is the use of a square beam-trimming aperture above the blankers to reduce the beam size and shape the beam into a square cross-section. This has the advantage that the beam is shaped to be only slightly larger than the PBDA (which also serves as the blanking aperture) thereby maximizing the attainable blanking speed. In addition, a square beam, when swept across the PBDA, will uniformly illuminate every part of the PBDA openings, thereby making the deposited current on the wafer more uniform within the shaped beam.

Main Deflectors—the present invention employs a unique main deflector design, optimized for the requirement to deflect the patterned beam a much larger distance off-axis in one direction (typically >25 μm) than in the other direction (~1 μm). The deflector design employs a large number of separate electrodes (22 in the embodiment herein), but requires only four drive signals. The arrangement of the 22 deflector electrodes simulates the electric field generated by a set of parallel plates, which is more uniform than is possible with prior art octupole designs. A more uniform electric field reduces the deflection aberrations induced in the beam, enabling sharper edge profiles in the patterned beam of the invention described herein. Prior art deflectors employ symmetrical octupole designs which would have increased aberrations for the large deflections required here.

Main Lens Design—to form a shaped high current-density beam on the wafer surface across a wide range of positions off-axis (at least 25 μm), the present invention employs a main lens structure in which the effective axis of the lens can be moved in synchrony with the deflection of the beam so that the beam always appears to be on the optical axis of the main lens. The lens structure of the present invention employs two sets of octupole electrodes integrated within the lens structure to add small transverse dipole fields to the generally axial electric fields of the lens. These dipole fields can offset the axial field by >25 μm in order to center the lens on the beam. Thus, the beam always undergoes a focusing effect nearly identical to that found on axis. This is advantageous since all off-axis aberrations, both geometrical (coma, astigmatism, curvature of field, distortion) and chromatic (variation in magnification) are essentially eliminated, thereby improving the edge sharpness of the patterned beam. Prior art systems employing "moving lenses" required much more complicated electrode designs than those employed herein.

Control System—the control system for the multicolumn optics accommodates a number of optical elements that are in common for all columns, and thus may be controlled by single controls, while other optical elements require individual controls, one for each column.

Pattern Data Path—the data path for the present invention employs a number of features required by the need to coordinate patterning of a number of columns simultaneously. It is necessary to stitch the written patterns of all columns together in order to preserve pattern quality on the wafer. In addition, for maximum writing efficiency, various patterned high current-density beams may be generated (different sizes in each column, if necessary). Thus one column might be writing 30 nm features while another column simultaneously is employing a 120 nm shaped beam to write a bonding pad containing a number of 2 μm square subfields.

Proximity Effect Correction Method—for correction of proximity effects, the present invention employs a method of subfield-by-subfield beam dose variation to minimize the beam writing dose in order to maximize process latitude during resist development. An iterative process is employed, wherein the fraction of area to be written in each subfield is determined, and then used to modify the doses in neighboring subfields to correct for backscattered electron (BSE) contributions to the total resist exposure.

BRIEF DESCRIPTION OF THE FIGURES

FIG. 3B shows various views of rays in the upper alignment deflector/stigmator 207.

FIG. 6A shows a graph of idealized beams transmitted by the patterned beam-defining aperture 212 in the column of FIG. 2A.

FIG. 6B shows a graph of idealized beams blocked by the patterned beam-defining aperture 212 in the column of FIG. 2A.

FIG. 10A shows a calculated exposure dose due to a single flash of a 40 nm square electron beam, when the beam is in position A of FIG. 9.

FIG. 10B shows a calculated exposure due to a single flash of a 40 nm square electron beam, when the beam is in position B of FIG. 9.

FIG. 10C shows a calculated exposure dose due to a single flash of a 40 nm square electron beam, when the beam is in position C of FIG. 9.

FIG. 10D shows a calculated exposure dose due to a single flash of a 40 nm square electron beam, when the beam is in position D of FIG. 9.

FIG. 17A shows a diagram of a possible beam-scanning method for use in setting up the optics to generate an optimized square beam profile.

FIG. 28C is a diagrammatic representation of examples of pattern data formats for writing a single flash and multiple flashes.

FIG. 28D is a diagrammatic representation of examples of pattern data formats for writing a single line and a polyline.

FIG. 28E is a diagrammatic representation of examples of pattern data formats for writing an entire subfield, a rectangle or a triangle in the upper right quadrant.

DETAILED DESCRIPTION

This invention will be discussed in detail using its implementation in the field of electron beam lithography as an illustrative example. However, many other fields of use are envisaged, as outlined immediately below.

Scanning electron microscopy typically utilizes a roughly Gaussian beam in order to maximize the beam current density, thereby minimizing imaging time and/or maximizing the image signal-to-noise ratio. The disadvantage of using a Gaussian beam for microscopy is the long current tails extending away from the center of the beam which tend to reduce the achievable image contrast. The present invention has potential uses in scanning electron microscopy to reduce the extent of these current tails, thus improving image contrast. These same considerations would apply to many types of scanned electron beam imaging and analysis tools, such as Scanning Auger Microscopes, Scanning Electron Microscopes, Scanning Transmission Electron Microscopes, etc.

The present invention also has potential applications in the fields of semiconductor metrology and inspection. For these applications, roughly Gaussian beams are used to maximize metrology and inspection throughputs by minimizing the times required to measure or inspect features on semiconductor wafers or masks and reticles. Elimination of the long current tails of the Gaussian distribution will improve the imaging contrast in these systems. Conversely, if the contrast were kept constant, the present invention would allow faster pixel data acquisition and thus improved throughputs.

The patterned beam-defining aperture of the present invention may also be used in other types of particle beam systems, utilizing ions, for example. One example is focused ion beam systems for maskless ion implantation. In these systems, the ion beam is composed of the desired implant ions (e.g., boron, arsenic, phosphorus, etc.) and the reduction of extraneous current tails would reduce the implantation of ions outside the region where doping is needed. Another example is focused ion beam direct-write lithography tools, where the ion beam is used to expose resist similarly to the case for electron beam direct-write systems. Reduction of extraneous current will improve the contrast in the lithography process, thereby increasing the process latitude for resist development. Still another example would be scanning secondary ion mass spectrometry (SIMS) systems, where the focused ion beam bombards a specimen surface, thereby inducing the emission of secondary ions characteristic of the chemical composition of the material. Reduction of extraneous ions would improve the contrast and resolution of SIMS images and mass spectra, since the secondary ions would be produced almost entirely from the region of interest with little production outside this region since the ion tails of the primary ion beam are greatly reduced.

Figure 1:
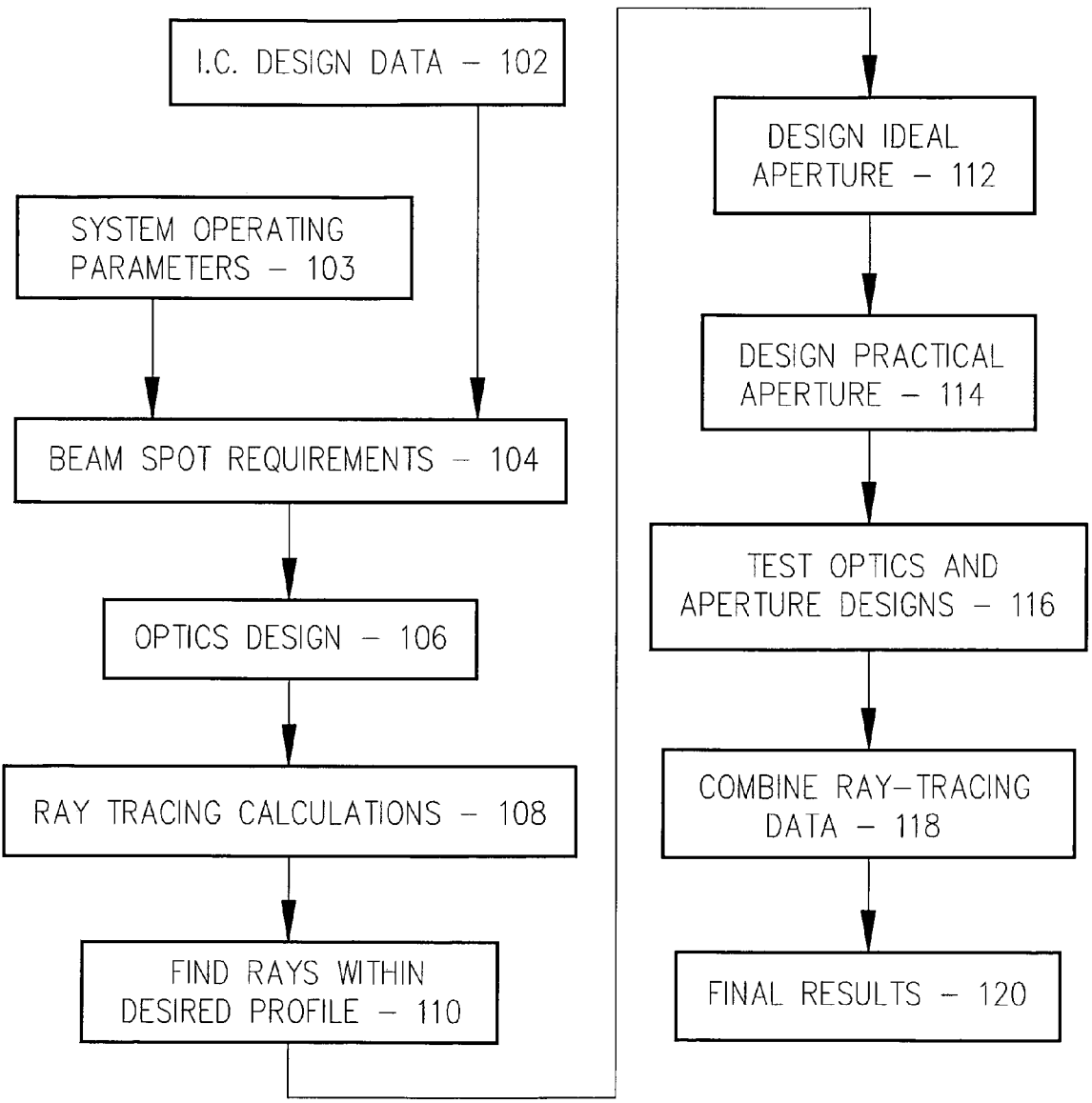
FIG. 1 shows a flow chart of the design procedure for an electron optical system employing a patterned beam-defining aperture, for use in generating high intensity patterned electron beams.

FIG. 1 illustrates a multi-step method for designing an electron optical column employing a patterned beam-defining aperture, for use in generating a high current-density shaped electron beam. In this example, a square beam is desired at the wafer, although a wide range of beam shapes may be realized with proper selection of the beam-defining aperture pattern.

In Block 102, the initial data concerning the integrated circuit (IC) patterns to be written is defined, including the critical dimension (CD) for the pattern, the IC X-Y dimensions, the X-Y layout of ICs on the wafer, and other data as required.

In Block 103, the initial data concerning the system operating parameters is defined, including the desired writing throughput (typically in wafers/hour), the resist sensitivity to the writing beam (typically in µC/cm²), the desired writing beam energy at the wafer, the writing overheads (such as the wafer transfer time, alignment time, etc.), and other parameters as required.

In block 104, from the pattern and writing specifications in blocks 102 and 103, the optimum patterned beam shape and size are determined, along with the required beam current density. For example, if a pattern CD of 45 nm was specified in block 102, a 40 nm square beam profile might be appropriate. If the resist sensitivity is 5 µC/cm², a beam current density of 3000 A/cm² might be necessary to achieve the desired writing throughput.

Next, in block 106, electron optical design calculations would typically be performed to develop the design of the column, including lens electrode bores, thicknesses, positions and voltages, and the diameter of a circular beam at the wafer which is larger than the size of the final patterned beam determined in block 104. For example, if a 40 nm square beam were desired, a circular beam of diameter $\geq \sqrt{2} \times 40\,\text{nm} \approx 56\,\text{nm}$ would be required—this beam diameter will then allow a square beam 40 nm×40 nm to be obtained in block 110 without rounding of the corners. FIGS. 2A-3M illustrate a typical electron optical column design developed with the aid of such a process. Alternatively, the parameters of an existing column may be input and then a patterned beam-defining aperture may be designed as described starting in block 108.

Figure 2A:
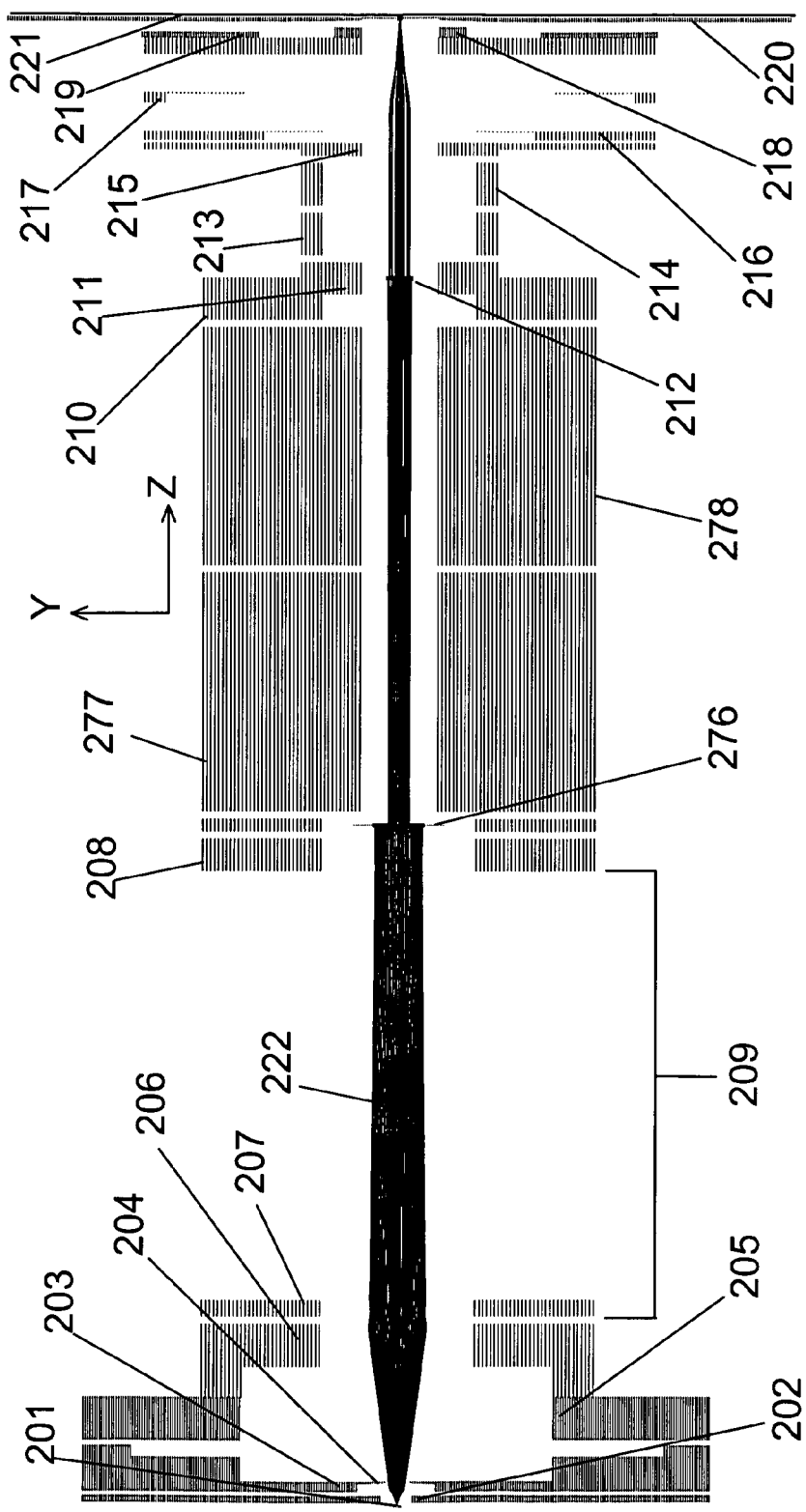
FIG. 2A shows a cross-sectional view of an electron optical column utilizing a non-circular aperture to produce a high current-density patterned electron beam.
Figure 4A:
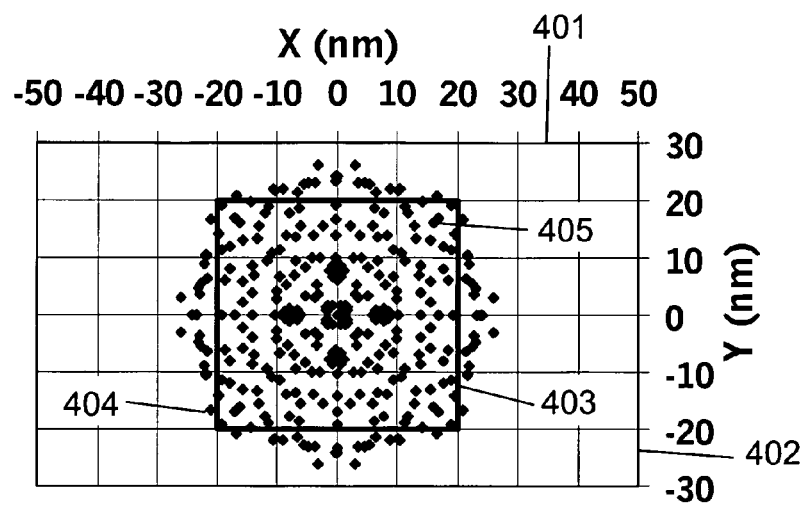
FIG. 4A shows a graph of a first circular beam profile centered on the optical axis (0,0) and in the plane of the wafer, prior to insertion of a first patterned aperture into the column of FIG. 2A; a desired square profile is superimposed on the graph.
Figure 4B:
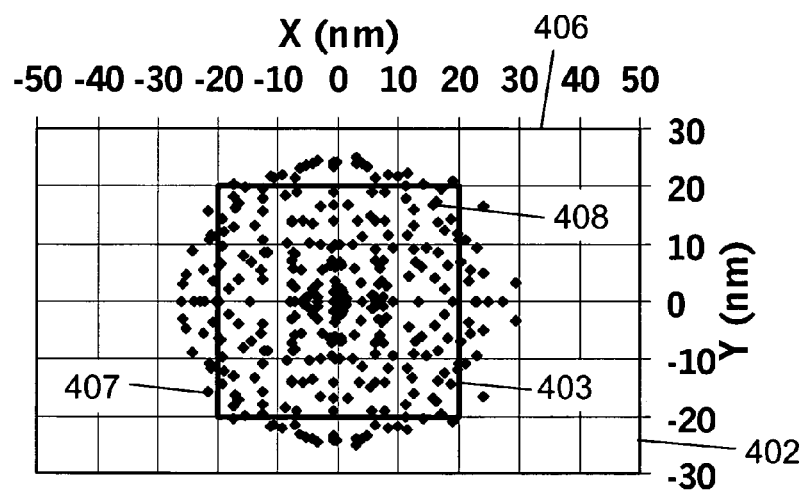
FIG. 4B shows a graph of a first circular beam profile centered +12.5 μm off the optical axis and in the plane of the wafer, prior to insertion of a first patterned aperture into the column of FIG. 2A; a desired square profile is superimposed on the graph.
Figure 4C:
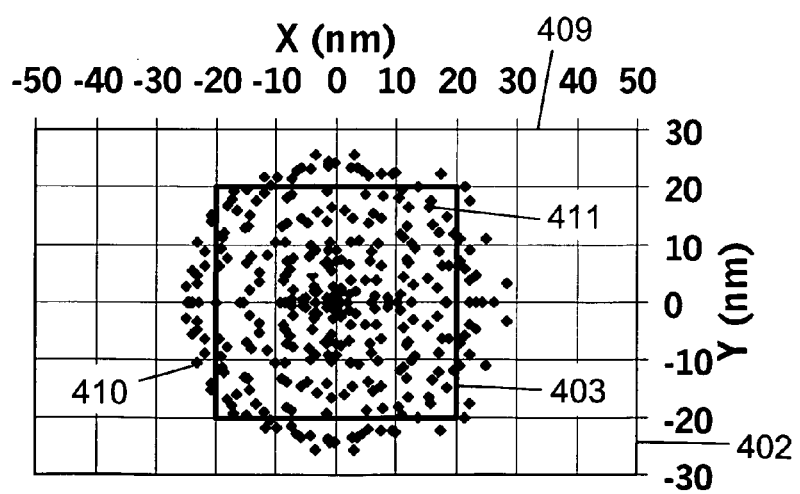
FIG. 4C shows a graph of a first circular beam profile centered +25 μm off the optical axis and in the plane of the wafer, prior to insertion of a first patterned aperture into the column of FIG. 2A; a desired square profile is superimposed on the graph.

Block 108 involves a series of electron optical design calculations utilizing the column design developed in block 106, wherein the ray (X, Y) locations at the beam-defining aperture 212 (see FIG. 2A) are recorded along with their end points (X, Y) on the wafer surface 221 (see FIG. 2A). Five sets of rays with different (X, Y) locations on the wafer are typically used: 1) on-axis (i.e., at the center of the scan), 2) ± a quarter-width of the scan, and 3) ± a half-width of the scan (i.e., at the two ends of the scan farthest off-axis). This data is then used to determine which rays for each set fall within the desired patterned high current-density beam profile and which rays for each set fall outside the desired pattern for each individual (X, Y) location on the wafer. FIGS. 4A-4C illustrate the segregation of the trajectory data at the wafer surface 221 into two groups: those within the desired pattern and those outside. Note that these sets of rays do not necessarily correspond to exactly the same rays for each of the five locations on the wafer, i.e., a ray passing through a particular position at the beam-defining aperture might fall inside the desired beam profile when the beam is positioned on-axis but might fall outside the desired beam profile when the beam has been deflected by ± a half-width of the scan. In general, FIGS. 4A-4C show that the beam at the wafer is circular in all three cases shown, with small variations in the positions of individual rays—this is the result of careful column design in block 106, in particular, the design of mainfield deflectors which introduce minimal beam aberration and the use of a moving main lens to nearly eliminate off-axis aberrations over the entire mainfield scan (±25 µm in this example).

Block 110 performs the next step: to find the intersection of the five sets of rays from block 108—this intersection corresponds to those rays falling within the desired patterned high current-density beam for all five wafer positions. Typically this set of rays is about 10-15% smaller than any of the original five sets of rays corresponding to each of the five individual wafer locations in block 108. This process is necessary since the electron beam 222 strikes the patterned beam-defining aperture before it is deflected by the mainfield deflectors 213 and 214, thus exactly the same set of rays is transmitted by the patterned beam-defining aperture 212 to the wafer surface 221 for all positions of the beam 222 on the wafer surface 221.

Block 112 uses the trajectory data from block 110, to develop an ideal (i.e., possibly not physically realizable) aperture design with the goal of transmitting all rays contributing to the desired beam profile and blocking all rays falling outside the desired profile for all five positions on the wafer simultaneously (i.e., across the entire scan). FIG. 6A shows the resulting rays at the beam-defining aperture 212 which should be transmitted. FIG. 6B shows the resulting rays at the beam-defining aperture 212 which should be blocked.

In block 114, final changes are made to the patterned beam-defining aperture to allow for a practical aperture 212 design, as illustrated in FIGS. 7A-8A. The resulting patterned beam-defining aperture must meet two requirements: (1) it should transmit a large portion of charged particles in the beam which would fall within the desired beam shape, and (2) it should block transmission of a large portion of charged particles in the beam which would fall outside the desired beam shape.

Figure 8A:
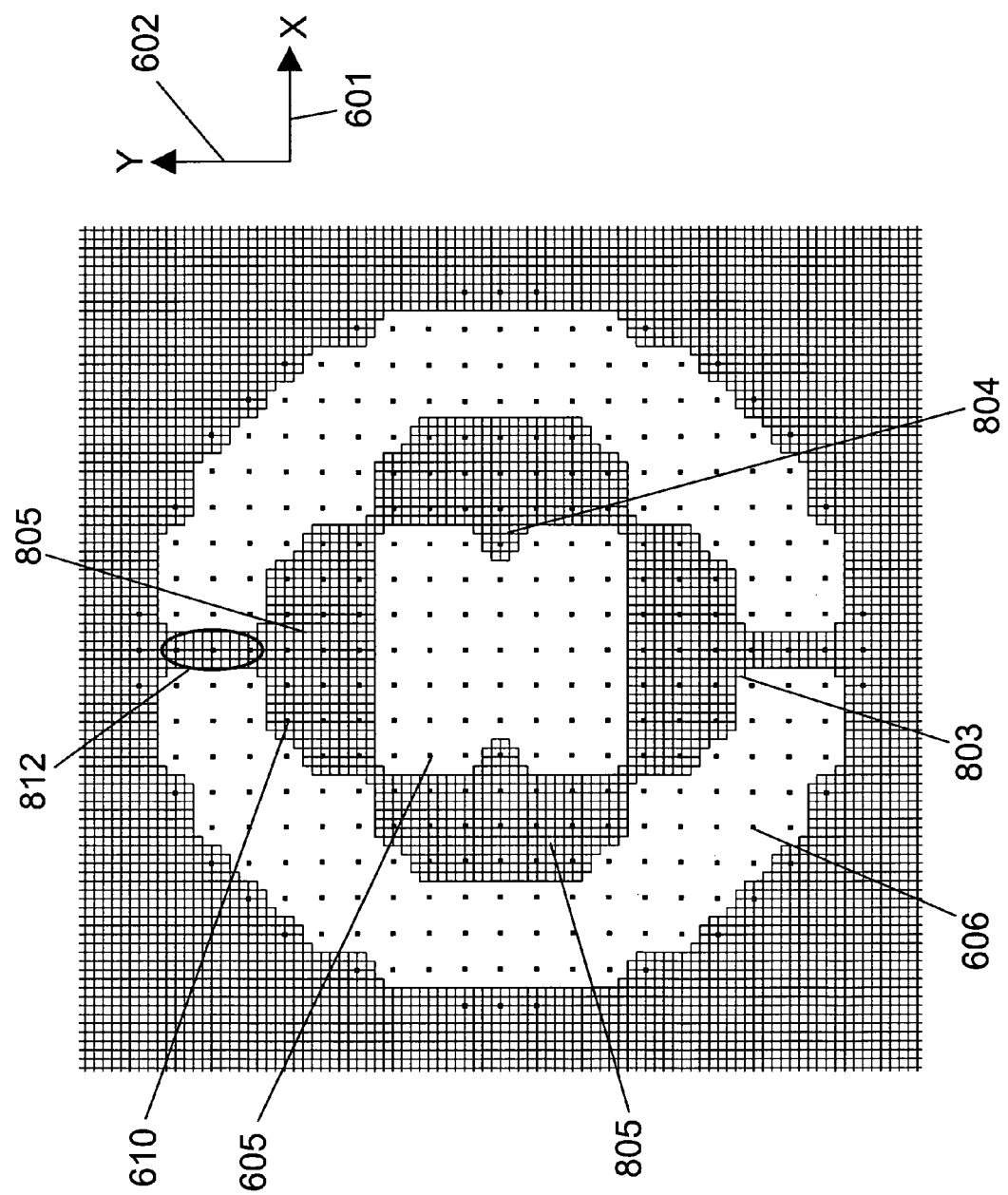
FIG. 8A shows a patterned beam-defining aperture (PBDA) designed to generate a high current-density square electron beam at the wafer and rays at 5000 eV beam energy.

Block 116 then tests the accuracy of the optics and aperture designs by tracing a large number of electron rays through the electron column from FIG. 2A, using the aperture from FIG. 8A.

Block 118 combines the large number of rays (typically >30000) generated in block 116 to obtain beam current density profiles such as those shown in FIGS. 10A-12.

Figure 13:
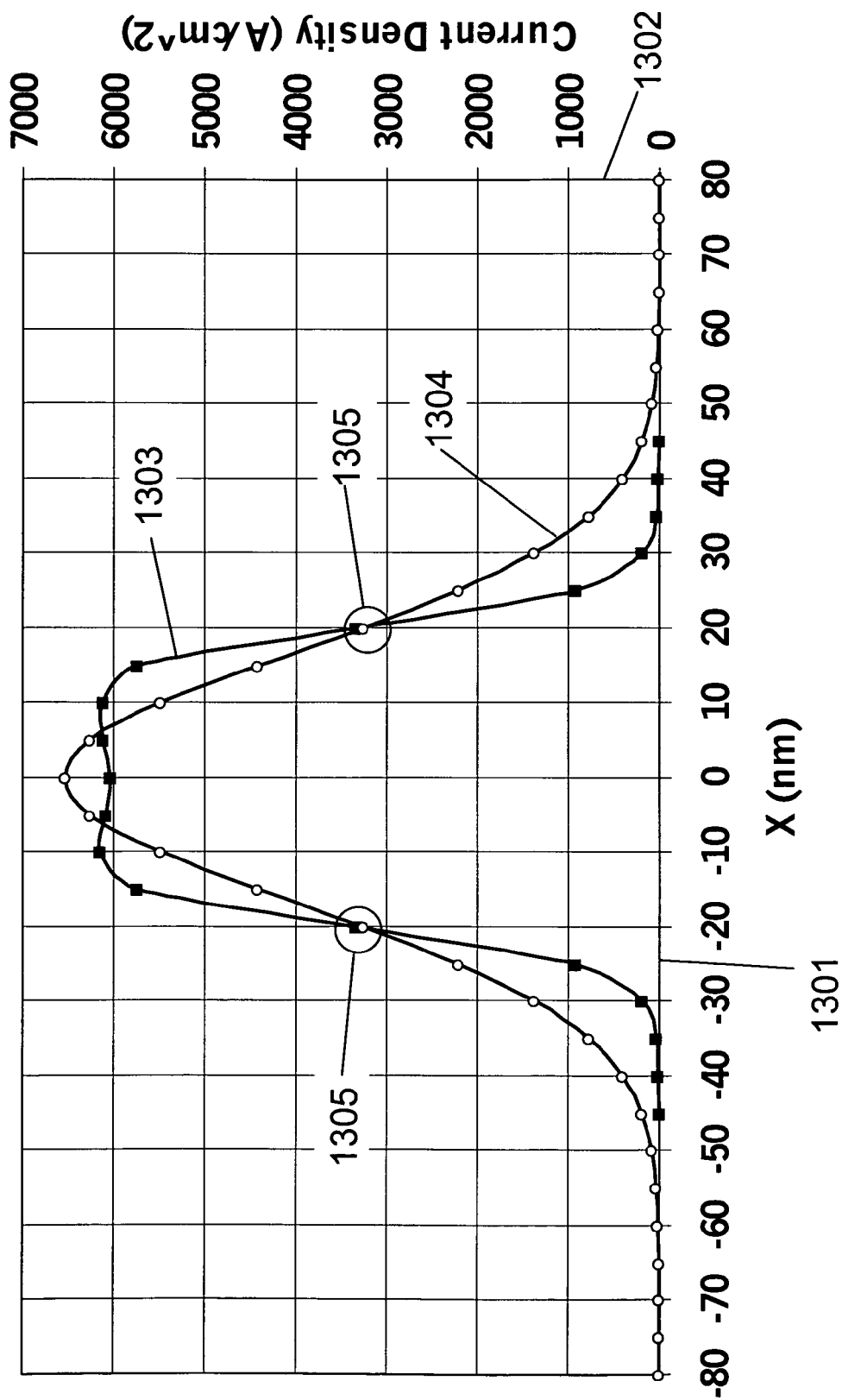
FIG. 13 shows a graph of calculated beam current density across a single 40 nm square beam (as in FIG. 10A), when the beam is in position A of FIG. 9, and across a single 40 nm FWHM Gaussian beam.
Figure 14:
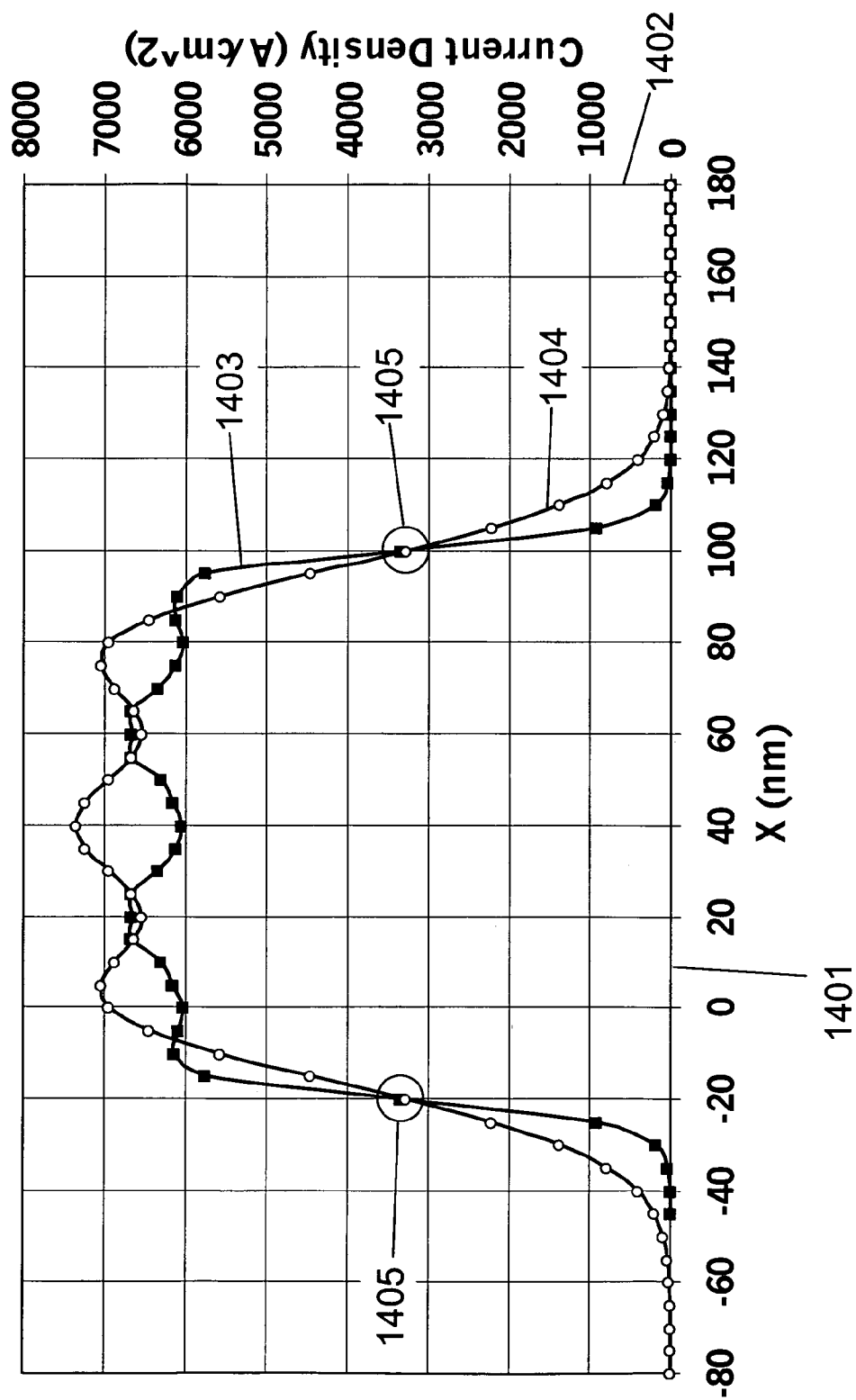
FIG. 14 shows a graph of calculated beam current density, when the beam is in position A of FIG. 9, across three combined 40 nm square beams (all flashes as in FIG. 10A and spaced 40 nm apart) and across three combined 40 nm FWHM Gaussian beams also spaced 40 nm apart.
Figure 15:
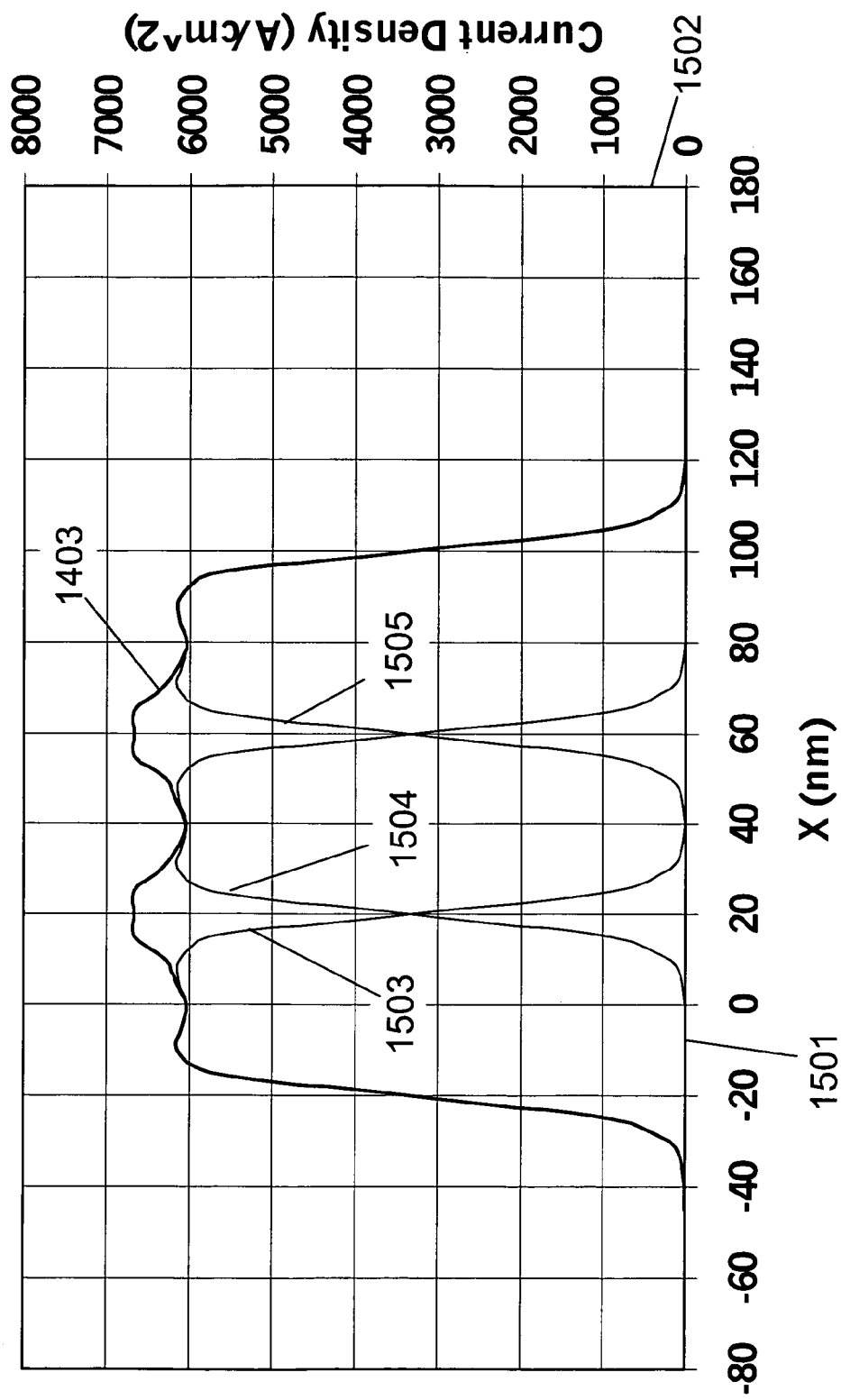
FIG. 15 shows a graph of calculated beam current density, when the beam is in position A of FIG. 9, across three combined 40 nm square beams and three separate 40 nm square beams (all flashes as in FIG. 10A), with the beams spaced 40 nm apart.

Finally, in block 120, graphs of the beam current profile are generated, and can be compared with the corresponding current profiles for Gaussian beams. The improved edge sharpness of the patterned beam generated by an electron column employing the present invention can be seen in FIGS. 13-15, compared with the Gaussian profile in FIG. 16.

FIG. 2A shows a cross-sectional view of a typical electron optical column capable of employing the present invention to generate a high current-density patterned electron beam. The view has been expanded along the Y-axis to allow the beam 222 and various electrodes to be seen more clearly. This column design is typical of those that would be developed in block 106 of FIG. 1. Components illustrated include: an electron source tip 201, extraction electrode 202, first source lens electrode 203, beam-limiting aperture (BLA) 204, second source lens electrode 205, gun mounting plate 206, upper alignment deflector/stigmator 207, accelerating assembly 209, electron beam 222, lower alignment deflector 208, beam-trimming aperture (BTA) 276, upper blanker 277, lower blanker 278, optics mounting plate 210, beam-defining aperture mount 211, patterned beam-defining aperture (PBDA) 212, upper mainfield deflector 213, lower mainfield deflector 214, subfield deflector/stigmator 215, focus-1 electrode assembly 216, focus-2 electrode assembly 217, field-free tube 218, detector assembly 219, voltage contrast plate 220, and substrate 221 being lithographically patterned by the electron beam 222. Note that the combination of the field-free tube 218, detector assembly 219 and voltage contrast plate 220 is referred to as the detector optics and, in the case of electron beam lithography, is used to image alignment marks on the substrate. The combination of the focus-1 electrode assembly 216, focus-2 electrode assembly 217 and the field-free tube 218 is referred to as the main lens.

Electrons are emitted from the source tip 201 under the influence of a high electric field induced by a voltage difference (typically 2500-3500 V) between the source tip 201 and the extraction electrode 202. The portion of these electrons near the symmetry axis of the optics system passes through a hole in electrode 202, moving towards first source lens electrode 203. A beam-limiting aperture 204 is mounted within the bore of electrode 203, which allows only those electrons within a small angle (typically ~2.0° half-angle) to pass down into the optical column. A voltage typically from 430 to 640 V (relative to the source tip 201 at 0 V) is applied to both electrode 203 and the beam-limiting aperture 204—this potential, in combination with roughly 510 V applied to the second focusing electrode 205, forms a decelerating lens which focuses the beam 222 into a parallel beam which passes through the gun mounting plate 206. Upper alignment deflector/stigmator 207 and lower alignment deflector 208 are used to steer the electron beam 222 through the beam-trimming aperture 276 parallel to the optical (Z-) axis. The accelerating region 209 between the upper alignment deflector/stigmator 207 and the lower alignment deflector 208 raises the beam energy from 510 eV up to 5000 eV. The beam 222 then passes through the upper blanker 277 and lower blanker 278. Some rays within electron beam 222 are stopped by the patterned beam-defining aperture 212, supported in a beam-defining aperture mount 211, while others pass through to the mainfield deflectors 213 and 214, subfield deflector/stigmator 215, and then enter the main lens. The main lens focuses beam 222 onto the substrate surface 221. (Further description of a similar electron optical column design is provided in U.S. Pat. No. 6,734,428 B2, incorporated herein by reference.)

The column design shown is for illustrative purposes only—the patterned beam-defining apertures generated by the method of the present invention may be employed in a large number of column designs familiar to those skilled in the art.

Figure 2B:
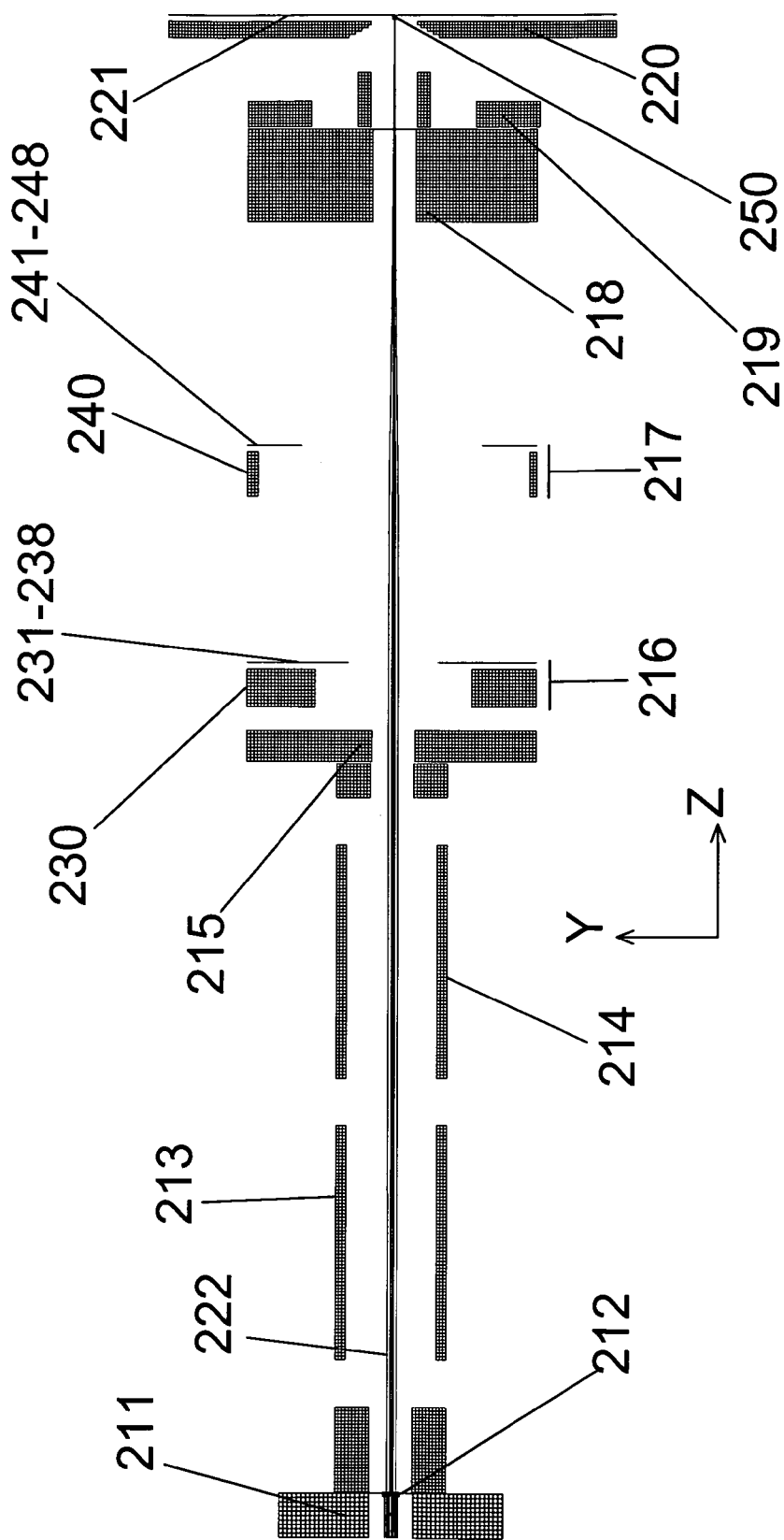
FIG. 2B shows a cross-sectional view of the bottom of the electron column of FIG. 2A.

FIG. 2B shows a cross-sectional view of the bottom of a typical electron optical column capable of employing the present invention to generate a high current-density patterned electron beam. Components illustrated include: the beam-defining aperture mount 211, patterned beam-defining aperture 212, upper mainfield deflector 213, lower mainfield deflector 214, subfield deflector/stigmator 215, focus-1 electrode assembly 216, focus-1 support electrode 230, focus-1 octupole electrodes 231-238, focus-2 electrode assembly 217, focus-2 support electrode 240, focus-2 octupole electrodes 241-248, field-free tube 218, detector assembly 219, voltage contrast plate 220, and substrate 221 being lithographically patterned by the electron beam 222 which strikes the substrate surface 221 at location 250.

The electron rays shown in all figures are calculated using SIMION 3D, ver. 7.0 (a charged particle ray tracing program developed by David Dahi at the Idaho National Engineering and Environmental Laboratory).

Figure 3A:
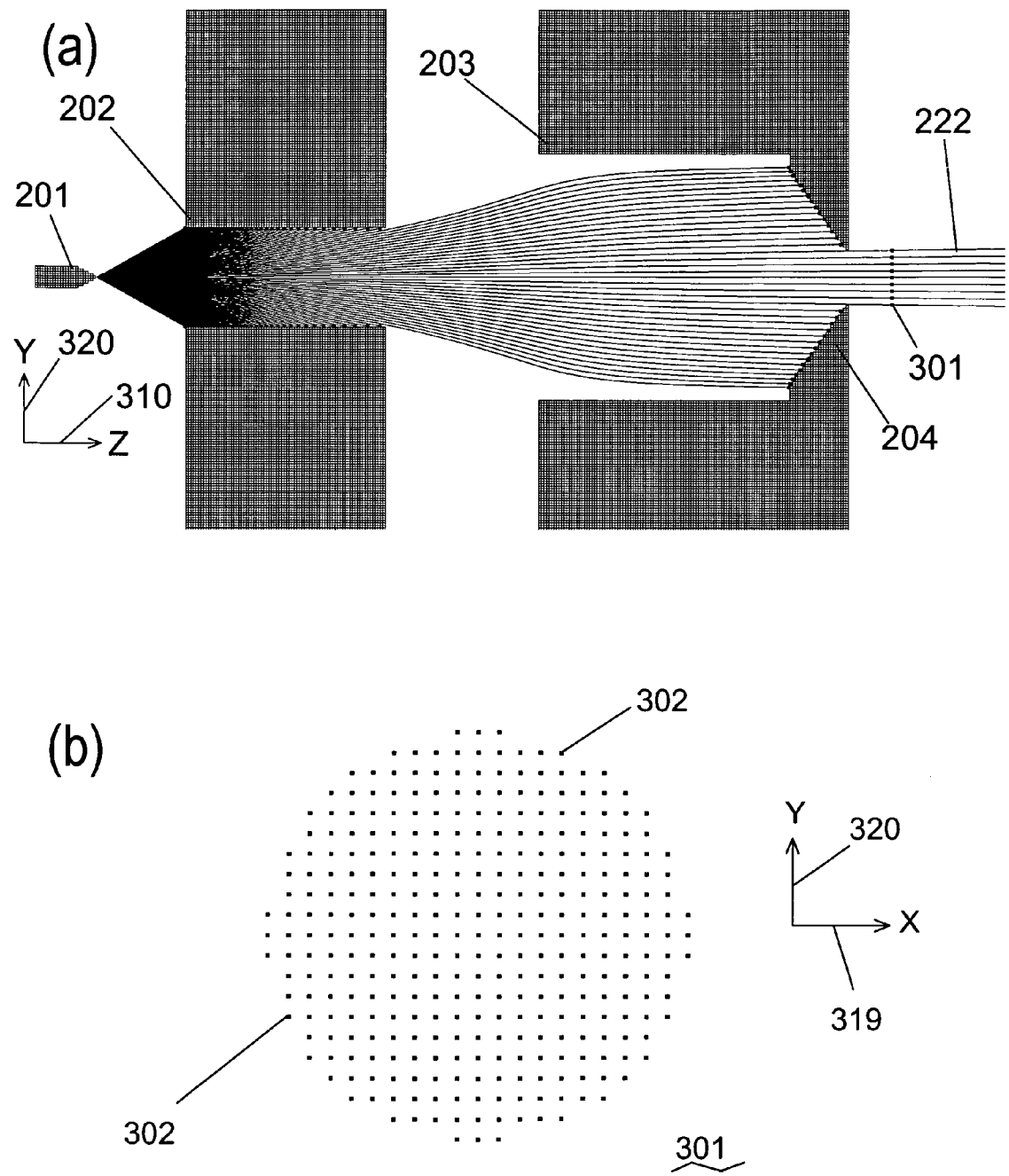
FIG. 3A shows various views of rays near the source tip 201.

FIG. 3A is a pair of views of the rays leaving the source tip 201, showing how the initial distribution of rays is "laminar", i.e., the rays have a uniform distribution spreading out from the tip 201 without crossing over each other. View (a) is a side cross-sectional view of the source tip 201, extraction electrode 202, first source lens electrode 203, beam-limiting aperture 204 and beam 222, showing beam half-angles out to 30° emerging from the source tip 201. An axial cross-section of the beam 222 is taken at location 301. The optical axis is parallel to the Z-axis 310 and perpendicular to the Y-axis 320.

An axial cross-section of the beam 222 at location 301 is shown in (b), including ray intercepts 302. The X-axis 319 and Y-axis 320 are both perpendicular to the optical axis 310. Each of the ray intercepts 302 can be seen to be evenly separated on a grid corresponding to the X-axis 319 and Y-axis 320. The rays in beam 222 preserve this laminar flow behavior almost all the way to the substrate surface 221.

The design method described herein for the patterned beam-defining aperture 212 relies on the assumption that each ray represents a well-defined amount of current. The calculation for this current is as follows:

$I_s$=source angular intensity over the emission solid angle used to illuminate the patterned beam-defining aperture 212 (typically 0.4° to 1.5° half-angle, in this example 0.8°—usually $I_s$ ranges from 100 μA/sr up to more than 500 μA/sr).

δ=angular increment between rays 302 along the X-axis 319 and Y-axis 320 (typically 0.04° to 0.15°, in this example, δ=0.08°).

$$\omega = \text{solid angle subtended by each ray 302, for } \delta = 0.08°,$$
$$= [\delta(\pi/180°)]^2 = 1.95 \times 10^{-6} \text{sr}$$

$I_{ray\ 302}=I_s\omega=(500\ \mu A/sr)(1.95\times10^{-6}sr)=0.98$ nA for each ray 302.

Implicit in this calculation is the assumption that the angular intensity is uniform over the angular range of emission used to generate the square beam (comprising rays 306 in FIG. 3G) which illuminates the patterned beam-defining aperture 212. In the example of a Schottky thermal field emitter, this assumption is valid, since typically the angular intensity is very uniform over the central (i.e., on-axis) part of the angular emission distribution. With electron sources for which this assumption is invalid, the method described herein for design of the patterned beam-defining aperture could be modified to take into account different values for $I_{ray\ 302}$ depending on the initial angle of each ray 302 at the source tip 201.

FIG. 3B is a pair of views of the rays at the upper alignment deflector/stigmator 207. View (a) is a side cross-sectional view of the gun mounting plate 206, upper alignment deflector/stigmator 207 and beam 222.

An axial cross-section of the beam 222 at location 303 is shown in (b). The beam 222 is centered within the upper alignment deflector/stigmator 207. The eight octupole electrodes 260-267 of the upper alignment deflector/stigmator 207 are shown. Voltages may be applied to the eight electrodes 260-267 to generate a rotatable dipole electric field to deflect the beam 222. Additionally, voltages may be applied to the eight electrodes 260-267 to generate a rotatable quadrupole field to stigmate the beam 222 in the upper column. Ray intercepts 304 correspond to electrons leaving the source tip 201 at the mean energy. Each of the ray intercepts 304 can be seen to be evenly separated on a grid approximately corresponding to the X-axis 319 and Y-axis 320, with almost the same relative positions to each other that the corresponding ray intercepts 302 in FIG. 3A maintained.

Figure 3C:
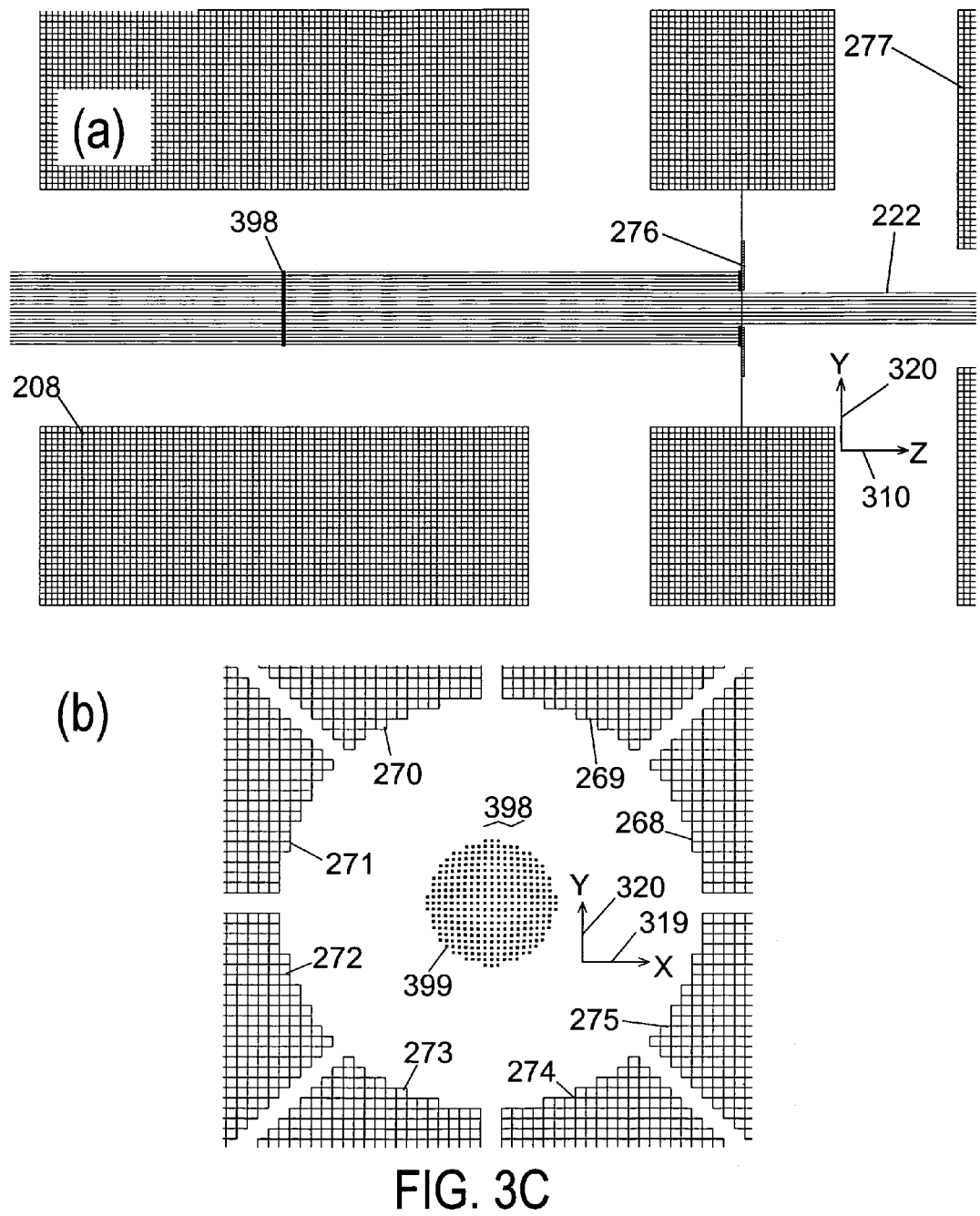
FIG. 3C shows various views of rays in the lower alignment deflector 208.

FIG. 3C is a pair of views of the rays at the lower alignment deflector 208. View (a) is a side cross-sectional view of the lower alignment deflector 208, beam-trimming aperture 276, upper blanker 277 and beam 222. An axial cross-section of the beam 222 at location 398 is shown in (b). The beam 222 is centered within the lower alignment deflector 208. The eight octupole electrodes 268-275 of the lower alignment deflector 208 are shown. Voltages may be applied to the eight electrodes 268-275 to generate a rotatable dipole electric field to deflect the beam 222. Ray intercepts 399 correspond to electrons leaving the source tip 201 at the mean energy. Each of the ray intercepts 399 can be seen to be evenly separated on a grid approximately corresponding to the X-axis 319 and Y-axis 320, with almost the same relative positions to each other that the corresponding ray intercepts 302 in FIG. 3A maintained.

Figure 3D:
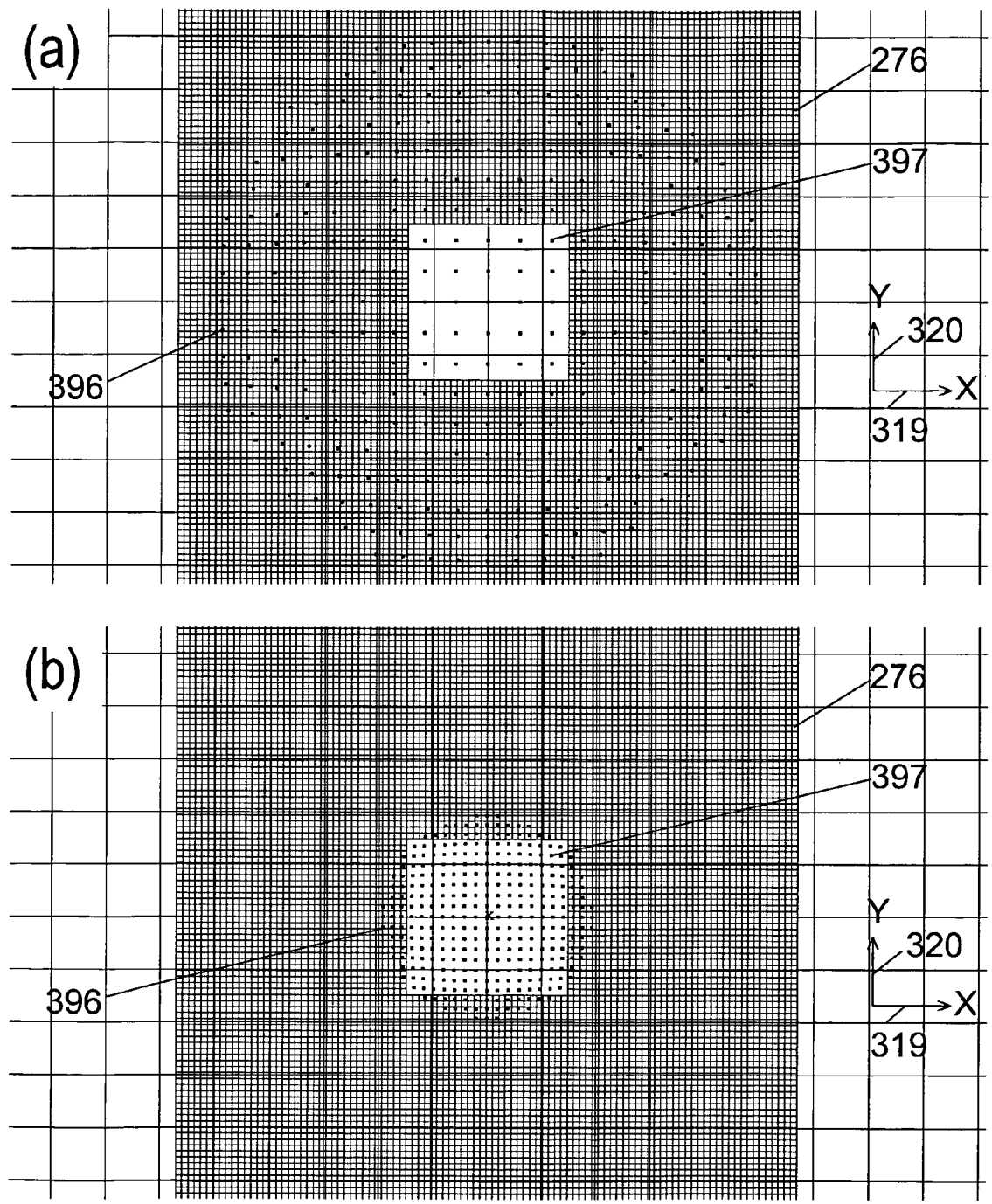
FIG. 3D shows various views of rays just above the beam-trimming aperture 276.

FIG. 3D is a pair of views of the rays just above the beam-trimming aperture 276, showing how the initial laminar distribution of angles shown in FIGS. 3A-3B has been approximately preserved farther down the column. View (a)

shows the beam 222 just above the beam-trimming aperture 276 for the case of a 30 nm beam at the wafer 221, where the voltage applied to the first source-lens electrode 203 and beam-limiting aperture 204 would typically be around 640 V. In this case, the outer rays in beam 222 correspond to the maximum 2.0° half-angle transmitted by the beam-limiting aperture 204, and only rays 397 within the center square (corresponding to angles within ±0.45° half-angle at the source tip 201 along the X-axis 319 and Y-axis 320) are transmitted farther down the column. Rays 396 outside the center square are blocked by the beam-trimming aperture 276. The beam trimming aperture is square to create a square beam cross-section at the patterned beam-defining aperture 212 this is necessary for the proper control of dose within the patterned beam at the wafer surface 221, as described in more detail below.

View (b) in FIG. 3D shows the beam 222 just above the beam-trimming aperture 276 for the case of a 120 nm beam at the wafer 221, where the voltage applied to the first source-lens electrode 203 and beam-limiting aperture 204 would typically be around 430 V. The outer rays in beam 222 correspond to the maximum 2.0° half-angle transmitted by the beam-limiting aperture 204, and only rays 397 within the center square (corresponding to angles within ±1.5° half-angle at the source tip 201 along the X-axis 319 and Y-axis 320) are transmitted farther down the column.

Figure 3E:
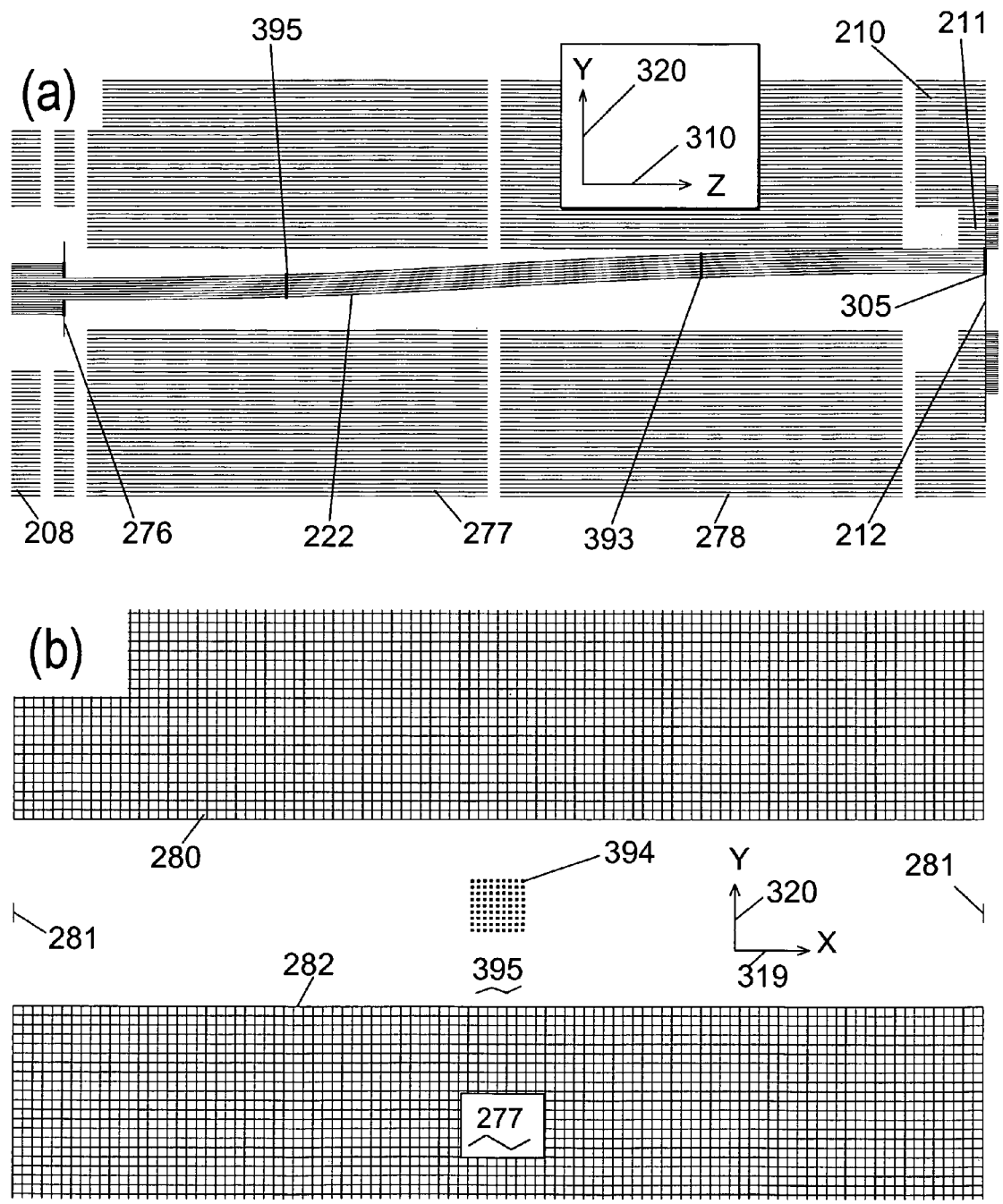
FIG. 3E shows various views of rays in the beam blanker.

FIG. 3E is a pair of views of the column near and within the beam blanker. View (a) is a side cross-sectional view of the lower alignment deflector 208, beam-trimming aperture 276, upper blanker 277, lower blanker 278, optics mounting plate 210, beam-defining aperture mount 211, patterned beam-defining aperture 212 and beam 222. An axial cross-section of the beam 222 at location 395, at the center of the upper blanker 277, is shown in (b). Ray intercepts 394 correspond to electrons leaving the source tip 201 at the mean energy. Each of the ray intercepts 394 can be seen to be evenly separated on a grid approximately corresponding to the X-axis 319 and Y-axis 320, with roughly the same relative positions to each other that the corresponding ray intercepts 302 in FIG. 3A maintained. To blank the beam 222, voltages typically in the range ±1.7 V+5000 V are applied to blanker plates 280 and 282. The 3.4 V difference between plates 280 and 282 generates a transverse electric field parallel to the Y-axis 320 which bends the electron beam 222 away from the optical (Z-) axis 310 as shown in FIG. 3E (a). Plates 281 are kept at the common mode voltage of 5000 V at all times in order to ensure a uniform electric field in the gap between plates 280 and 282.

Figure 3F:
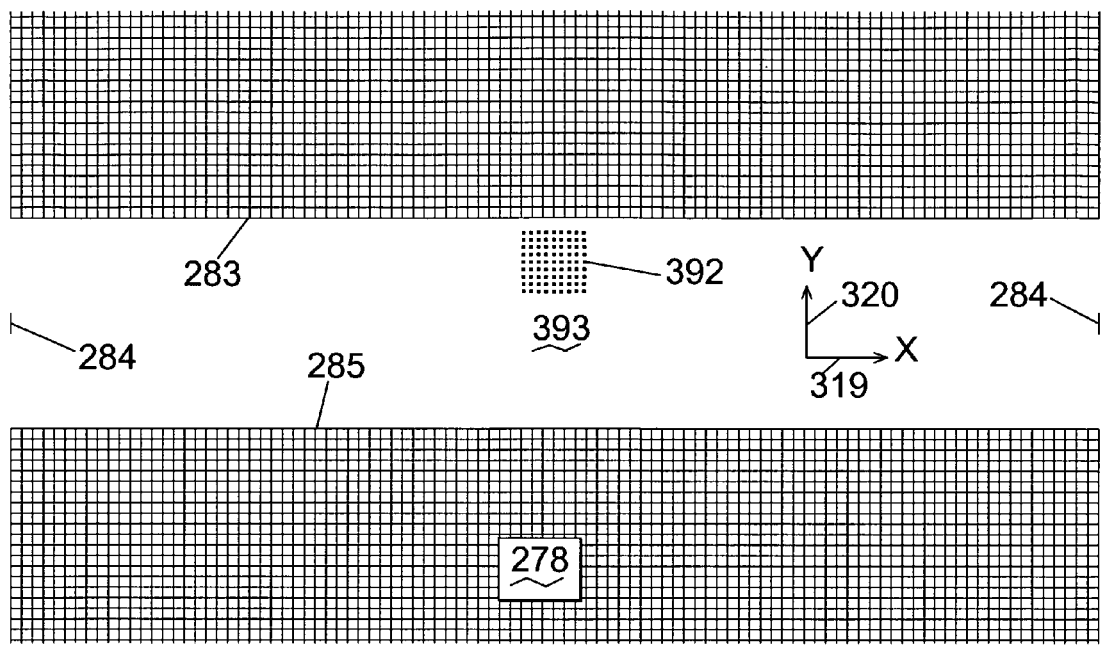
FIG. 3F shows a view of rays in the lower beam blanker 278.

FIG. 3F shows an axial cross-section of the beam 222 at location 393, at the center of the lower blanker 278. Ray intercepts 392 correspond to electrons leaving the source tip 201 at the mean energy. Each of the ray intercepts 392 can be seen to be evenly separated on a grid approximately corresponding to the X-axis 319 and Y-axis 320, with roughly the same relative positions to each other that the corresponding ray intercepts 302 in FIG. 3A maintained. To blank the beam 222, voltages typically in the range ±1.54 V+5000 V are applied to blanker plates 283 and 285. The 3.08 V difference between plates 283 and 285 generates a transverse electric field parallel to the Y-axis 320 and opposite in direction from the field in the upper blanker 277, which bends the electron beam 222 back towards the optical (Z-) axis 310 as shown in FIG. 3E (a). Plates 284 are kept at the common mode voltage of 5000 V at all times in order to ensure a uniform electric field in the gap between plates 283 and 285. The combined deflection effect of the upper 277 and lower 278 blankers is to deflect the beam 222 off-axis and towards the patterned beam-defining aperture 212 in such a way that the beam still appears to come from the virtual source location on the optical (Z-) axis—this ensures conjugate blanking even though there is no actual cross-over in the column between the source tip 201 and the wafer surface 221. The benefit of avoiding an intermediate cross-over is that the larger diameter of beam 222 down the column greatly reduces coulomb (space-charge) beam spreading, thus improving the beam edge sharpness at the wafer surface 221.

Figure 3G:
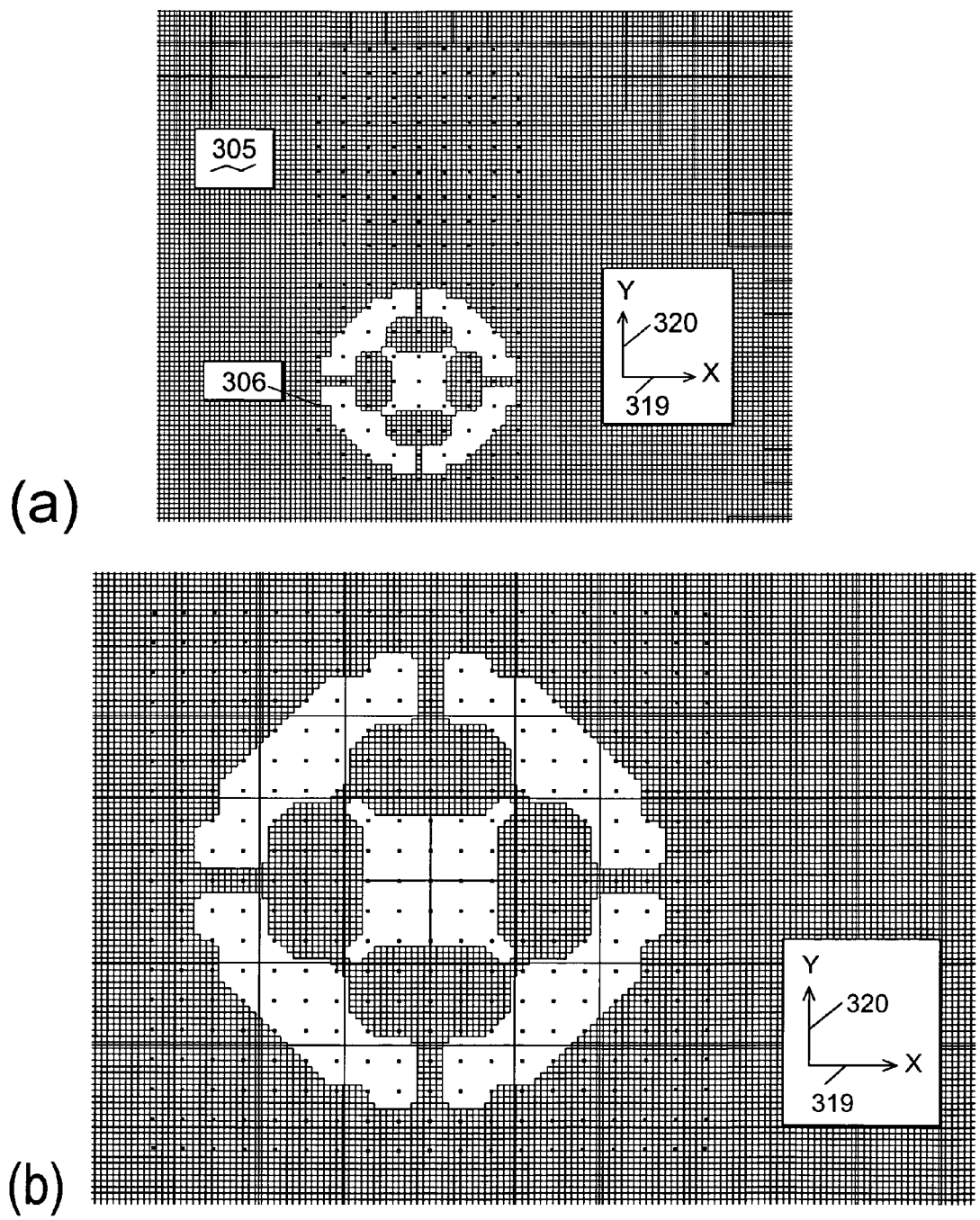
FIG. 3G shows various views of rays just above the beam-defining aperture 212.

FIG. 3G (a), shows a pair of beams 222 just above the beam-defining aperture 212, illustrating how the initial laminar distribution of angles shown in FIGS. 3A-3B has been approximately preserved farther down the column. The upper square beam 305 corresponds to the blanked beam shown in FIG. 3E (a)—it has been deflected completely away from the opening in the patterned beam defining aperture 212, thus no rays are transmitted to the wafer surface 221. Rays 306 are shown in the lower (unblanked) square beam. Those rays passing through the openings in the patterned beam-defining aperture 212 are then transmitted to the wafer surface 221 to form a high current-density square beam at location 250 of FIG. 2B.

The purpose for the square beam-trimming aperture 276 can be seen in FIG. 3G: in order to minimize the blanking time, it is necessary to keep the beam size at the patterned beam-defining aperture 212 as small as possible. It is also necessary that the beam have a square cross-section, so that as the beam is swept across the patterned beam-defining aperture (PBDA) 212 (see FIG. 22), each location on the openings in the PBDA 212 will be illuminated for the same amount of time. This is only possible if the beam cross-section is square. For all possible beam sizes at the wafer surface 221, the square illuminating beam at the PBDA 212 will be roughly the size shown in FIG. 3G, views (a)-(b), even though the outer beam diameters (corresponding to 2° half-angle at the tip 201) shown in FIG. 3D, views (a)-(b), vary widely in size. Without the beam-trimming aperture 276, the beam diameters illuminating the PBDA 212 would exhibit a similar wide range in size, causing blanking times to be much longer for smaller beam sizes at the wafer surface 221.

View (b) is a close-up of the beam 222 cross-section at the patterned beam-defining aperture (PBDA) 212 the case of a 30 nm square beam at the wafer surface 221. For larger beam sizes of 40 nm to 120 nm at the wafer 221, the square beam at the PBDA 212 will be slightly smaller than in view (b)—thus for square beams from 30 nm to 120 nm, the beam-trimming aperture 276 maintains the square beam at the PBDA 212 at approximately the optimal (minimum) size for maximum bandwidth blanking.

Figure 3H:
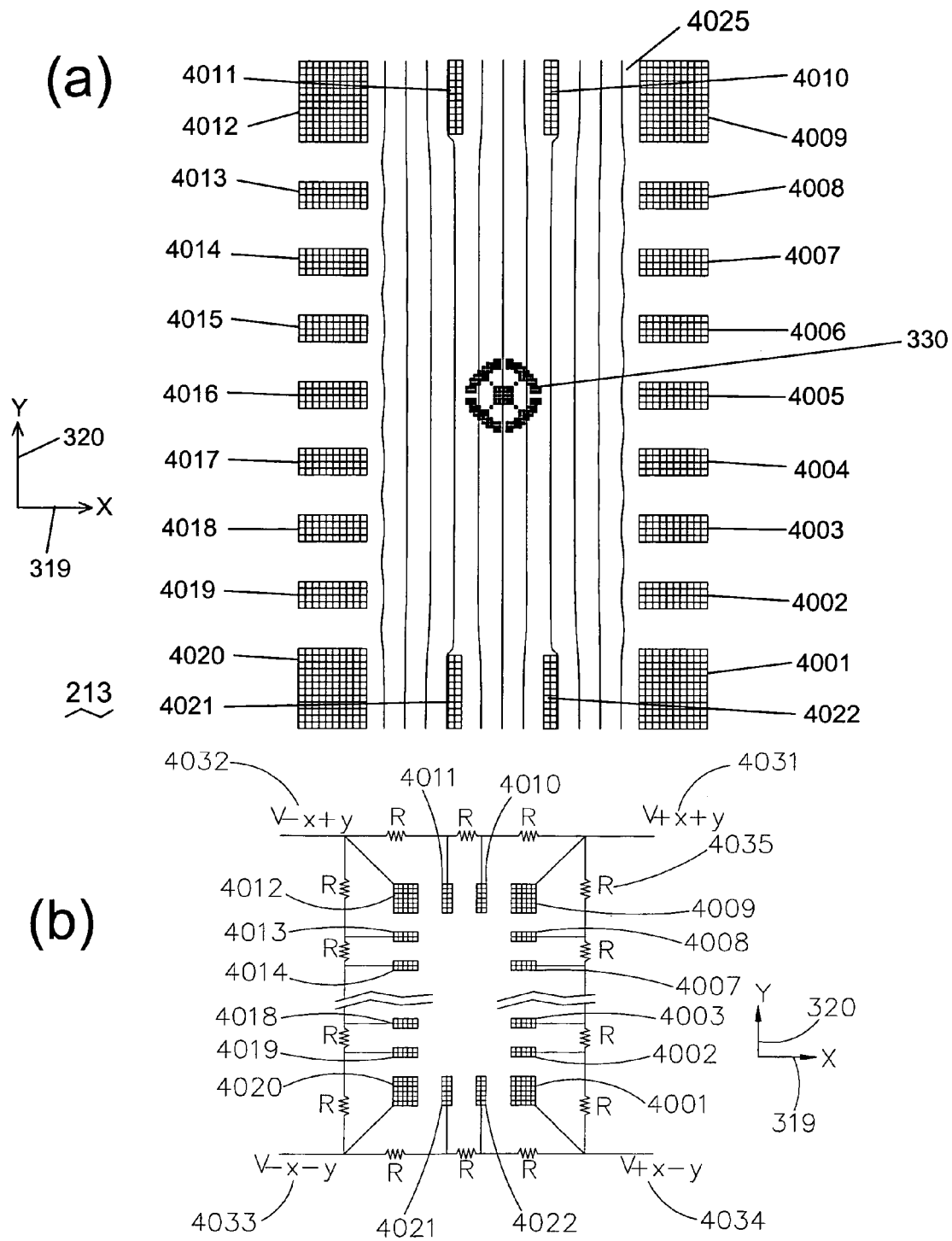
FIG. 3H shows a view of rays inside the upper mainfield deflector 213 and a schematic of the mainfield deflector.
Figure 3I:
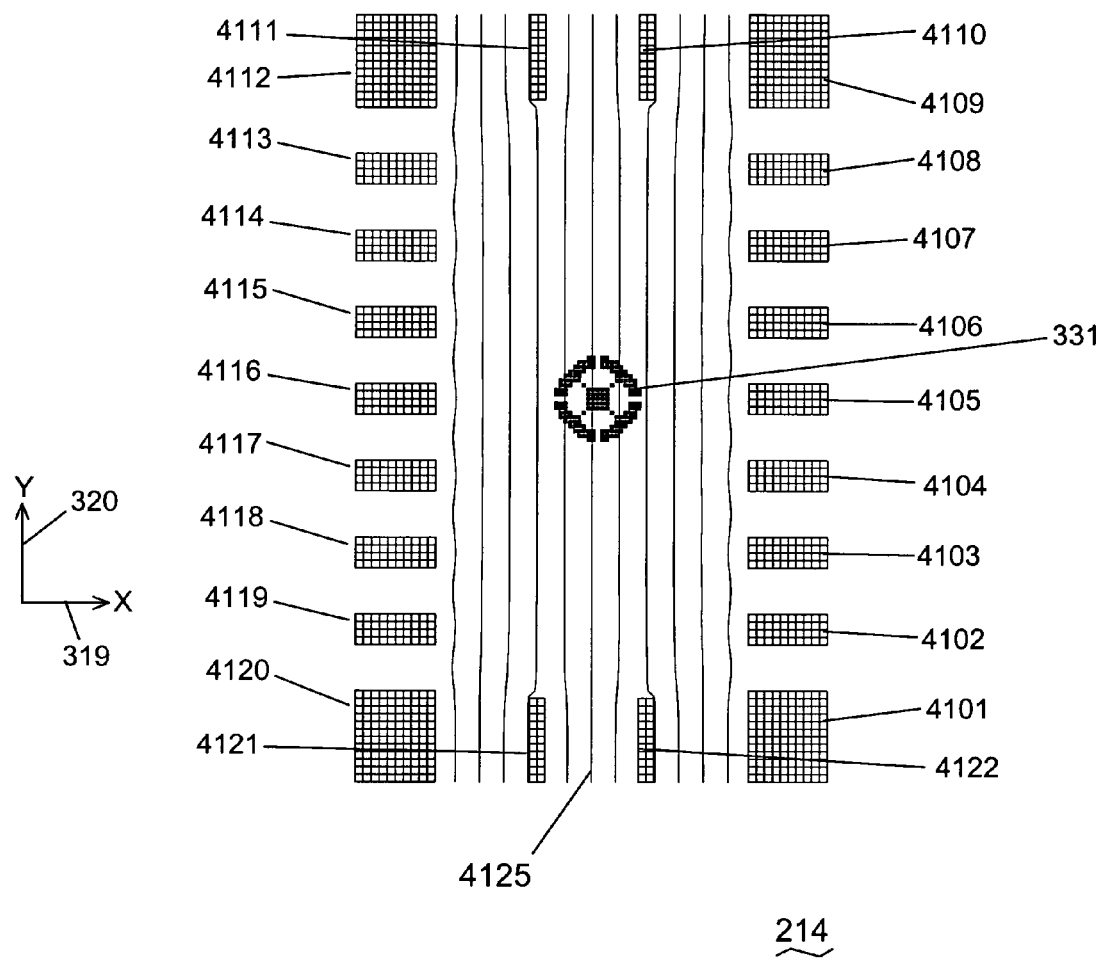
FIG. 3I shows a view of rays inside the lower mainfield deflector 214.

FIG. 3H (a) is a view of the rays 330 at the center of the upper mainfield deflector 213. The initial laminar distribution of angles shown in FIGS. 3A-3B has been approximately preserved farther down the column. Note that now the beam cross-section preserves an image of the openings in the patterned beam-defining aperture 212.

The purpose of the mainfield deflector, comprising 213 and 214, is the following:

(1) to compensate for small (~±2 μm) wafer stage positional errors in both the X-axis 319 and the Y-axis 320.

(2) to correct for small (~±2 μm) mechanical errors in the column positions in both the X-axis 319 and the Y-axis 320.

(3) to position the beam at the center of the particular subfield to be written along the X-axis 319 only (deflections up to at least ±25 μm).

All of these requirements are relatively low-bandwidth, but require that the mainfield deflector induce almost no aberration in the beam, even with large (e.g., ±25 µm) off-axis deflections along the X-axis 319. Since the Y-axis 320 deflections are smaller, a deflector design optimized for large X-deflections and smaller Y-deflections is used for both the upper 213 and lower 214 mainfield deflectors as shown. Typical upper mainfield deflector 213 voltages for the case of maximum X-axis 319 deflection would be (with a 5000 V common mode voltage):

| Electrode | Voltage |
|---|---|
| 4001 | 5000 + 2.92 |
| 4002 | 5000 + 2.92 |
| 4003 | 5000 + 2.92 |
| 4004 | 5000 + 2.92 |
| 4005 | 5000 + 2.92 |
| 4006 | 5000 + 2.92 |
| 4007 | 5000 + 2.92 |
| 4008 | 5000 + 2.92 |
| 4009 | 5000 + 2.92 |
| 4010 | 5000 + 0.97 |
| 4011 | 5000 − 0.97 |
| 4012 | 5000 − 2.92 |
| 4013 | 5000 − 2.92 |
| 4014 | 5000 − 2.92 |
| 4015 | 5000 − 2.92 |
| 4016 | 5000 − 2.92 |
| 4017 | 5000 − 2.92 |
| 4018 | 5000 − 2.92 |
| 4019 | 5000 − 2.92 |
| 4020 | 5000 − 2.92 |
| 4021 | 5000 − 0.97 |
| 4022 | 5000 + 0.97 |

For this example, electrodes 4001-4009 and electrodes 4012-4020 act as two parallel plates with electrodes 4010, 4011, 4021 and 4022 acting to preserve the uniform X-direction electric field needed for minimal deflection aberrations. A set of electrostatic equipotential lines 4025 is shown, in steps of 0.5 V between 4997.5 V and 5002.5 V—note the high degree of uniformity in the electric field, which minimizes deflection aberrations. In the case of pure Y-axis 320 deflection, electrodes 4009-4012 and 4001, 4020-4022 act as two parallel plates with electrodes 4002-4008 and 4013-4019 acting to preserve the uniform Y-direction electric field. Because the mainfield deflectors 213 and 214 have been optimized for a much larger deflection parallel to the X-axis 319, the design of the deflectors 213 and 214 is asymmetrical, having a larger width along the Y-axis 320 in order to preserve field uniformity for the higher X-axis 319 field strengths required for ±25 µm X-deflections. For the required ±1 µm Y-deflections, the field strength required is much lower, so a reduced degree of E-field uniformity is allowable. Aspects of the design of parallel plate deflectors are well known to those skilled in the art.

View (b) shows a possible method for connecting voltages to each of the electrodes 4001-4022. Electrodes 4004-4006 and 4015-4017 are omitted to simplify the schematic. Each pair of neighboring electrodes is connected by a resistor 4035 of value R. These resistors form four linear voltage dividers between drive signals $V_{+X+Y}$ 4031, $V_{-X+Y}$ 4032, $V_{-x-y}$ 4033 and $V_{+X-Y}$ 4034 as shown. Thus, only four drive voltages are required to control the twenty-two electrodes 4001-4022. The value R of resistors 4035 must be kept low enough so that there is minimal RC time delay between the four drive signals 4031-4034 and the inner electrodes such as 4004-4006 and 4015-4017, however, the value of R must not be so low that there is excessive power dissipation (which goes as $V^2/R$ where V=the deflection voltage). To minimize the capacitance C on the connections to electrodes 4001-4022, it is desirable for the resistors 4035 to be mounted as close to the column assembly as possible, probably within the vacuum enclosure; however, in the vacuum enclosure heat dissipation is more difficult due to the lack of convective cooling, consequently the power dissipation in the resistors R 4035 must be minimized by making R as large as possible while avoiding excessive RC delays.

FIG. 31 is a view of the rays 331 at the center of the lower mainfield deflector 214. The initial laminar distribution of angles shown in FIGS. 3A-3B has been approximately preserved farther down the column along with an image of the openings in the PBDA 212. The differential voltages (ignoring the common mode voltage of 5000 V) on the lower mainfield deflector 214 electrodes 4101-4122 are always equal in magnitude and opposite in polarity from the voltages on the corresponding electrodes 4001-4022 in the upper mainfield deflector 213. A set of electrostatic equipotential lines 4125 is shown, in steps of 0.5 V between 4997.5 V and 5002.5 V. The X-axis 319 corresponds to the large deflection direction for the beam 222, typically at least ±25 µm from the optical axis on the wafer surface 221. The direction of stage travel is parallel to the Y-axis 320 (alternatively in the +Y- and −Y-directions with each subsequent wafer scan—see FIG. 27B). Typically, the lengths of electrodes 4101-4122 along the Z-axis 310 will be the same, and equal to the lengths of electrodes 4001-4022 in the upper mainfield deflector 213. Since the lengths of the upper and lower mainfield deflectors 213 and 214 are equal and the applied electrode voltages are equal in magnitude and opposite in polarity, the combined result is to deflect the beam 222 off the optical axis 310 and restore it to being parallel to the optical (Z-) axis 310.

Figure 3J:
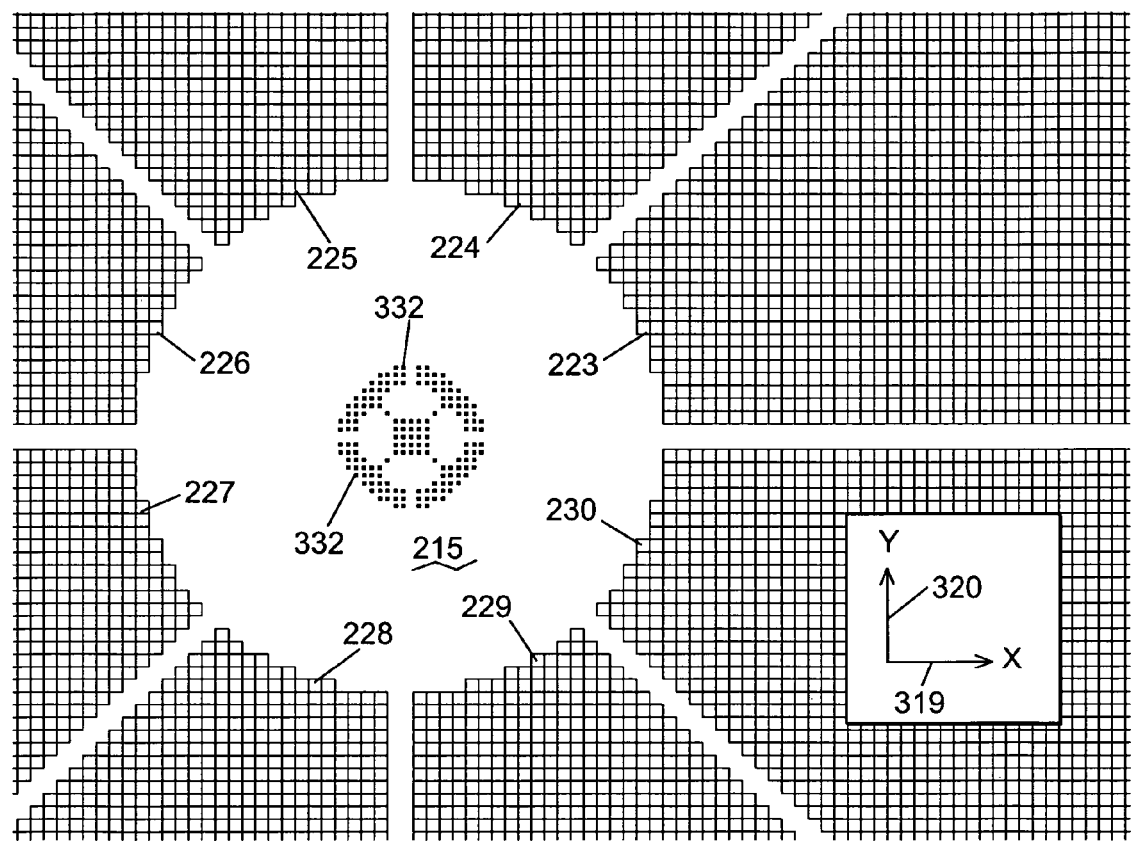
FIG. 3J shows a view of rays inside the subfield deflector/stigmator 215.

FIG. 3J is an axial cross-sectional view of the rays 332 at the center of the subfield deflector/stigmator 215, showing how the initial laminar distribution of angles shown in FIGS. 3A-3B has been preserved farther down the column, along with an image of the openings in the PBDA 212. The subfield deflector/stigmator 215 combines two functions:

(1) as a deflector (i.e., with a rotatable dipole excitation), the subfield deflector/stigmator 215 is used to scan the beam 222 by up to ±1 µm in both the X-319 and Y-320 directions to cover a 2 µm square subfield, (2) as a stigmator (i.e., with a rotatable quadrupole excitation), the subfield deflector/stigmator 215 corrects for astigmatism induced by other elements in the optical column.

The beam 222 is off-center within the subfield deflector/stigmator 215 due to the combined beam deflection in the upper and lower mainfield deflectors 213 and 214. The subfield deflector/stigmator 215 electrodes are arranged in a conventional octupole configuration as shown. Typically, the lengths of octupole electrodes 223-230 along the Z-axis 310 will be the same and deflection and stigmation voltages would be (common mode voltages of 5000 V not shown):

| Subfield deflector/stigmator 215 electrodes | Electrode voltages at +1 µm X-deflection | Electrode voltages at +1 µm Y-deflection | Typical stigmation voltages |
|---|---|---|---|
| Electrode 223 | −0.52 V | +0.22 V | +0.003 V |
| Electrode 224 | −0.22 V | +0.52 V | −0.003 V |
| Electrode 225 | +0.22 V | +0.52 V | −0.003 V |
| Electrode 226 | +0.52 V | +0.22 V | +0.003 V |

-continued

| Subfield deflector/stigmator 215 electrodes | Electrode voltages at +1 μm X-deflection | Electrode voltages at +1 μm Y-deflection | Typical stigmation voltages |
|---|---|---|---|
| Electrode 227 | +0.52 V | −0.22 V | +0.003 V |
| Electrode 228 | +0.22 V | −0.52 V | −0.003 V |
| Electrode 229 | −0.22 V | −0.52 V | −0.003 V |
| Electrode 230 | −0.52 V | −0.22 V | +0.003 V |

For beam deflections smaller than ±1 μm, the voltages in the table would scale linearly. For combined X-Y deflections, the voltages in the middle two columns would be added linearly with appropriate scaling factors to account for the desired X- and Y-deflections as is familiar to those skilled in the art. The stigmator voltages tend to vary as the square of the off-axis deflection and would be added to the X-Y deflection voltages at each respective electrode 223-230.

Figure 3K:
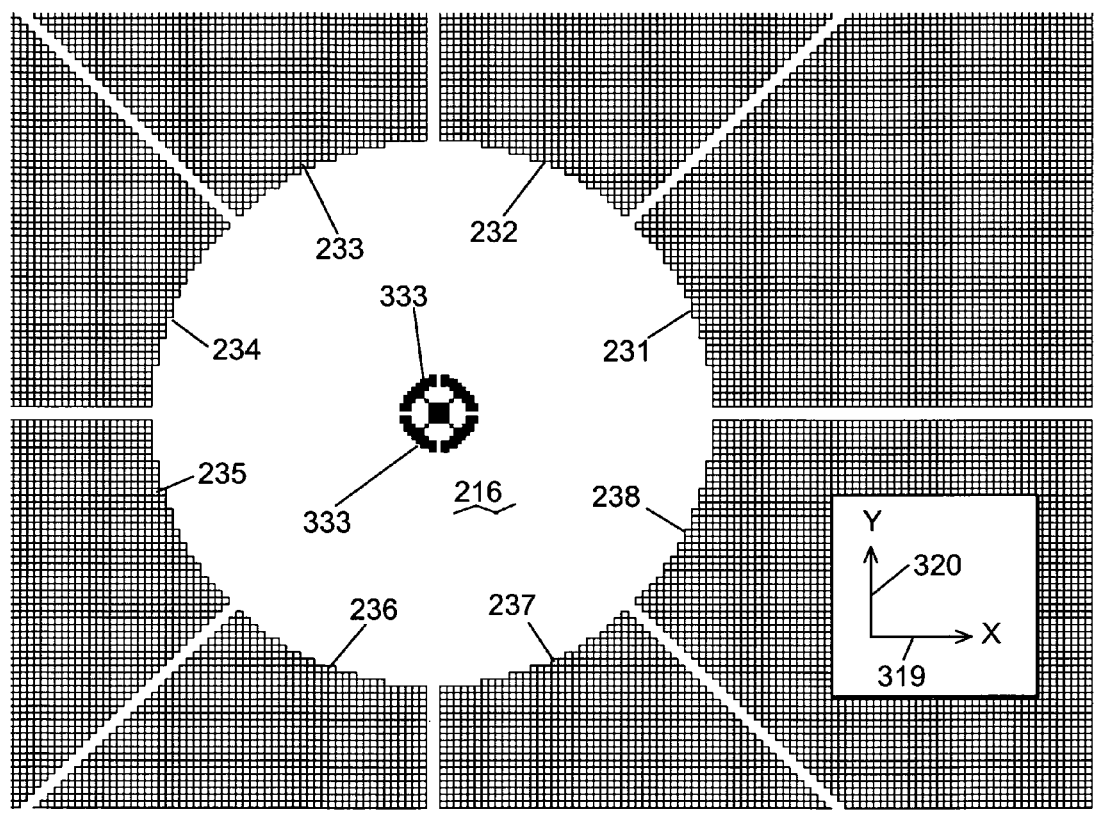
FIG. 3K shows a view of rays inside the focus-1 electrode assembly 216.

FIG. 3K is an axial cross-sectional view of the rays 333 inside the focus-1 electrode assembly 216. The initial laminar distribution of angles shown in FIGS. 3A-3B has been approximately preserved farther down the column along with an image of the openings in the PBDA 212. The focus-1 electrode assembly 216 is part of the main lens assembly comprising electrode assemblies 216, 217 and field-free tube 218. The main lens assembly is used to focus the beam 222 onto the wafer surface 221. The beam 222 is shown off-center (in the +X-direction) within the focus-1 electrode assembly 216 due to the combined beam deflection in the upper and lower mainfield deflectors 213 and 214. The focus-1 electrode assembly 216 comprises: (1) a support electrode 230 (see FIG. 2B) which has a large cylindrical ID, and (2) electrodes 231-238 forming a conventional electrostatic octupole with very short electrode lengths parallel to the optical (Z-) axis and a smaller ID than the support electrode 230. The dipole electrostatic excitation of the octupole 231-238 is varied in proportion to the excitation of the upper 213 and lower 214 mainfield deflectors to maintain the effective axis of the focus-1 electrode assembly 216 concentric with the beam 222.

Typical electrode excitation voltages for a +25 μm X-direction deflection would be (5000 V common mode voltage is shown):

| Focus-1 electrode assembly 216 | Electrode voltages with +25 μm X-deflection | Electrode voltages with no deflection | Electrode voltages with −25 μm X-deflection |
|---|---|---|---|
| Electrode 230 | 5000 V | 5000 V | 5000 V |
| Electrode 231 | 5000 + 2.22 V | 5000 V | 5000 − 2.22 V |
| Electrode 232 | 5000 + 0.92 V | 5000 V | 5000 − 0.92 V |
| Electrode 233 | 5000 − 0.92 V | 5000 V | 5000 + 0.92 V |

-continued

| Focus-1 electrode assembly 216 | Electrode voltages with +25 μm X-deflection | Electrode voltages with no deflection | Electrode voltages with −25 μm X-deflection |
|---|---|---|---|
| Electrode 234 | 5000 − 2.22 V | 5000 V | 5000 + 2.22 V |
| Electrode 235 | 5000 − 2.22 V | 5000 V | 5000 + 2.22 V |
| Electrode 236 | 5000 − 0.92 V | 5000 V | 5000 + 0.92 V |
| Electrode 237 | 5000 + 0.92 V | 5000 V | 5000 − 0.92 V |
| Electrode 238 | 5000 + 2.22 V | 5000 V | 5000 − 2.22 V |

Figure 23:
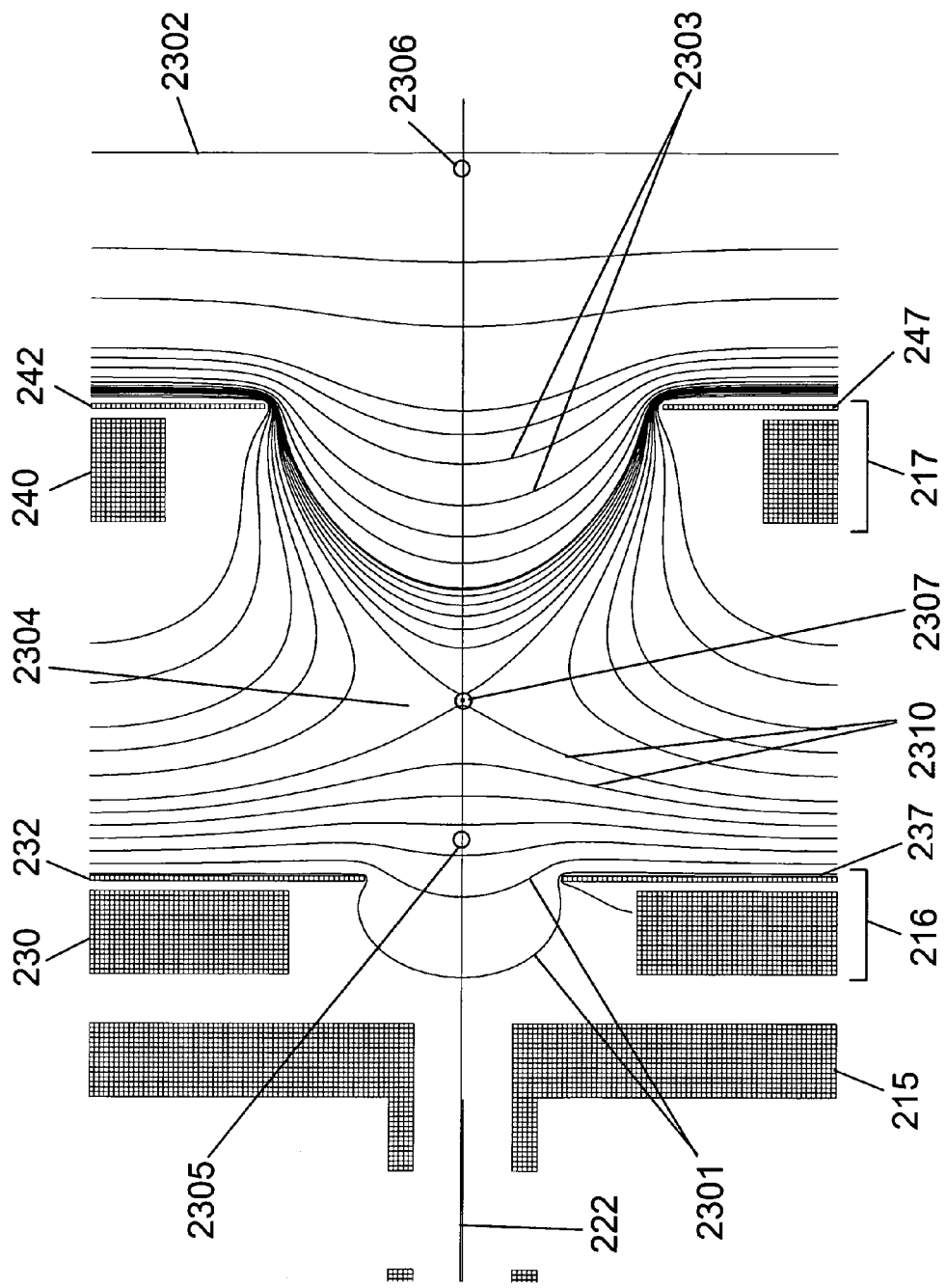
FIG. 23 is a cross-sectional close-up side view of the main lens illustrating the calculated set-up for the focus-1 and focus-2 octupole voltages.

The particular values shown in the table above were determined theoretically in a procedure described in FIG. 23.

Figure 3L:
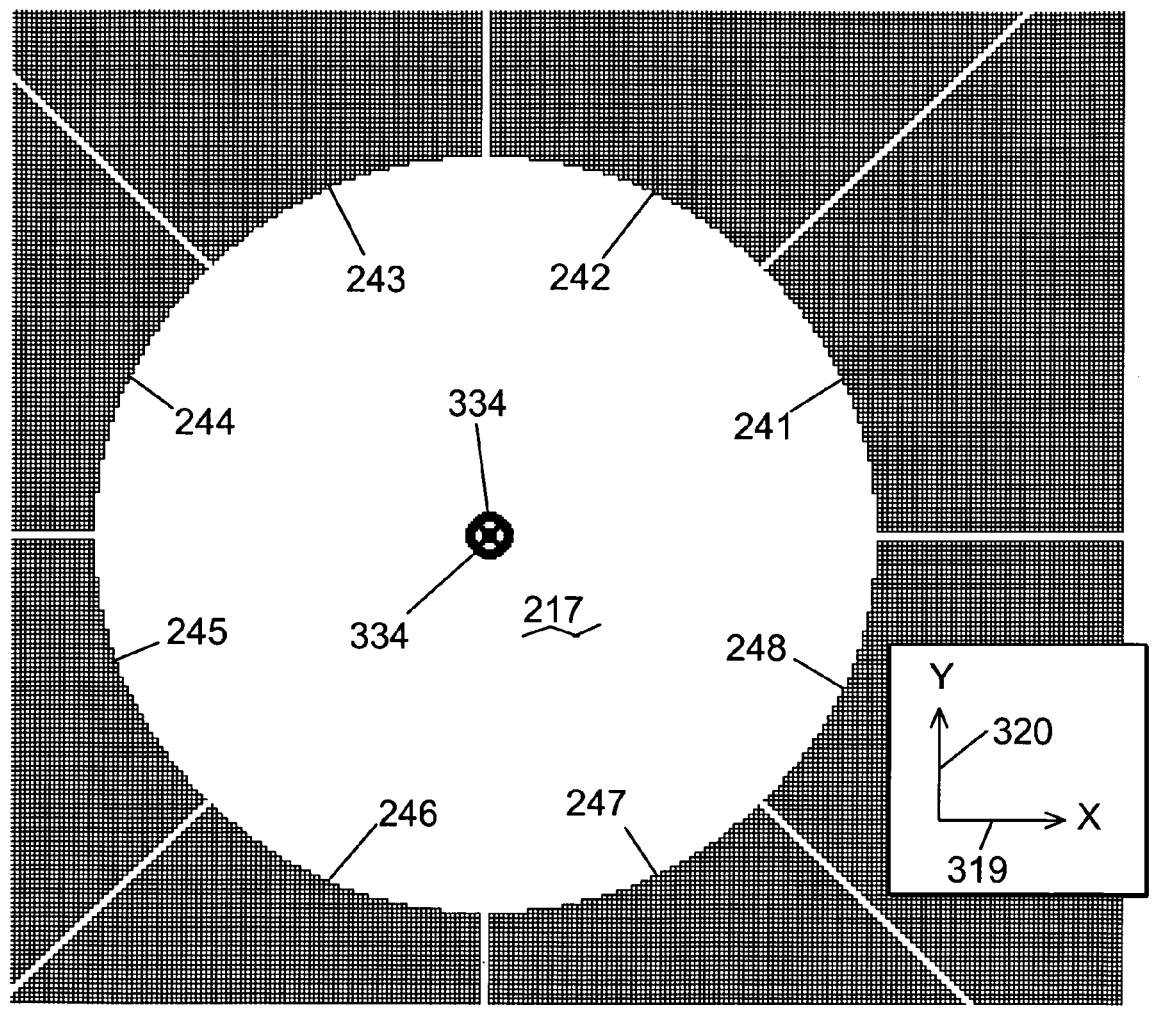
FIG. 3L shows a view of rays inside the focus-2 electrode assembly 217.

FIG. 3L is an axial cross-sectional view of the rays 334 inside the focus-2 electrode assembly 217 (the scale is larger than in FIG. 3K). The initial laminar distribution of angles shown in FIGS. 3A-3B has been preserved farther down the column along with an image of the openings in the PBDA 212. The beam 222 is shown off-center (in the +X-direction) within the focus-2 electrode assembly 217 due to the combined beam deflection in the upper and lower mainfield deflectors 213 and 214. With proper setting of the dipole excitation voltages on electrodes 241-248 in the focus-2 electrode assembly 217, the X-Y beam position leaving the focus-2 electrode assembly 217 will be the same as the X-Y beam position entering the focus-1 electrode assembly 216. The focus-2 electrode assembly 217 comprises: (1) a support electrode 240 (see FIG. 2B) which has a large cylindrical ID, and (2) electrodes 241-248 forming a conventional electrostatic octupole with very short electrode lengths parallel to the optical (Z-) axis and a smaller ID than the support electrode 240. The dipole electrostatic excitation of the octupole 241-248 is varied in proportion to the excitation of the upper and lower mainfield deflectors 213 and 214 to maintain the effective axis of the focus-2 electrode assembly 217 concentric with the beam 222.

The common mode voltage on electrodes 240-248 is determined by the focusing requirement on-axis for the particular square beam size desired. Typical focusing voltages are as follows:

| Square Beam Size | Source Lens Electrodes 203 and 204 | Focus-2 Electrodes 240-248 Common Mode | Beam 222 Half-Angle at Tip 201 |
|---|---|---|---|
| 30 nm | 638.2 | 4906.5 | 0.4° |
| 40 nm | 482.0 | 5007.4 | 0.8° |
| ~80 nm | 445.3 | 5122.0 | 1.2° |
| 120 nm | 432.0 | 5217.2 | 1.5° |

Typical electrode excitation voltages for a +25 μm X-direction deflection would be (5007.4 V common mode voltages shown for a 40 nm beam):

| Focus-2 electrode assembly 217 | Electrode voltages with +25 μm X-deflection | Electrode voltages with no deflection | Electrode voltages with −25 μm X-deflection |
|---|---|---|---|
| Electrode 240 | 5007.4 V | 5007.4 V | 5007.4 V |
| Electrode 241 | 5007.4 + 100.00 V | 5007.4 V | 5007.4 − 100.00 V |
| Electrode 242 | 5007.4 + 41.42 V | 5007.4 V | 5007.4 − 41.42 V |
| Electrode 243 | 5007.4 − 41.42 V | 5007.4 V | 5007.4 + 41.42 V |

-continued

| Focus-2 electrode assembly 217 | Electrode voltages with +25 μm X-deflection | Electrode voltages with no deflection | Electrode voltages with −25 μm X-deflection |
|---|---|---|---|
| Electrode 244 | 5007.4 − 100.00 V | 5007.4 V | 5007.4 + 100.00 V |
| Electrode 245 | 5007.4 − 100.00 V | 5007.4 V | 5007.4 + 100.00 V |
| Electrode 246 | 5007.4 − 41.42 V | 5007.4 V | 5007.4 + 41.42 V |
| Electrode 247 | 5007.4 + 41.42 V | 5007.4 V | 5007.4 − 41.42 V |
| Electrode 248 | 5007.4 + 100.00 V | 5007.4 V | 5007.4 − 100.00 V |

The particular values shown in the table above were determined theoretically in a procedure described below in FIG. 23. Each of the ray intercepts 334 in beam 222 is evenly separated on a grid approximately corresponding to the X-axis 319 and Y-axis 320, with roughly the same relative positions to each other that the corresponding ray intercepts 302 in FIG. 3A maintained.

Figure 3M:
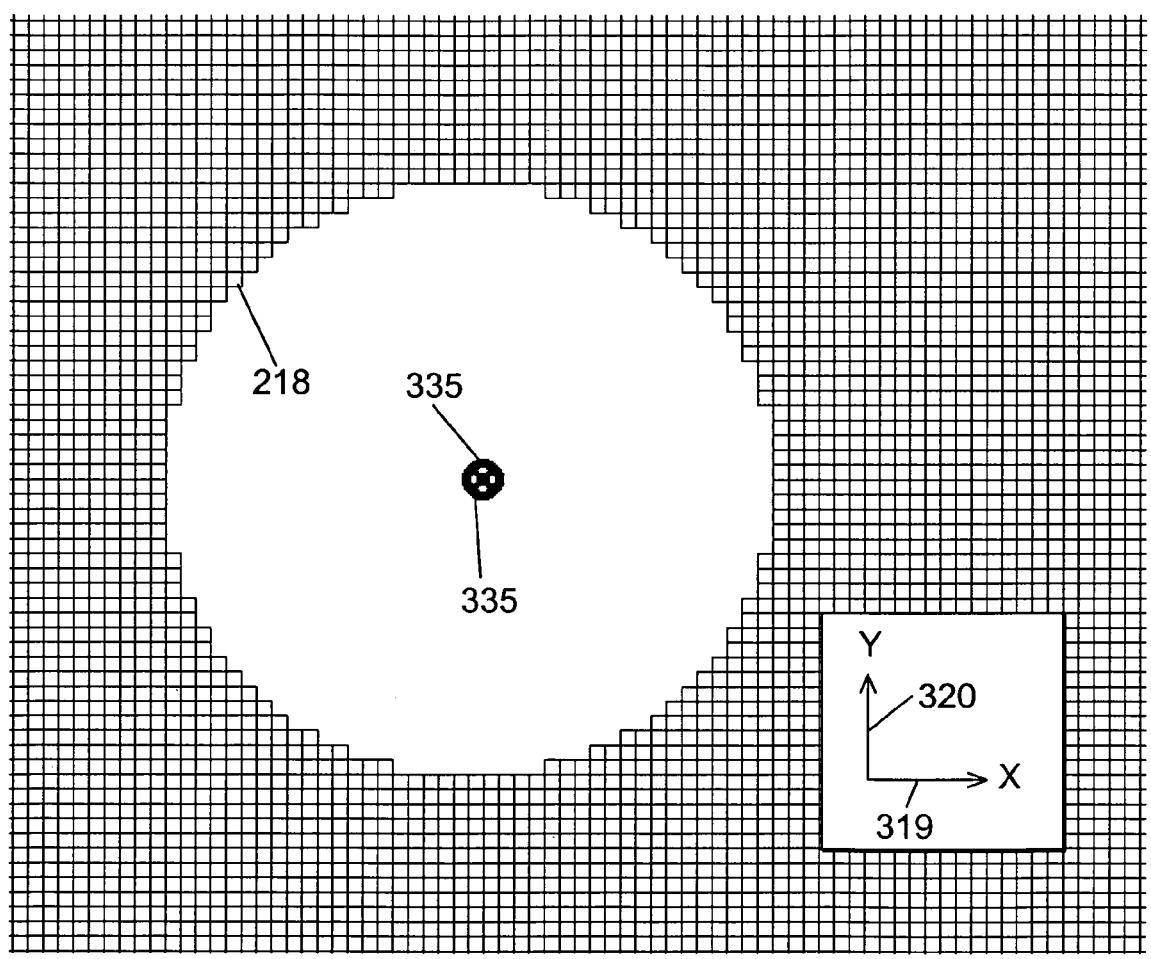
FIG. 3M shows a view of rays inside the field-free tube 218.

FIG. 3M is an axial cross-sectional view of the rays 335 inside the field-free tube 218. The initial laminar distribution of angles shown in FIGS. 3A-3B has been approximately preserved along with an image of the openings in the PBDA 212. The beam 222 is shown off-center (in the +X-direction) within the field-free tube 218 due to the combined beam deflection in the upper and lower mainfield deflectors 213 and 214. With proper setting of the voltages on electrodes 230-238 in the focus-1 electrode assembly 216 and on electrodes 240-248 in the focus-2 electrode assembly 217, the X-Y beam position entering the field-free tube 218 will be roughly the same as the X-Y beam position entering the focus-1 electrode assembly 216. At the entrance to the field-free tube 218, there is a diverging accelerating lens arising from penetration of the electric field between the focus-2 assembly 217 and the field-free tube 218—this diverging lens increases the beam deflection at the wafer by typically 25% over that due to the main deflectors 213 and 214. Note that now the beam 222 is much smaller in diameter than at the entrance to the focus-1 electrode assembly 216 due to the focusing effect of the main lens.

The use of a "moving lens" as described above has two important advantages:
1) since the beam is always on the symmetry axis of the lens fields, all off-axis aberrations, both geometrical (coma, astigmatism, curvature of field and distortion) and chromatic (variation in magnification) are essentially eliminated
2) the beam striking the wafer surface will always be scanned telecentrically, i.e., perpendicular to the wafer surface, thereby improving the depth-of-focus.

Considerations On the Location of the Beam-Defining Aperture

The location of the patterned beam-defining aperture 212 in the present invention is a key consideration in determining the effectiveness of the beam patterning process at the substrate surface 221. The following locations down the column might be considered:
1. Near the source tip 201
    FIG. 3A is an illustration of the profile of beam 222 near the source tip 201. The evenly-spaced distribution of ray intercepts 302 within beam 222 can be seen clearly. At location 301, any effects due to spherical aberration or chromatic aberration are minimal since the beam 222 is so near the tip it has had almost no time to diverge from the ideal evenly-spaced angular distribution. Spherical aberration will tend to make the outer rays bend back towards the optical (symmetry) axis, which would show up as the outer rays being more closely spaced than the inner rays. Chromatic aberration would tend to radially separate the lower energy electrons from the higher energy electrons. A disadvantage of positioning the beam-defining aperture 212 near the source tip 201 is that electrons striking the aperture can backscatter and strike the source tip 201, generating heating and outgassing there.
2. At the top of the accelerating column 209
    FIG. 3B shows the beam profile at the top of the accelerating column 209. At this location (position 303), the ray intercepts 304 within beam 222 are still evenly separated, with spherical and chromatic aberration due to the source lens (comprised of electrodes 202, 203, 204 and 205) still minimal.
3. Just Above the Main Deflectors
    FIG. 2B shows a third possible location for the patterned beam-defining aperture 212—this is the location chosen for the embodiment described herein. A key advantage of placing the beam-defining aperture 212 at location 3 relates to the optical alignment of the column. By placing the beam trimming aperture 276 at the bottom of the accelerating column 209, it can be used to help set up the excitations of the alignment deflectors 207 and 208 in order to steer the beam properly through the patterned beam-defining aperture 212 and then into the lower parts of the column, including the mainfield deflectors 213 and 214, subfield deflector/stigmator 215, and the main lens. Proper alignment of the beam through the main lens is key to obtaining the proper patterned beam at the substrate surface 221.

Note: the electron beam energy at the point in the column where the beam defining aperture is placed will be a factor in determining the amount of heating of the aperture that may occur. Aperture heating should be considered when determining the location for the beam-defining aperture.

Further Considerations Regarding Optimization of the Placement of the Beam-Defining Aperture An optimization process may be used in which the process shown in FIG. 1 is repeated for different positions of the beam-defining aperture in the column. This will generate beam profiles and current density distributions at the substrate and beam-defining aperture designs for each position. The best position may then be determined by also considering:
   a) the beam profile at the substrate.
   b) the beam current density at the substrate.
   c) the manufacturability of the beam-defining aperture.

FIG. 4A shows a calculated circular beam profile at the surface of substrate 221 centered on the optical axis, typical of those generated in block 108 of FIG. 1, prior to insertion of a patterned beam-defining aperture 212 into the column from FIG. 2A. The beam 222 cross-section is graphed relative to the two axes, X 401 and Y 402. The desired patterned beam shape 403, shown as a square here, but which can have any practicable shape, is then superimposed on the beam cross-section. Rays 404 fall outside the desired shape 403, while rays 405 fall inside the desired shape 403. For each of the rays 404 and 405, the X-Y coordinates at the beam-defining aperture 212 are recorded, along with the corresponding X-Y coordinates at the wafer surface 221 shown here.

Note that the calculations in block 108 of FIG. 1 have adjusted the diameter of the circular beam to just enclose the desired beam pattern 403 with very few rays lost at the corners of the (square) pattern 403 shown. This ensures the highest efficiency in the use of the emission current from the source tip 201, thus maximizing the current density in the beam 222 at the substrate 221. In the example shown, the desired beam pattern 403 is a 40 nm square and the circular beam diameter has been adjusted to be a little larger than $\sqrt{2} \times 40$ nm $\approx 56$ nm, corresponding to the distance between the diagonal corners of the square beam pattern 403.

FIG. 4B shows a calculated circular beam profile at the surface of substrate 221 centered +12.5 µm off the optical (Z-) axis, typical of those generated in block 108 of FIG. 1, prior to insertion of a patterned beam-defining aperture 212 into the column from FIG. 2A. The beam 222 cross-section is graphed relative to the two axes, X 406 and Y 402—note that the same Y-axis 402 is used as in FIG. 4A but due to the +12.5 µm X-deflection, a different X-axis 406 is defined with X=0 on X-axis 406 corresponding to X=+12.5 µm on X-axis 401. The desired patterned beam shape 403, shown as a square here is the same as in FIG. 4A. Rays 407 fall outside the desired shape 403, while rays 408 fall inside the desired shape 403. For each of the rays 407 and 408, the X-Y coordinates at the beam-defining aperture 212 are recorded, along with the corresponding X-Y coordinates at the wafer surface 221 shown here.

Note that the design of the optical column must ensure that the beam remains circular with approximately the same diameter, even when deflected +25 µm off-axis as shown. This is important for achieving the same beam size and current density when deflecting the maximum distance off-axis as when the beam is near the optical axis. It is also important to note that the set of rays 408 falling inside the desired pattern 403 shown here do not necessarily correspond to the set of rays 405 falling inside the desired pattern 403 in FIG. 4A. This is due to off-axis geometrical aberrations in the optical column.

FIG. 4C shows a calculated circular beam profile at the surface of substrate 221 centered +25 µm off the optical (Z-) axis, typical of those generated in block 108 of FIG. 1, prior to insertion of a patterned beam-defining aperture 212 into the column from FIG. 2A. The beam 222 cross-section is graphed relative to the two axes, X 409 and Y 402—note that the same Y-axis 402 is used as in FIGS. 4A and 4B, but due to the +25 µm X-deflection, a different X-axis 409 is defined with X=0 on X-axis 409 corresponding to X=+25 µm on X-axis 401. The desired patterned beam shape 403, shown as a square here, is the same as in FIGS. 4A and 4B. Rays 410 fall outside the desired shape 403, while rays 411 fall inside the desired shape 403. For each of the rays 410 and 411, the X-Y coordinates at the beam-defining aperture 212 are recorded, along with the corresponding X-Y coordinates at the wafer surface 221 shown here.

Note that the design of the optical column must ensure that the beam remains circular with approximately the same diameter, even when deflected +25 µm off-axis as shown. This is important for achieving the same beam size and current density when deflecting the maximum distance off-axis as when the beam is near the optical (Z-) axis. It is also important to note that the set of rays 411 falling inside the desired pattern 403 shown in FIG. 4C do not necessarily correspond to the set of rays 405 falling inside the desired pattern 403 in FIG. 4A or to the set of rays 408 falling inside the desired pattern 403 in FIG. 4B. This is due to off-axis geometrical aberrations in the optical column.

Figure 5:
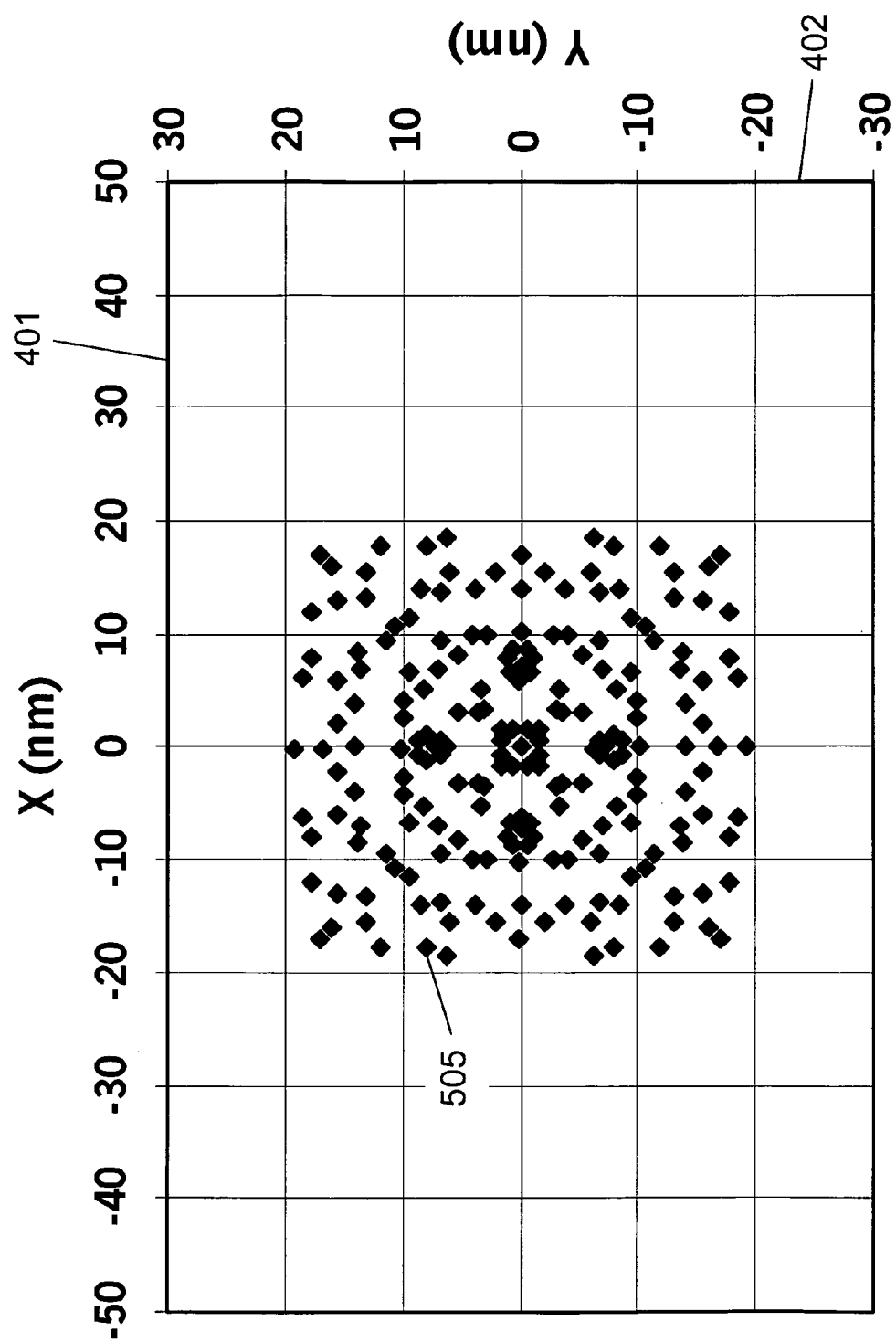
FIG. 5 shows a graph of an ideal beam profile centered on the optical axis (0,0) and in the plane of the wafer, after insertion of a patterned aperture into the column of FIG. 2A.

FIG. 5 shows a calculated square beam profile at the surface of substrate 221 centered on the optical axis, typical of those generated in blocks 108-110 after insertion of a patterned beam-defining aperture 212 into the column from FIG. 2A. The beam 222 cross-section is graphed relative to the two axes, X 401 and Y 402, the same as in FIG. 4A. All the rays 505 fall within the desired patterned beam shape 403 shown in FIG. 4A.

Note that the calculations in block 110 have determined the intersection of the five sets of rays:

1) the set of rays 405 in FIG. 4A (corresponding to no deflection)
2) the set of rays 408 in FIG. 4B (corresponding to a +12.5 µm X-deflection)
3) the set of rays 411 in FIG. 4C (corresponding to a +25 µm X-deflection)
4) the set of rays 408 in FIG. 4B mirror-imaged around the Y-axis (X-coordinates inverted) at the wafer surface 221 (this generates data corresponding to a −12.5 µm X-deflection—note that this also mirror-images the rays at the beam-defining aperture 212)
5) the set of rays 411 in FIG. 4C mirror-imaged around the Y-axis (X-coordinates inverted) at the wafer surface 221 (this generates data corresponding to a −25 µm X-deflection).

The intersection of these five sets is typically 5-10% smaller than any of the five individual sets. This is due to off-axis geometrical aberrations distorting the original circular beam profiles. The goal of the optical design process in block 108 of FIG. 1 is to minimize off-axis geometrical aberrations and thus maximize the size of the intersection of the above five sets of rays. The set of rays 505 shown in FIG. 5 is a subset of the set of rays 405 in FIG. 4A as a result of this effect. In this particular example, the set of rays 405 has 237 members while the set of rays 505 has 223 members, for a reduction of 5.9%.

FIG. 6A is a graph of the idealized set of rays 605, 606 and 607 at the patterned beam-defining aperture 212 which should be transmitted to the wafer, corresponding to rays 505 in FIG. 5. This is the result of the ideal aperture design developed in block 112 of FIG. 1. The center set of rays 605 within the area having X-Y coordinates satisfying −40 µm<X<+40 µm and −40 µm<Y<+40 µm corresponds to those rays which undergo minimal spherical aberrations since they correspond to small angles relative to the optical axis at the source tip 201. The outer sets of rays 606 for which X<−40 µm, X>+40 µm, Y<−40 µm and/or Y>+40 µm correspond to rays undergoing larger spherical aberration which causes them to "fold" over into the desired beam profile 403 even though in first-order optics they would fall outside the desired beam profile 403. Note that parallel to the Y-axis 602 there are two holes 603 in the distribution of rays. Parallel to the X-axis 601 there are another two holes 604 in the ray distributions. These four holes 603 and 604 correspond to rays (such as 404, 407, or 410) which would fall outside the desired beam profile 403. Along the diagonals to the Y-axis 602 and X-axis 601, all rays are transmitted—this is a result of the careful matching of the original (circular) beam profile to the desired size of the beam shape 403 along its diagonal dimension. Holes 603 and 604 correspond to areas of the patterned beam-defining aperture 212 which are opaque to the beam 222, i.e., solid patterns. As can be seen in FIG. 6A, however, these solid patterns are separated from the outside of the beam-defining aperture 212 and are thus not physically realizable. Rays 607 correspond to those rays which must be sacrificed in order to achieve a practical aperture design as shown in FIG. 8A.

FIG. 6B is a graph of the idealized set of rays 610 and 611 which should be blocked by the beam-defining aperture 212 so that they will not reach the wafer surface 221. This set of rays is complementary to the set shown in FIG. 6A and is the result of the ideal aperture design developed in block 112 of FIG. 1. The set of rays 610 corresponds to those rays which must be blocked to generate the desired square beam profile 403—these rays 610 correspond to holes 603 and 604 in FIG. 6A. Along the diagonals to the X- and Y-axes, no rays are blocked—this is a result of the careful matching of the original (circular). beam profile to the desired size of the beam shape 403 along its diagonal dimension. Rays 611 around the perimeter result from the fact that the initial (circular) beam profile was slightly larger that the diagonal dimension of the desired beam shape 403—this is desirable since otherwise clipping of the corners of the actual beam profile might occur.

Figure 7A:
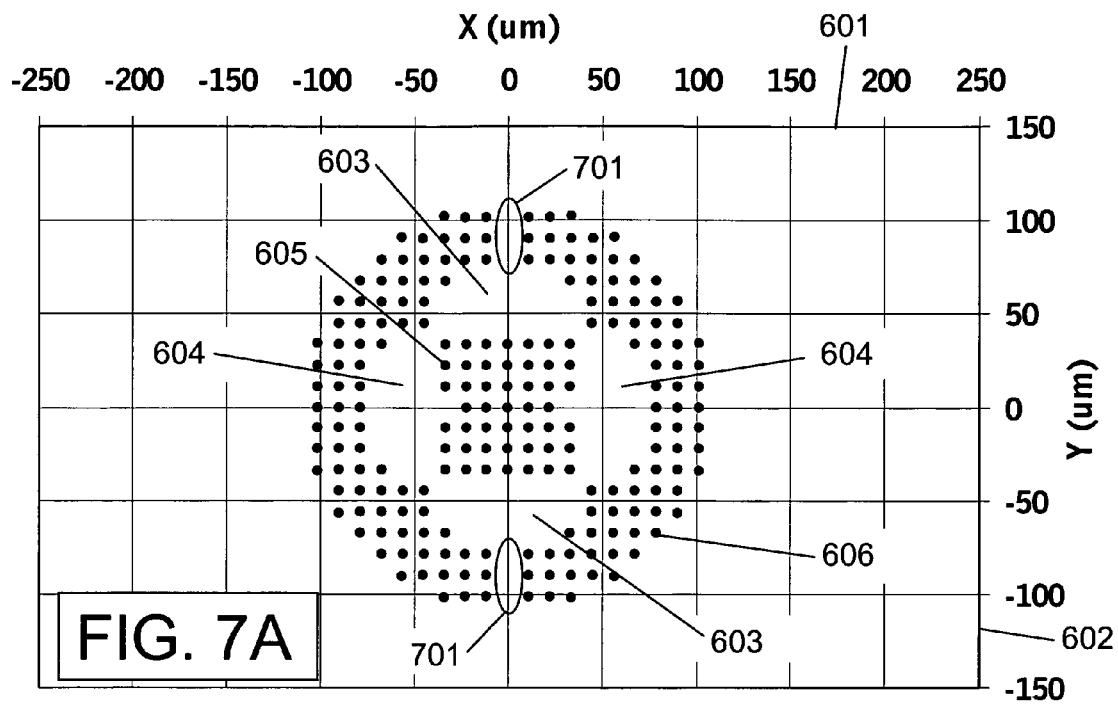
FIG. 7A shows a graph of actual beams transmitted by the patterned beam-defining aperture 212 in the column of FIG. 2A.

FIG. 7A is a graph of the actual set of rays which are transmitted to the wafer by the practical aperture design shown in FIG. 8A which was developed in block 114 of FIG. 1. The only change to the transmitted rays between FIG. 6A and FIG. 7A is at locations 701, where now there are no transmitted rays. This corresponds to the loss of the six rays 607 in FIG. 6A.

Figure 7B:
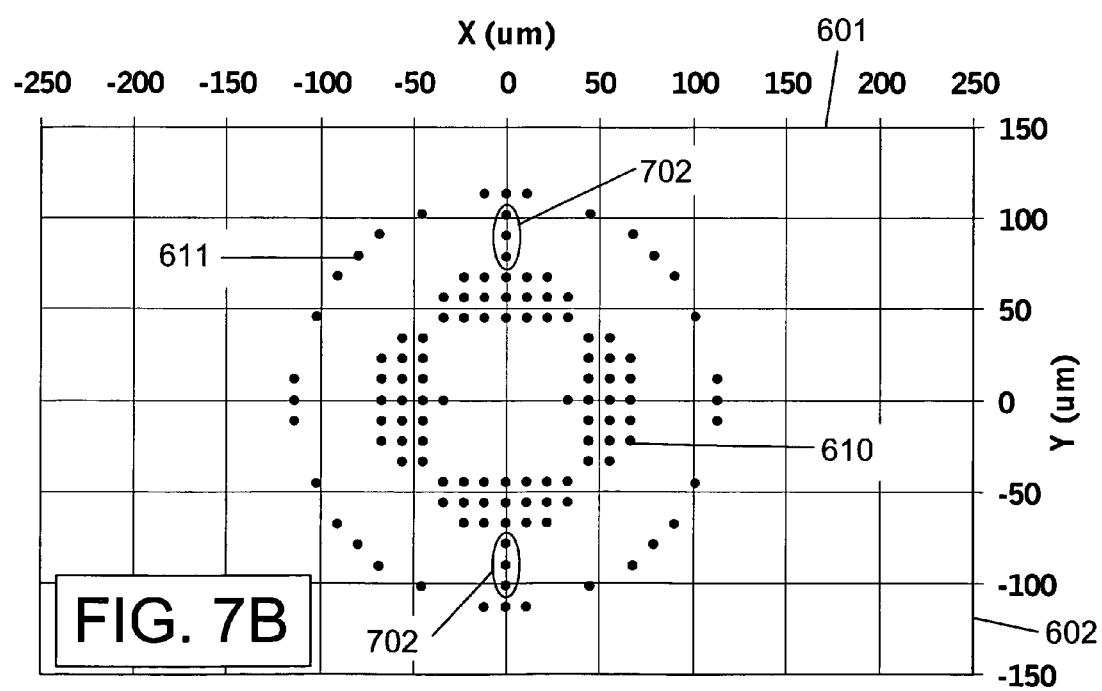
FIG. 7B shows a graph of actual beams blocked by the patterned beam-defining aperture 212 in the column of FIG. 2A.

FIG. 7B is a graph of the actual set of rays which are blocked by the aperture design shown in FIG. 8A. This set of rays is complementary to the set shown in FIG. 7A. The only change to the blocked rays between FIG. 6B and FIG. 7B is at locations 702, where now there are six additional blocked rays, corresponding to rays 607 missing from locations 701 in FIG. 7A.

FIG. 8A shows the results of the final changes to the aperture design made in block 114 of FIG. 1 to obtain a practical patterned beam-defining aperture 212 design. Ray intercepts 605 and 606 correspond to FIGS. 6A and 7A, while struts 812 correspond to the added aperture material needed to support the four center structures 805 which block rays corresponding to ray intercepts 610. Various radii 803 are added to the aperture design for added strength and ease of fabrication—the size of these radii should be kept to the minimum required, however, to avoid blocking too much beam current. The design is not four-fold symmetric because of the fact that the mainfield deflection is always parallel to the X-axis 601, with only a small (±1 µm) deflection parallel to the Y-axis 602. This non four-fold symmetry is principally apparent with the addition of two small protrusions 804 within the center square opening. Because the beam deflection around both the X-axis 601 and the Y-axis 602 is symmetric, the resulting patterned beam-defining aperture design is mirror-symmetric around both the X-axis 601 and Y-axis 602.

The patterned beam-defining aperture (PBDA) 212 is a conductive structure, held at a fixed potential. It may be manufactured by machining, laser ablating, micro-machining, etc. a metal foil, a conductive membrane, a conductively coated membrane, or an equivalent thin material. For applications utilizing the PBDA 212 in a column at a position where high energy electrons are incident on it, there is the option to utilize a patterned thick film supported by a continuous membrane, the continuous membrane being 'electron transparent'. This design allows PBDAs to be fabricated without the need for mechanical support struts 812 and radii 803.

Another important consideration is the effects of the energy spread of the electron beam 222, which, for example with Schottky emitters, may exceed 1.0 eV FWHM. The effect of the chromatic aberration in the upper column, i.e., all optical elements above the beam-defining aperture 212, is to blur the beam 222 at the beam-defining aperture 212. In optical designs without an intermediate crossover above the PBDA 212, this blurring is generally manifested as higher energy electrons being farther from the optical axis and lower energy electrons being nearer to the optical axis. If the chromatic beam blurring is too large, the rays intersecting the patterned beam-defining aperture will not be properly apertured. FIG. 8A shows the ray intersections with the plane of the beam-defining aperture 212 corresponding to electrons at the nominal energy, in this example, 5000 eV.

Figures 8B, 8C:
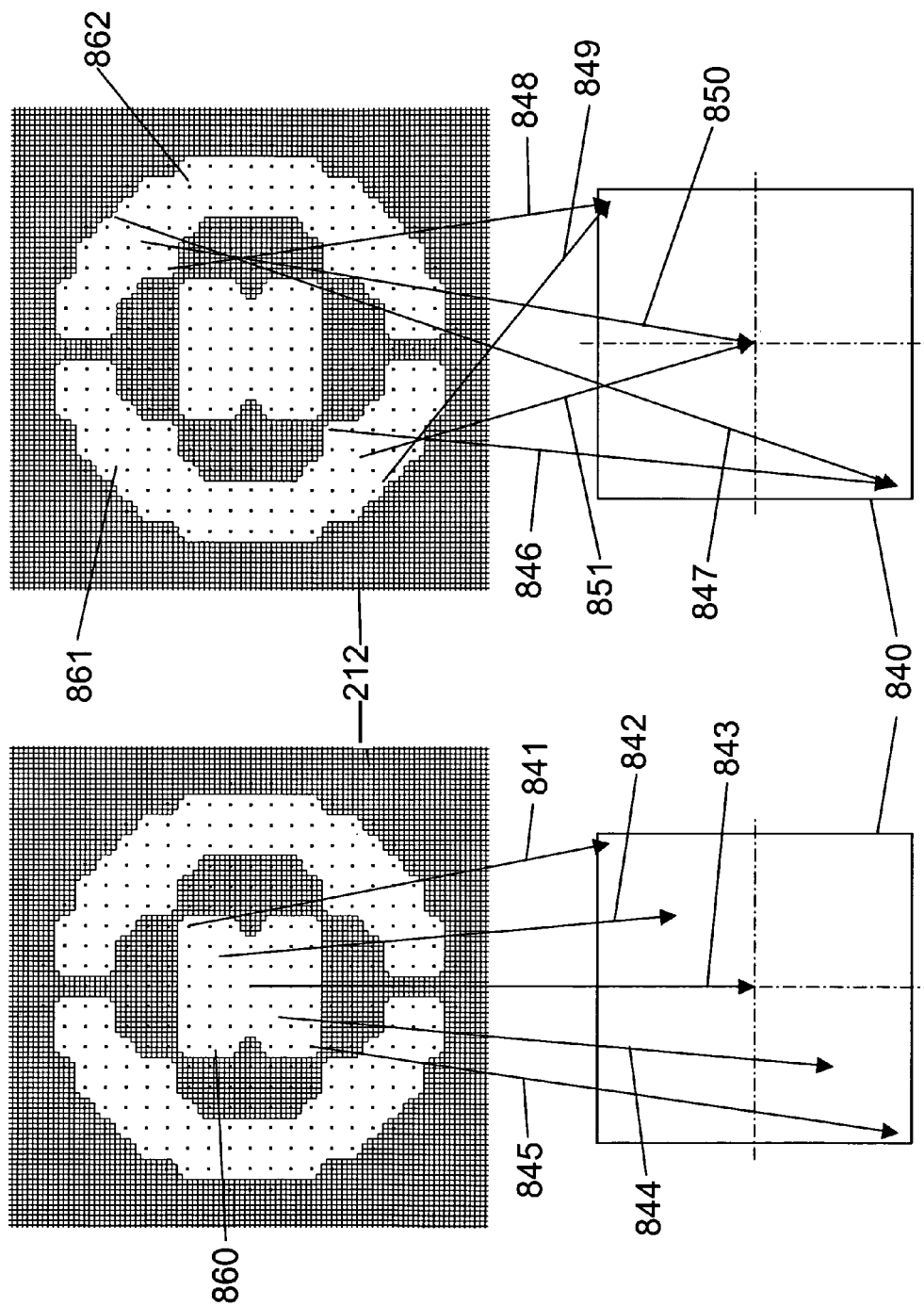
FIG. 8B shows the mapping of rays passing through the center portion of the PBDA to the ray intersections at the wafer surface.
FIG. 8C shows the mapping of rays passing through the outer portions of the PBDA to the ray intersections at the wafer surface.

FIG. 8B illustrates part of the mapping of rays passing through the PBDA 212 to the ray intersections at the wafer surface 221. The square beam 840 at the wafer surface 221 is shown for rays passing through the center (roughly square) opening 860 of PBDA 212. Ray 841 passes through the upper right corner of opening 860, landing on the wafer surface 221 at the upper right corner of square beam 840. Similarly, ray 845 passes through the lower left corner of opening 860, landing on the wafer surface 221 at the lower left corner of square beam 840. The mapping of rays passing through the center opening in PBDA 212 to the square beam 840 follows the same pattern for rays 842-844—this is essentially identical to the way a patterned beam is formed in prior art shaped beam systems, giving a relatively low current density at the wafer surface 221.

The mapping of rays between the PBDA and the wafer shown in FIG. 8B is essentially an image of the center square opening 860 onto the wafer surface 221. In prior art shaped beam systems, the beam shape at the wafer surface 221 is an image of one or more apertures typically demagnified onto the wafer surface 221 with a 1:1 mapping of (X, Y) coordinates at the beam-shaping aperture(s) onto the (X, Y) coordinates at the wafer surface 221. A 1:1 mapping means that for every (X,Y) coordinate at the plane of the PBDA 212, there is exactly one (X,Y) coordinate at the plane of the wafer 221. In order to achieve a 1:1 mapping, it is necessary that all aberrations in the optical system be minimized so that imaging is dominated by the first-order optics of the system. This limitation affects the total amount of current which can be focused into the beam at the wafer surface 221 since the aberrations must be minimized by restricting the range of beam angles at the source tip 201 which are transmitted to the wafer surface 221.

However, to form a shaped beam at the wafer surface it is not necessary to employ such a 1:1 mapping. It is possible to employ an N:1 mapping (where N is an integer, N≧2; in the embodiment of the invention herein, N=3) from the PBDA plane to the wafer plane. In this case, with N=3, there are exactly three different (X, Y) coordinates in the plane of the PBDA 212 which map to essentially every (X, Y) coordinate in the plane of the wafer surface 221. The only exception to this N:1 mapping is at (0, 0)=the center of the beam, but this has no effect on the beam shape since it is away from the beam edge. Since the illumination of the PBDA 212 is uniform, with a 3:1 mapping, a larger current can be focused into the shaped beam at the wafer surface 221 than is possible with a 1:1 mapping. The reason that the mapping in the present invention is 3:1 (as opposed to 2:1, 4:1, . . . ) is that spherical aberration is the dominant aberration on-axis. To preserve the square beam shape off-axis, it is further necessary that the off-axis aberrations be minimized, since otherwise the 3:1 mapping will be degraded, resulting in loss of the desired patterned beam shape. In the present invention, a "moving lens" (see FIGS. 3K, 3L) is used to maintain the effective axis of the main lens concentric with the beam for all off-axis beam deflections (see FIG. 23). Since the beam is always on the effective axis of the main lens, all off-axis aberrations (geometrical and chromatic) are nearly eliminated, preserving the dominance of spherical aberration (which is unchanged off-axis).

An N:1 mapping is possible because the individual rays (each ray representing the trajectory of a single electron) can overlap with almost no interaction between them. Any residual interactions are called "space-charge beam spreading". For beam currents in the nA range, these effects are minimal at the beam energies (50 keV) employed in the present invention.

To increase the current density in the shaped beam 840, a set of rays in addition to rays 841-845 are shown in FIG. 8C, passing through the outer openings 861 and 862 in PBDA 212. Ray 846 passes through opening 861 just outside of the center square opening 860 and lands on the wafer surface 221 at the lower left corner of shaped beam 840. Ray 851 passes through opening 861 roughly halfway between the inner and outer edges of opening 861 and lands on the wafer at the center of shaped beam 840. Ray 849, passing near the outer edge of opening 861 lands at the upper right corner of shaped beam 840. The mappings of rays 847, 850, and 848, passing through opening 862 are similar, as shown. Note that, unlike the case for opening 860, rays passing through openings 861 and 862 are "folded over", with rays passing through openings 861 and 862 farthest from the center of PBDA 212 landing the wafer surface 221 at the opposite corners of shaped beam 840. Since the current density illuminating PBDA 212 is uniform, the total beam current reaching shaped beam 840 is proportional to the area of openings 860-862. Because the focusing of rays 841-845 is similar to that used to generate prior art shaped beams, the area of opening 860, compared with the total area of openings 860-862 determines the increase in beam current density at the wafer surface 221 obtained through use of the present invention. In the example of FIGS. 8B-8C, the total area of openings 861 and 862 is about 6-7 times the area of opening 860, thus the increase in current density is about 7-8 times that which would be possible using the center opening 860 only.

Figure 9:
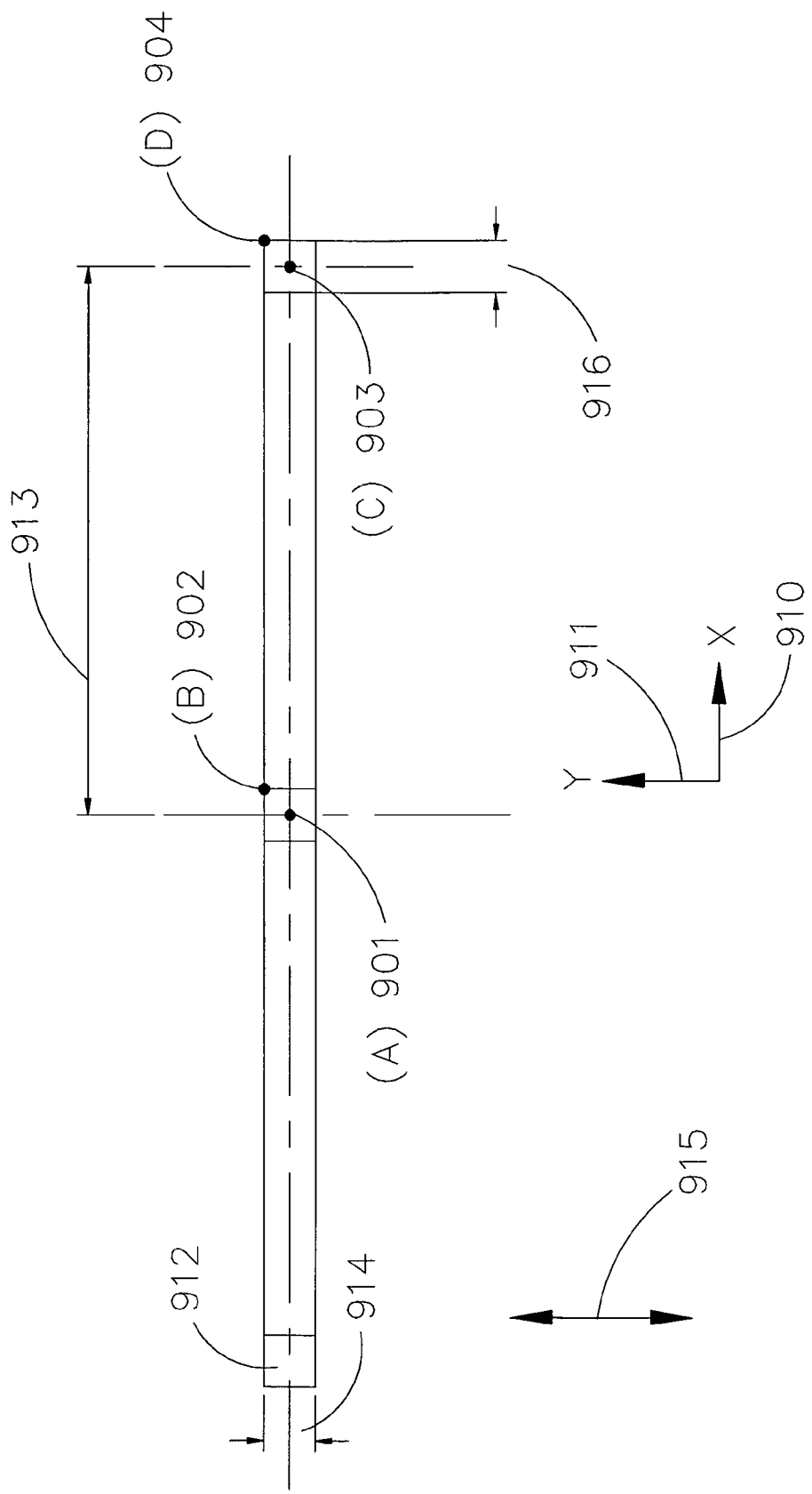
FIG. 9 shows a diagram of the various beam positions A-D at the wafer surface used for calculation of beam profiles.

FIG. 9 shows a diagram of the various beam positions A-D at the wafer surface used for calculation of beam profiles. Using only the subfield deflector/stigmator 215 (see FIG. 2A), the maximum deflection is ±1 μm in the X-direction 910 and ±1 μm in the Y-direction 911, moving the beam 222 from the center position A 901 to position B 902. Using only the mainfield deflectors 213 and 214, the maximum deflection 913 shown is +25 μm in the X-direction 910, moving the beam 222 to position C 903. Using both the mainfield deflectors 213 and 214 and the subfield deflector/stigmator 215 moves the beam to position D 904. A typical 2 μm-square subfield 912 is shown, defining the 2 μm 914 width of the scan stripe. While the mainfield deflectors 213 and 214 are moving the beam generally along the X-axis 910, the wafer stage is moving in direction 915 parallel to the Y-axis 911 in a serpentine pattern illustrated in FIG. 27B.

FIG. 10A shows a calculated exposure dose at position A in FIG. 9 due to a single flash of the square electron beam. Coordinate axes on the substrate surface 221 are X 1001 and Y 1002. Area 1004 corresponds to beam current densities $\geq 3000$ A/cm$^2$. In this illustrative example, if the resist sensitivity is assumed to be 5 μC/cm$^2$, and the dwell time to be 1.67 ns, then:

$$\text{Dose into substrate} = (\text{current density})(\text{dwell time})$$

$$= (3000 A/cm^2)(1.67 \text{ ns})$$

$$= 5 \mu C/cm^2 = \text{resist sensitivity.}$$

Thus the resist will be fully exposed within area 1004. In region 1003, the exposure dose is <5 μC/cm$^2$ and the resist is therefore not fully exposed. FIG. 10A shows that area 1004 is roughly a 40 nm square. The combined effects of the virtual source size, chromatic aberration (to all orders), and spherical aberration (to all orders) are fully taken into account in this calculation. The beam profile plot in FIG. 13 corresponds to the current between the two lines 1005 and 1006, i.e., the current density across the side of the square beam shape.

FIG. 10B shows a calculated exposure dose at position B in FIG. 9 due to a single flash of the square electron beam. Coordinate axes on the substrate surface 221 are X 1011 and Y 1012. Area 1014 corresponds to beam current densities $\geq 3000$ A/cm$^2$, as in FIG. 10A. With a 1.67 ns dwell time and 5 μC/cm$^2$ resist sensitivity, the resist will be fully exposed within area 1014. In region 1013, the exposure dose is <5 μC/cm$^2$ and the resist is therefore not fully exposed. FIG. 10B shows that area 1014 is again roughly a 40 nm square, very similar to area 1004. The similarity between areas 1004 and 1014 shows that the full +1 μm X and Y subfield deflections have a minimal effect on the beam shape. The combined effects of the virtual source size, chromatic aberration (to all orders), spherical aberration (to all orders) and off-axis aberrations (both geometric and chromatic to all orders) are fully taken into account in this calculation.

FIG. 10C shows a calculated exposure dose at position C in FIG. 9 due to a single flash of the square electron beam. Coordinate axes on the substrate surface are X 1021 and Y 1022. Area 1024 corresponds to beam current densities $\geq 3000$ A/cm$^2$, as in FIGS. 10A and 10B. With a 1.67 ns dwell time and 5 μC/cm$^2$ resist sensitivity, the resist will be fully exposed within area 1024. In region 1023, the exposure dose is <5 μC/cm$^2$ and the resist is therefore not fully exposed. FIG. 10C shows that area 1024 is again roughly a 40 nm square, very similar to areas 1004 and 1014. Comparison of areas 1004 and 1024 shows that the full +25 μm mainfield deflection has a minimal effect on the beam shape. The combined effects of the virtual source size, chromatic aberration (to all orders), spherical aberration (to all orders) and off-axis aberrations (both geometric and chromatic to all orders) are fully taken into account in this calculation.

FIG. 10D shows a calculated exposure dose at position D in FIG. 9 due to a single flash of the square electron beam. Coordinate axes on the substrate surface are X 1031 and Y 1032. Area 1034 corresponds to beam current densities $\geq 3000$ A/cm$^2$, as in FIGS. 10A-10C. With a 1.67 ns dwell time and 5 μC/cm$^2$ resist sensitivity, the resist will be fully exposed within area 1034. In region 1033, the exposure dose is <5 μC/cm$^2$ and the resist is therefore not fully exposed. FIG. 10D shows that area 1034 is again roughly a 40 nm square, very similar to areas 1004, 1014 and 1024. Comparison of areas 1004 and 1034 shows that the full +25 μm mainfield deflection combined with the full +1 μm X and Y subfield deflections has a minimal effect on the beam shape. The combined effects of the virtual source size, chromatic aberration (to all orders), spherical aberration (to all orders) and off-axis aberrations (both geometric and chromatic to all orders) are fully taken into account in this calculation.

Figure 11:
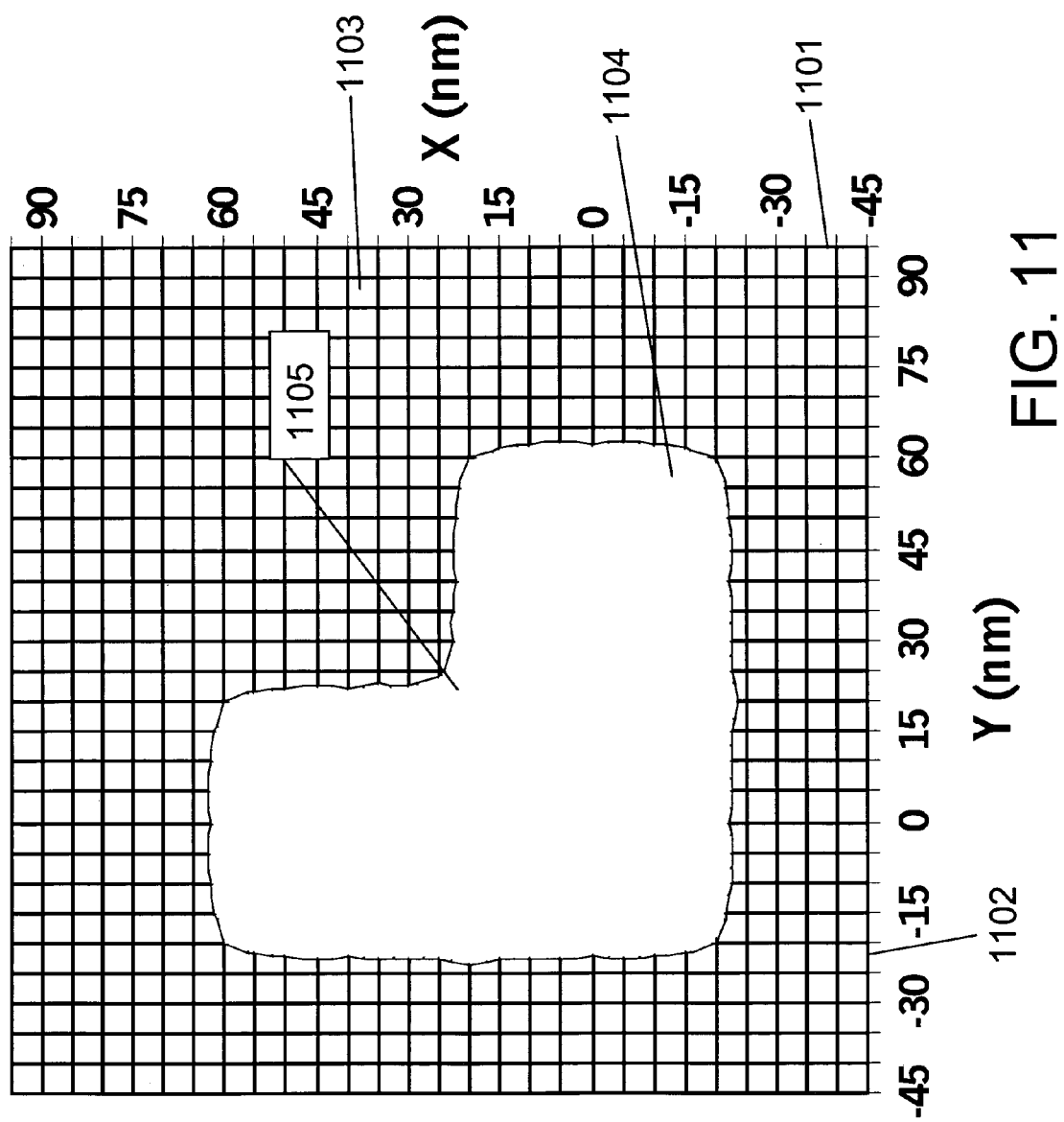
FIG. 11 shows a calculated exposure dose due to three flashes of the 40 nm square electron beam (all flashes as in FIG. 10A) abutting in an "L" pattern with spacings of 40 nm, when the beam is in position A of FIG. 9.

FIG. 11 shows a calculated exposure dose at position A in FIG. 9 due to three flashes of the square electron beam (as in FIG. 10A) abutting in an "L" pattern with beam center-to-center spacings of 40 nm. Coordinate axes on the substrate surface are X 1101 and Y 1102. Area 1104 corresponds to beam current densities $\geq$3000 A/cm$^2$. With a 1.67 ns dwell time and 5 µC/cm$^2$ resist sensitivity, the resist will be fully exposed within area 1104. In region 1103, the exposure dose is <5 µC/cm$^2$ and the resist is therefore not fully exposed. Exposed area 1104 is roughly an "L" shape with some radiusing 1105 at the bend of the "L". The width across the arms of the "L" is roughly 40 nm, corresponding to the 40 nm square area 1004. FIG. 11 demonstrates that complex patterns may be exposed by abutting the square beams on the substrate surface 221. The combined effects of the virtual source size, chromatic aberration (to all orders), and spherical aberration (to all orders) are fully taken into account in this calculation.

Figure 12:
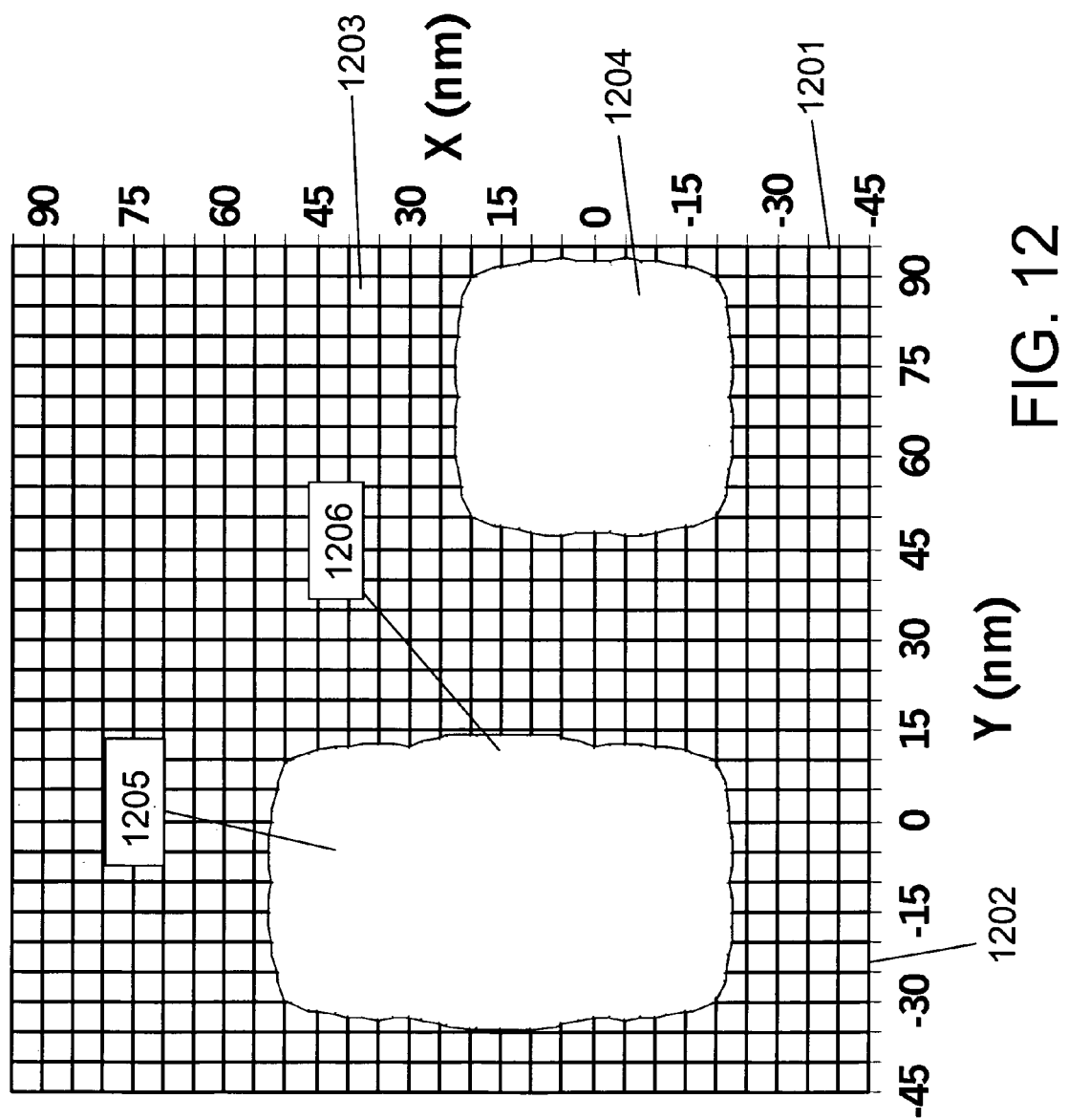
FIG. 12 shows a calculated exposure dose due to two overlapping flashes of the 40 nm square electron beam and a separate single flash (all flashes as in FIG. 10A), when the beam is in position A of FIG. 9.

FIG. 12 shows a calculated exposure dose at position A in FIG. 9 due to two overlapping flashes of the square electron beam and a separate single flash (all flashes as in FIG. 10A). Coordinate axes on the substrate surface are X 1201 and Y 1202. Areas 1204 and 1205 correspond to beam current densities $\geq$3000 A/cm$^2$. With a 1.67 ns dwell time and 5 µC/cm$^2$ resist sensitivity, the resist will be fully exposed within areas 1204 and 1205. In region 1203, the exposure dose is <5 µC/cm$^2$ and the resist is therefore not fully exposed. Exposed region 1204 is the same as exposed region 1004. Region 1205 corresponds to two flashes of the 40 nm square beams from FIG. 10A spaced center-to-center only 30 nm, giving a 10 nm overlap. This overlap causes the central region of area 1205 to be overexposed, resulting in a 2-3 nm bulge 1206 in the pattern. FIG. 12 demonstrates that patterns not corresponding to integral multiples of the size of the square beam (40 nm in this case) may be exposed on the substrate surface 221 by overlapping the square beams. The combined effects of the virtual source size, chromatic aberration (to all orders), and spherical aberration (to all orders) are fully taken into account in this calculation.

FIG. 13 shows a graph of calculated beam current density 1302 at position A in FIG. 9 across a single square beam (as in FIG. 10A) and across a single Gaussian beam along the X-axis 1301. The height of the Gaussian beam 1304 has been adjusted to give ~40 nm FWHM at the beam current density 3000 A/cm$^2$ (dose=5 µC/cm$^2$, assuming 1.67 ns dwell time) as indicated by intersections 1305 with the square beam current distribution curve 1303 which is calculated by averaging the current density along the Y-axis between the lines 1005 and 1006 in FIG. 10A. The square beam current density drops from 3000 A/cm$^2$ (at intersections 1305, ±20 nm from the beam center), to <1000 A/cm$^2$ only 5 nm farther out (at ±25 nm) from the beam center.

FIG. 14 shows a graph of the calculated beam current density 1402 at position A in FIG. 9 across three square beams, abutted with 40 nm center-to-center spacings along the X-axis 1401, compared with the current density resulting from three abutted Gaussian beams (all with 40 nm FWHM at 3000 A/cm$^2$ and 40 nm center-to-center spacings). The Gaussian beams are adjusted as in FIG. 13 to give intersections 1405 at the beam current density 3000 A/cm$^2$ (dose=5 µC/cm$^2$, assuming 1.67 ns dwell time). The tails of the three square beam curve 1403 drop off much faster away from the beam edges at −20 nm and +100 nm (=120 nm width=3×40 nm, where 40 nm=width of each square beam) than do the tails of the three Gaussian beam curve 1404. FIG. 14 shows that the steep drop-offs in current density at the edges of the square beams enable these beams to be abutted to produce larger-size features with essentially the same maximum current density as is found along the edges of single beams. This explains why it is possible to combine beam flashes to create larger patterns (such as pattern 1104 in FIG. 11), with minimal bulging due to the current tails of the individual beam flashes.

FIG. 15 shows a graph of the calculated beam current density 1502 at position A in FIG. 9 across three square beams, abutted with 40 nm center-to-center spacings along the X-axis 1501, showing both the individual square beam profiles 1503, 1504 and 1505 and the combined three-beam profile 1403 from FIG. 14. The relatively flat top of curve 1403 (ranging from 6045 A/cm$^2$ to 6667 A/cm$^2$) shows how the steep sides of each square beam profile 1503, 1504 and 1505 add (when offset by 40 nm center-to-center spacings) to give a net current density fluctuation less than ±5%.

Figure 16:
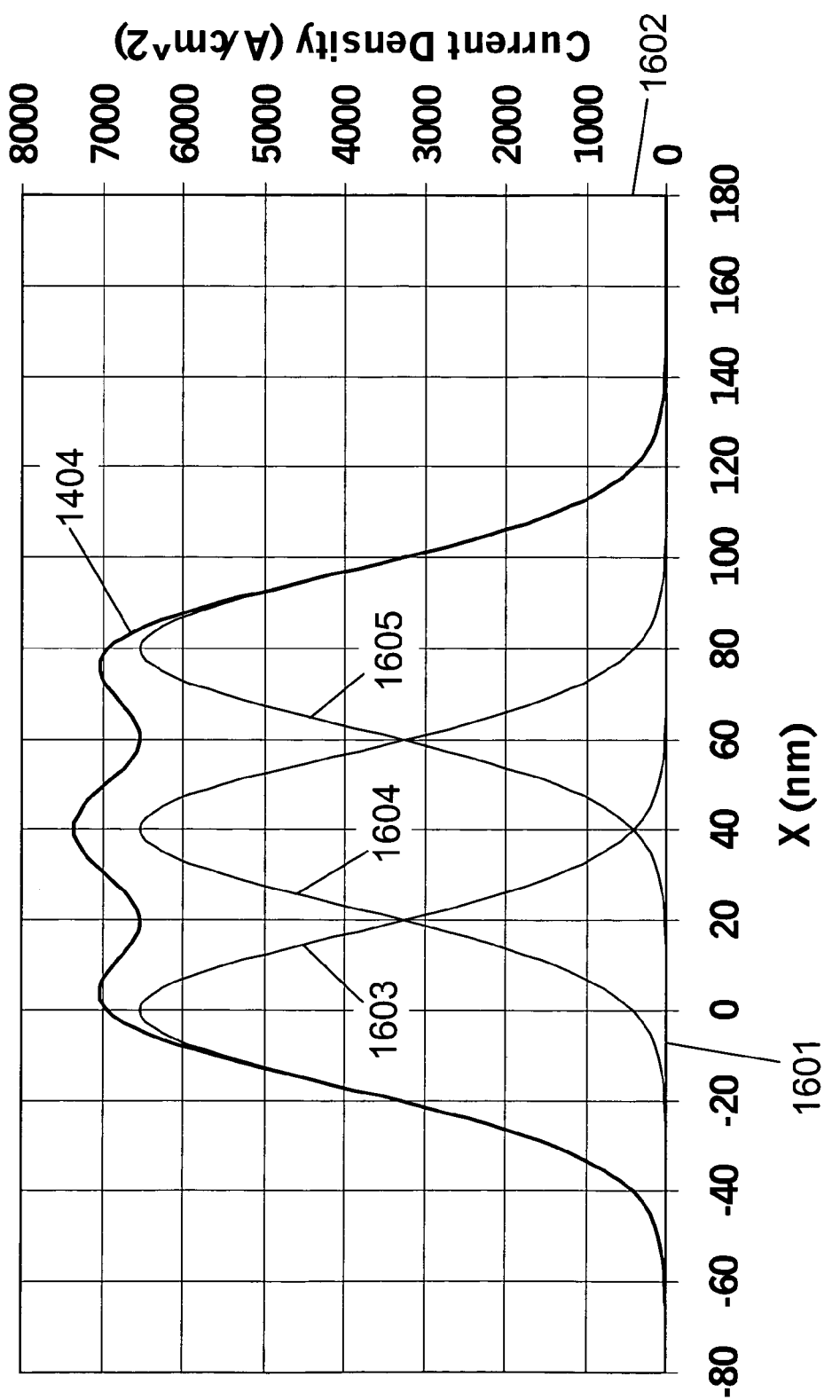
FIG. 16 shows a graph of calculated beam current density across three combined 40 nm FWHM Gaussian beams and three separate 40 nm FWHM Gaussian beams, with all beams spaced 40 nm apart.

FIG. 16 shows a graph of calculated beam current density 1602 across three combined Gaussian beams 1404 (from FIG. 14) and three separate Gaussian beams 1603, 1604 and 1605, with the beams spaced 40 nm center-to-center along the X-axis 1601 and with each separate Gaussian beam having a 40 nm FWHM at the exposure dose 3000 A/cm$^2$ (assuming 1.67 ns dwell time and 5 µC/cm$^2$ resist sensitivity). The long tails outside of the desired edges of the exposure area from −20 nm to +100 nm can be seen clearly. These long tails reduce the process latitude required in order to preserve the desired pattern critical dimension (CD).

Comparison of curve 1403 in FIG. 15, with curve 1404 in FIG. 16 shows that the combinations of three abutted square beams in FIGS. 15A-D generally demonstrate a more uniform current density across the exposed regions and also much sharper edges (faster drop-offs in current density) leading to greater process latitudes.

FIG. 17A shows a diagram of a possible beam-scanning method for use in setting up the optics to generate an optimized square beam profile. The desired square beam profile at location 1701 is over the center surface 1723 of a special mask structure which may be included on the wafer stage of the system or on a special set-up wafer installed into the system. Surface 1713 is configured to give a larger imaging signal when illuminated by the beam 222 compared with the imaging signal arising from the center surface 1723. This imaging contrast could be accomplished by connecting surface 1713 to an imaging system, and not connecting surface 1723 to the imaging system. While the beam 222 is at location 1701, the beam current flows into surface 1723 which is not connected to the imaging system. As the beam 222 is scanned in direction 1702 across edge 1710, an increasing portion of the beam current strikes the surface 1713 which is connected to the imaging system. To avoid charging effects, current flowing into both surfaces 1713 and 1723 must eventually flow to ground. At location 1703, half the beam current would be collected since the beam is half over the collector area 1713. Note that as the beam 222 is scanned in direction 1702, the square edges of the beam profile are parallel to the edge 1710, thus the signal goes from 0% to 100% over a distance equal to the dimension D 1720 of the beam parallel to the scan direction 1702.

As the beam 222 is scanned in direction 1704 across edge 1711, an increasing portion of the beam current strikes the surface 1713 and is therefore collected to give an imaging signal. At location 1705, half the beam current would be collected since the beam 222 is half over the collector area 1713. Note that as the beam 222 is scanned in direction 1704, the square edges of the beam profile are at 45° angles to the edge 1711, thus the signal goes from 0% to 100% over a distance equal to the diagonal dimension $\sqrt{2}$ D 1722 of the beam parallel to the scan direction 1704.

As the beam 222 is scanned in direction 1706, the result will be similar to that described above for scan direction 1702, assuming the beam profile is square with dimension D 1721 parallel to the scan direction 1706. At location 1707, half the beam current would be collected since the beam is half over the edge 1712 of area 1713.

An alternative method of generating image contrast would be to fabricate areas 1713 and 1723 from materials having differing secondary electron emission coefficients, thus enabling the use of the detector optics of FIG. 2A. Methods of imaging in electron beam systems are well known to those skilled in the art.

Figure 17B:
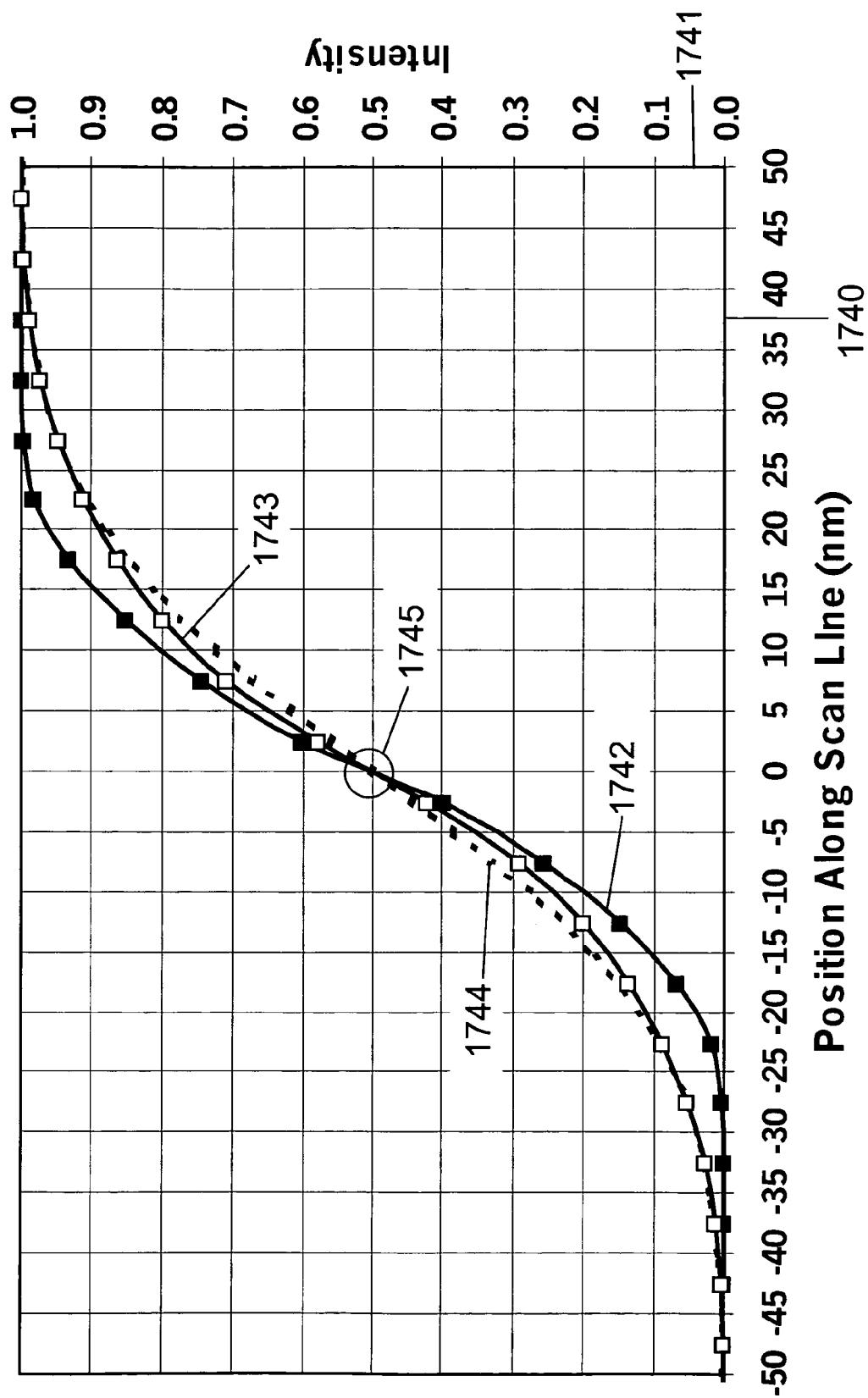
FIG. 17B shows calculated line scans for the various scan directions of FIG. 17A, illustrating a potential method for setting up an optimized 40 nm square beam profile.

FIG. 17B shows calculated line scans for scan directions 1702 and 1704 of FIG. 17A, illustrating a potential method for setting up an optimized square beam. The axis 1740 shown corresponds to position along any of the scan directions 1702, 1704 or 1706. The intensity axis 1741 is relative, from 0.0, corresponding to no imaging signal detected, up to 1.0, corresponding to the maximum imaging signal detected. Curve 1742 corresponds to either scan direction 1702 or 1706. The rise in intensity from 0.0 to 1.0 for curve 1742 is from −27.5 nm to +27.5 nm. The 45° curve 1743 corresponds to scan direction 1704. The rise from 0.0 to 1.0 for curve 1743 is from −42.5 nm to +42.5 nm, a much slower rise than for curve 1742. This difference in width of the intensity rise in the two curves 1742 and 1743 can be used to tune the optical column to generate the squarest beam profile possible. Center point 1745 corresponds to beams at locations 1703, 1705 or 1707.

For comparison, an intensity curve 1744 has been plotted for a single Gaussian beam with a 40 nm FWHM. Far from the beam center at 0 nm, this curve overlaps curve 1743. Near the beam center at 0 nm, this curve has an even slower rise than either of curves 1742 or 1743. The key difference is that the Gaussian curve will have the same shape for any scan direction 1702, 1704 or 1706, distinguishing a Gaussian beam from a square beam when the detector surface 1713 is used for imaging.

Figure 18:
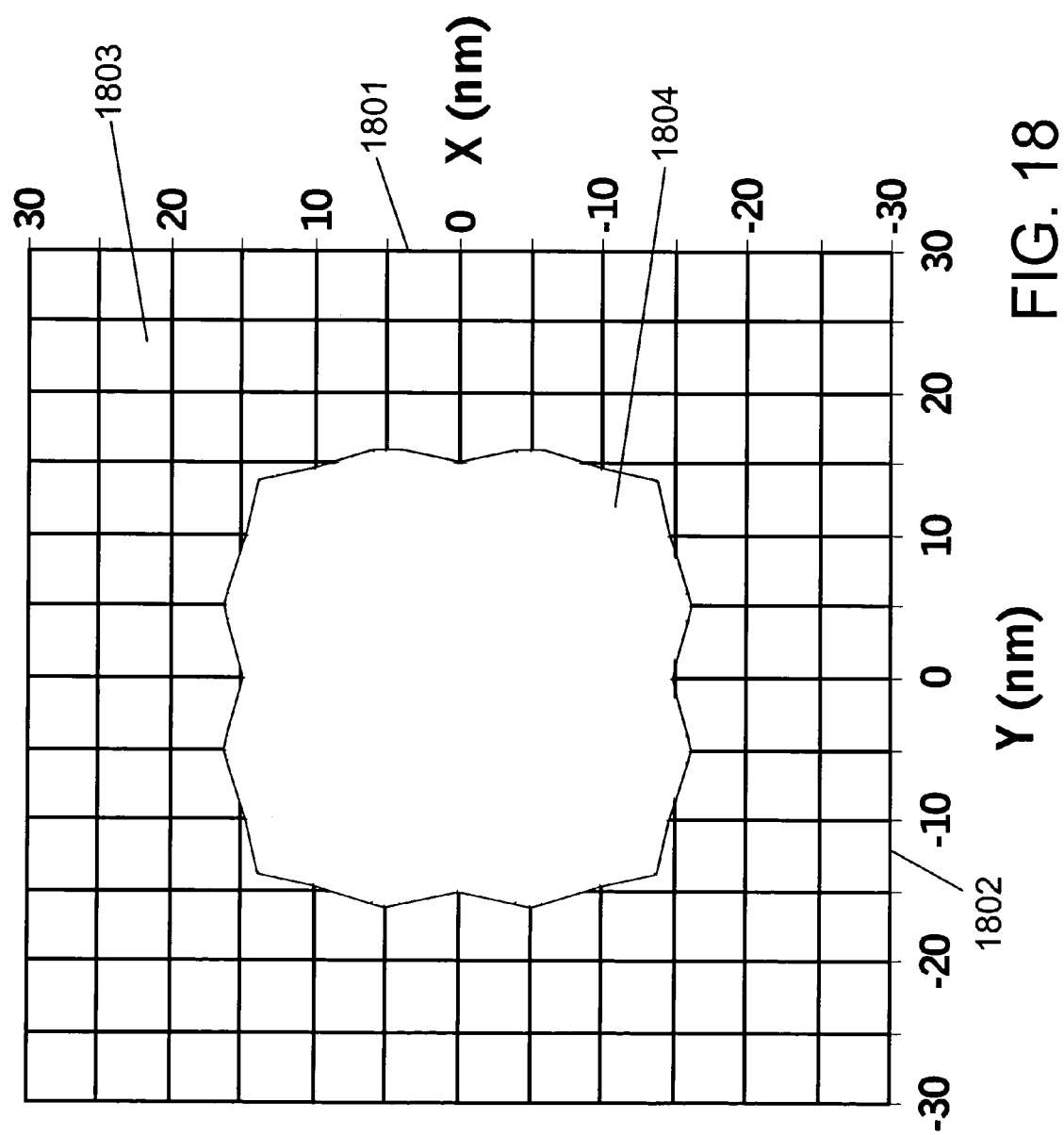
FIG. 18 shows a calculated exposure dose due to a single flash of a 30 nm square electron beam, when the beam is in position A of FIG. 9, using the patterned beam-defining aperture 212 of FIG. 8A.

FIG. 18 shows a calculated exposure dose at position A of FIG. 9 due to a single flash of a 30 nm square electron beam, using the patterned beam-defining aperture 212 of FIG. 8A. Coordinate axes on the substrate surface 221 are X 1801 and Y 1802. When lithographically patterning a variety of shapes on a substrate, it is useful to be able to generate a range of shaped beam sizes without the need for mechanical exchange of the patterned beam-defining aperture 212. By adjustment of the electron optics in the upper part of the column (typically by changing the common voltage on the first source lens electrode 203 and the beam-limiting aperture 204), the diameter of the circular beam 222 illuminating the beam-trimming aperture (BTA) 276 can be adjusted to vary the shaped beam size at the wafer surface 221 (see FIG. 3D). In the example shown in FIG. 18, the upper column optics has been adjusted to generate a 30 nm square beam 1804 (instead of the 40 nm square beam shown in FIG. 10A). Because in this configuration the overall optics cannot be fully optimized to give the highest current density beam (which would require a different BTA 276 and PBDA 212), the exposure beam current density has been reduced to 2000 A/cm², requiring a 2.50 ns dwell time for a 5 µC/cm² resist sensitivity. Area 1804, corresponding to current densities ≧2000 A/cm², is approximately a 30 nm square. In region 1803 the exposure dose is <5 µC/cm² thus the resist will not be fully exposed. The combined effects of the virtual source size, chromatic aberration (to all orders), and spherical aberration (to all orders) are fully taken into account in this calculation. FIG. 18 demonstrates that the optical system of FIG. 2A, which was optimized for generation of a 40 nm square beam, can also be used to generate a 30 nm square beam. The performance shown in FIG. 18 is adequate to enable the patterning of features down to 30 nm resolution with dwell times only slightly longer than for the optimized 40 nm case illustrated in FIGS. 10A-15.

Figure 19:
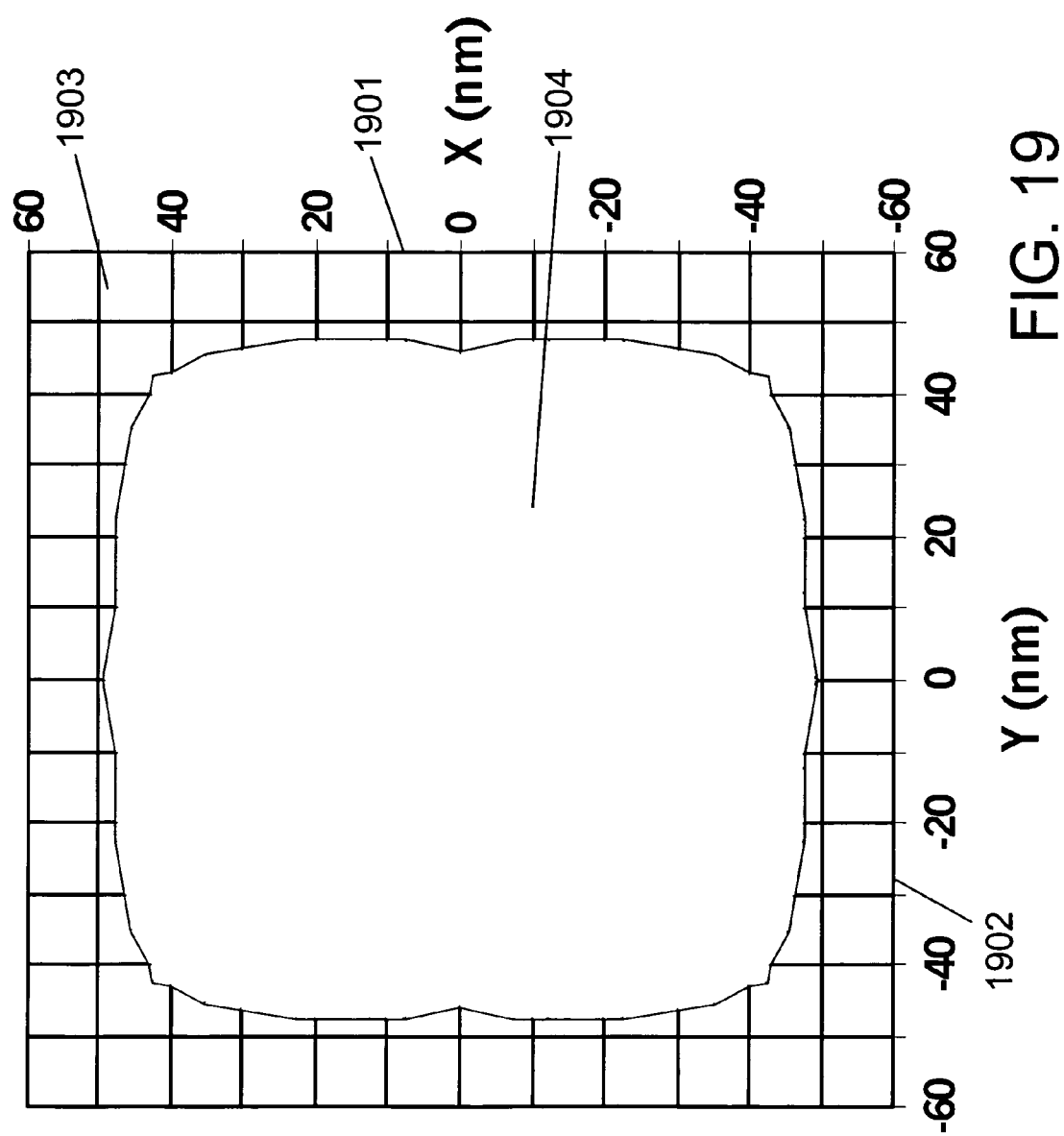
FIG. 19 shows a calculated exposure dose due to a single flash of an ~80 nm square electron beam, when the beam is in position A of FIG. 9, using the patterned beam-defining aperture 212 of FIG. 8A.

FIG. 19 shows a calculated exposure dose at position A of FIG. 9 due to a single flash of an ~80 nm square electron beam, using the patterned beam-defining aperture 212 of FIG. 8A. Coordinate axes on the substrate surface 221 are X 1901 and Y 1902. In this example, the electron optics in the upper part of the column have been adjusted in the opposite direction from that shown in FIG. 18 to give a square beam 1904 approximately twice as large (~80 nm) as in FIG. 10A. Because in this configuration the overall optics cannot be fully optimized to give the highest current density beam (which would require a different BTA 276 and PBDA 212), the exposure beam current density has been reduced to 2500 A/cm², requiring a 2.00 ns dwell time for a 5 µC/cm² resist sensitivity. Area 1904, corresponding to current densities ≧2500 A/cm², is ~80 nm square. In region 1903 the exposure dose is <5 µC/cm² thus the resist will not be fully exposed. The combined effects of the virtual source size, chromatic aberration (to all orders), and spherical aberration (to all orders) are fully taken into account in this calculation. FIG. 19 demonstrates that the optical system of FIG. 2A, which was optimized for generation of a 40 nm square beam, can also be used to generate an ~80 nm square beam. The performance shown in FIG. 19 is adequate to enable the patterning of features at 80 nm resolution with dwell times only slightly longer than for the optimized 40 nm case shown in FIGS. 10A-15.

Figure 20:
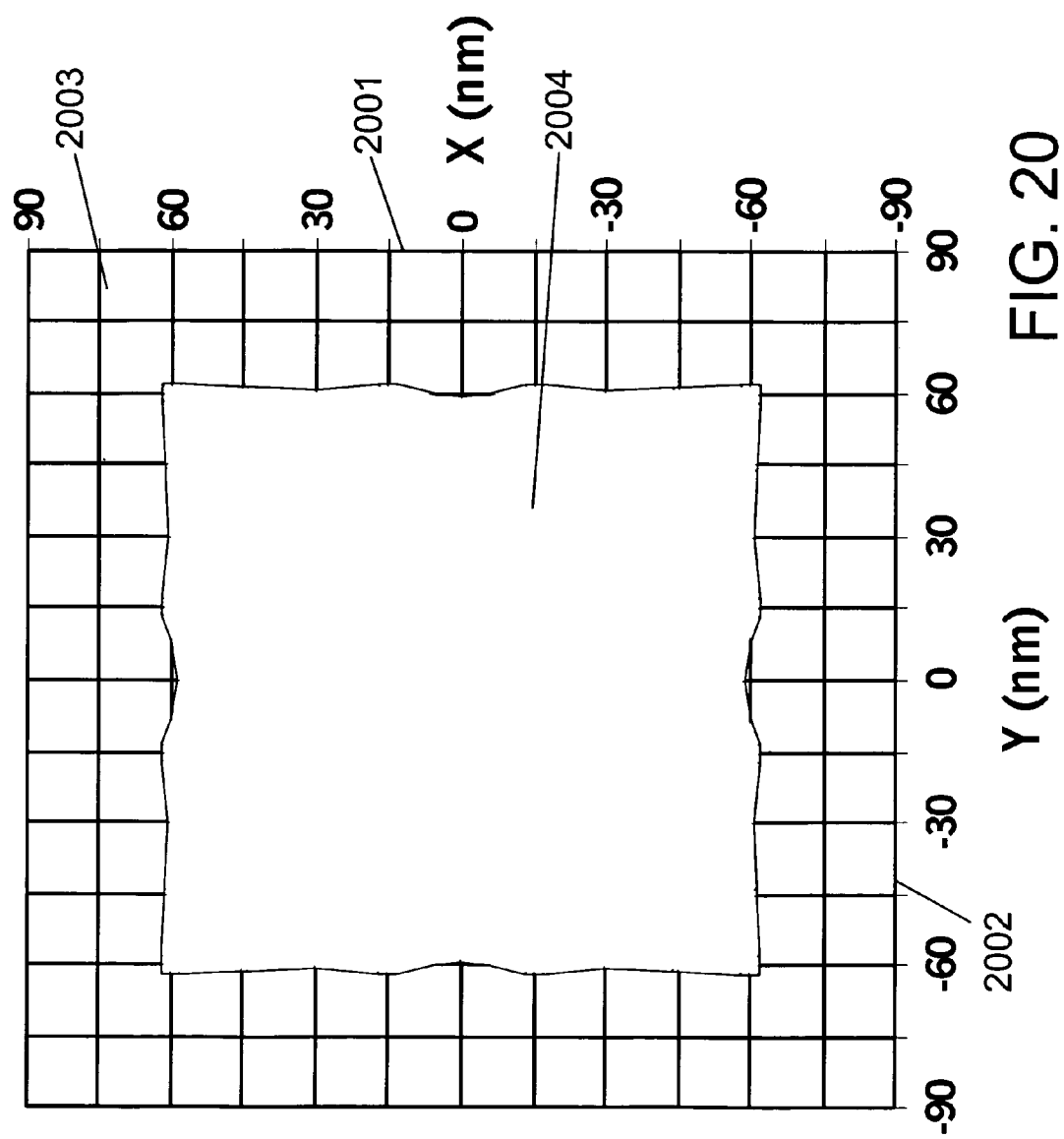
FIG. 20 shows a calculated exposure dose due to a single flash of a 120 nm square electron beam, when the beam is in position A of FIG. 9, using the patterned beam-defining aperture 212 of FIG. 8A.

FIG. 20 shows a calculated exposure dose at position A of FIG. 9 due to a single flash of a 120 nm square electron beam, using the patterned beam-defining aperture 212 of FIG. 8A. Coordinate axes on the substrate surface 221 are X 2001 and Y 2002. In this example, the electron optics in the upper part of the column have been adjusted farther in the same direction as that shown in FIG. 19 to give a beam 2004 three times as large (120 nm) as in FIG. 10A. Because in this configuration the overall optics cannot be fully optimized to give the highest current density beam (which would require a different BTA 276 and PBDA 212), the exposure beam current density has been reduced to 2000 A/cm², requiring a 2.50 ns dwell time for a 5 µC/cm² resist sensitivity. Area 2004, corresponding to current densities ≧2000 A/cm², is a 120 nm square. In region 2003 the exposure dose is <5 µC/cm² thus the resist will not be fully exposed. The combined effects of the virtual source size, chromatic aberration (to all orders), and spherical aberration (to all orders) are fully taken into account in this calculation. FIG. 20 demonstrates that the optical system of FIG. 2A, which was optimized for generation of a 40 nm square beam, can also be used to generate a 120 nm square beam. The performance shown in FIG. 20 is adequate to enable the patterning of features at 120 nm resolution with dwell times only slightly longer than for the optimized 40 nm case shown in FIGS. 10A-15. With a 120 nm square beam, it is possible to completely write a 2 µm square subfield with 256 flashes (on 125 nm center-to-center spacings)—this is necessary to fill in large areas to be written such as bonding pads.

Figure 21A:
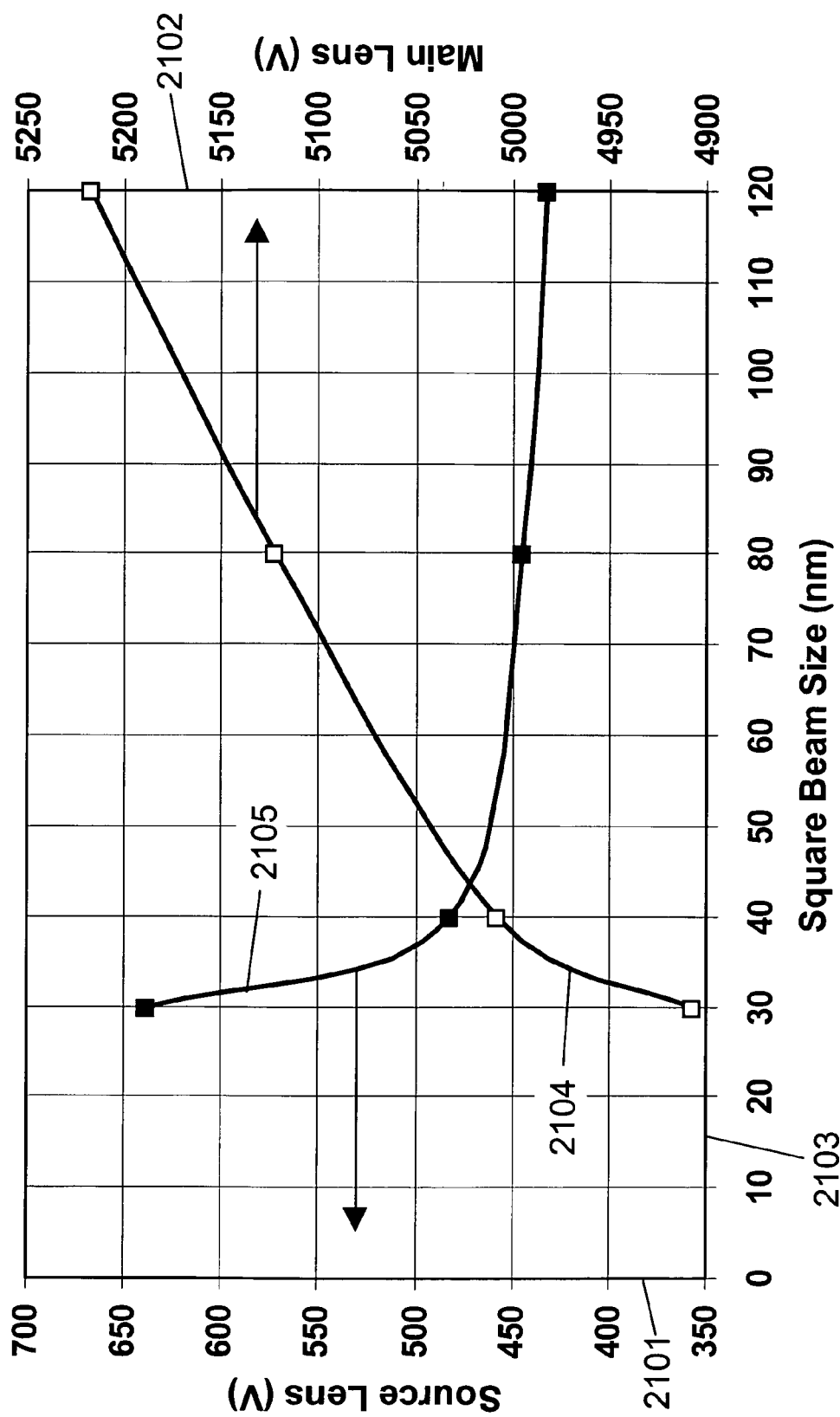
FIG. 21A is a graph of the source lens and main lens focusing voltages against the desired square beam size.

FIG. 21A is a graph of the source lens focusing voltage 2105 (left axis 2101) and main lens focusing voltage 2104 (right axis 2102) in the column of FIG. 2A against the square beam size 2103. The source lens voltage 2105 is applied to both the first lens electrode 203 and beam-limiting aperture 204. The main lens voltage 2104 is applied to focus-2 support electrode 240 and is also the common mode voltage for the octupole electrodes 241-248. FIG. 21A shows a number of values for the source lens voltage 2105 and the main lens voltage 2104 for various desired square beam sizes 2103, ranging from 30 nm to 120 nm. Curve 2105 is much lower than the energy of the incoming electrons from the source tip 201, which are typically at energies >2800 eV—this shows that the source lens is a decelerating electrostatic lens. Curve 2104 ranges from below to above the energy of the electrons entering the main lens which are at 5000 eV. The main focusing effect occurs between the focus-2 assembly 217, ranging from 4906.5 V to 5217.2 V and the field-free tube 218 which is at 49986 V for writing on the wafer 221 at 50000 eV.

Figure 21B:
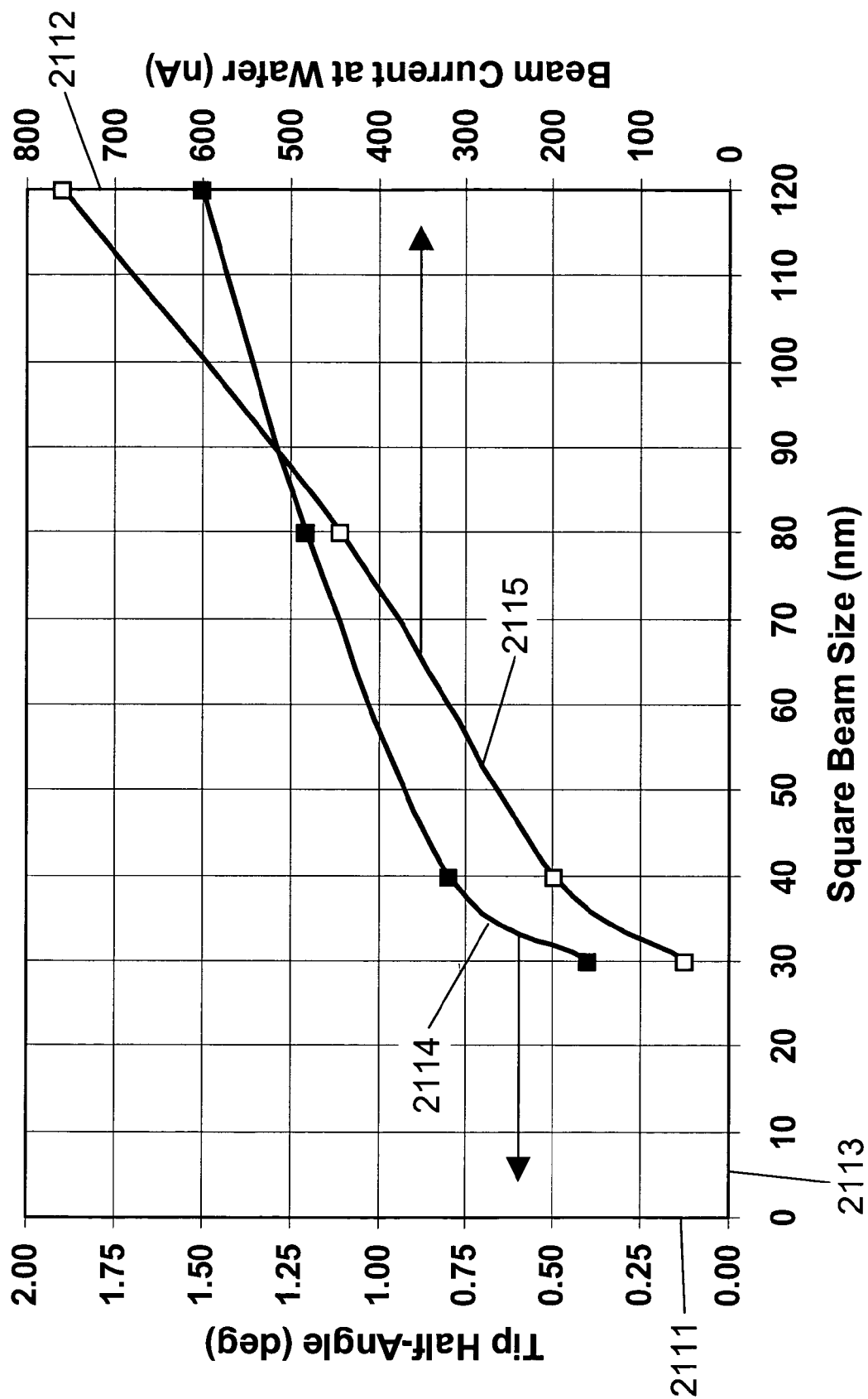
FIG. 21B is a graph of the tip half-angle and the beam current at the wafer against the desired square beam size.

FIG. 21B is a graph of the half-angle 2114 (left axis 2111) at the source tip 201 and the beam current 2115 (right axis 2112) at the wafer surface 221 against the square beam size 2113. The half-angle 2114 at the source tip 201 has the following relationship to the beam current 2115 at the wafer surface 221:

$I_s$=source angular intensity over the emission solid angle used to illuminate the patterned beam-defining aperture 212 (typically this angular intensity ranges from 100 µA/sr to >500 µA/sr). We assume $I_s$=500 µA/sr in the table below. The angular intensity is generally fairly constant within a few degrees half-angle of the optical axis.

α=the half-angle of the beam 222 at the source tip 201 (in degrees)

$I_{beam}$ = the beam current at the wafer surface 221

$= I_s [\pi(\alpha\pi/180°)^2]$

| Nominal Square Beam Size | Tip Half-Angle | Beam Current at Wafer | Current Density |
|---|---|---|---|
| 30 nm | 0.4° | 49.2 nA | 2000 A/cm² |
| 40 nm | 0.8° | 196.9 nA | 3000 A/cm² |
| 80 nm | 1.2° | 443.1 nA | 2500 A/cm² |
| 120 nm | 1.5° | 758.1 nA | 2000 A/cm² |

The optics design in block 106 of FIG. 1 was optimized to generate a 40 nm square beam with the highest current density possible. This means that the optics are not optimized for the other beam sizes (30 nm, 80 nm, and 120 nm) in the table and shown in FIGS. 21A-21D. This is the reason for the drop-off in current density seen in the table for beams both smaller and larger than 40 nm (see curve 2125 in FIG. 21C). It is possible to optimize the optics design in block 106 of FIG. 1 for beams either larger or smaller than 40 nm—in particular, for tool extendibility to future device generations, the optimization could be done for 30 nm or even smaller. In this case, the performance for larger beams would likely be reduced, but probably not by a large amount.

Figure 21C:
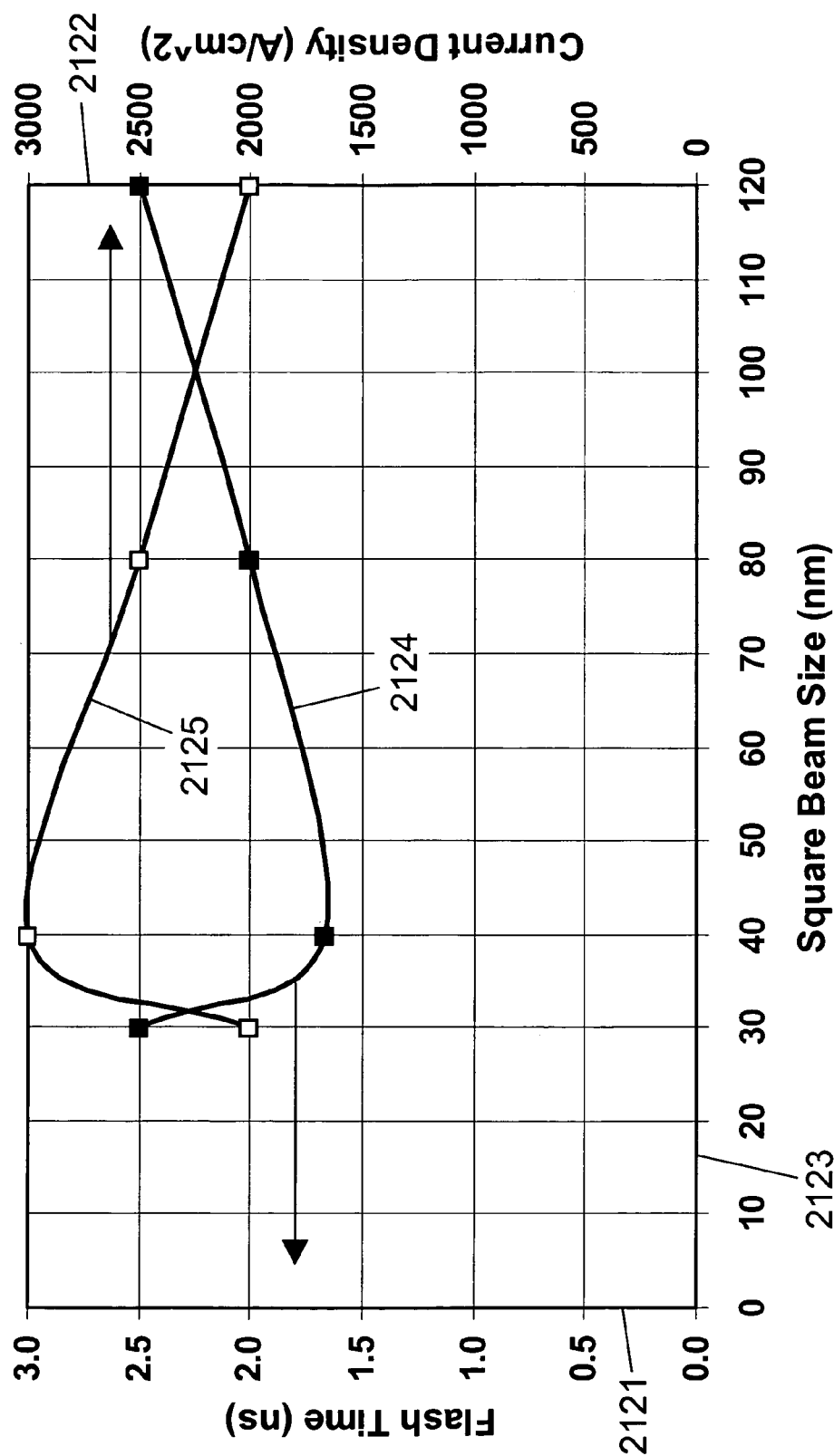
FIG. 21C is a graph of the beam flash time and the assumed exposure current density (assuming a 5 µC/cm² resist sensitivity) at the wafer against the desired square beam size.

FIG. 21C is a graph of the flash time 2124 (left axis 2121) and the current density 2125 (right axis 2122) at the wafer surface 221 (assuming a 5 µC/cm² resist sensitivity) against the square beam size 2123. The flash time and the current density have an inverse relationship:

(current density)=(5 µC/cm²)/(flash time)

Thus as the current density 2125 increases, the flash time 2124 decreases inversely. Again, since the optics design was optimized for a 40 nm beam, the performance at all other beam sizes, both smaller and larger than 40 nm, is not as good in terms of flash time 2124 (shortest flash times are best). The deterioration from 40 nm down to 30 nm is most striking, indicating that an optics design optimized for 30 nm might perform fairly well at 40 nm and above (although not as well as shown in FIG. 21C). As would be expected, the closer the beam size is to the optimal size, the better the performance in terms of flash time.

Figure 21D:
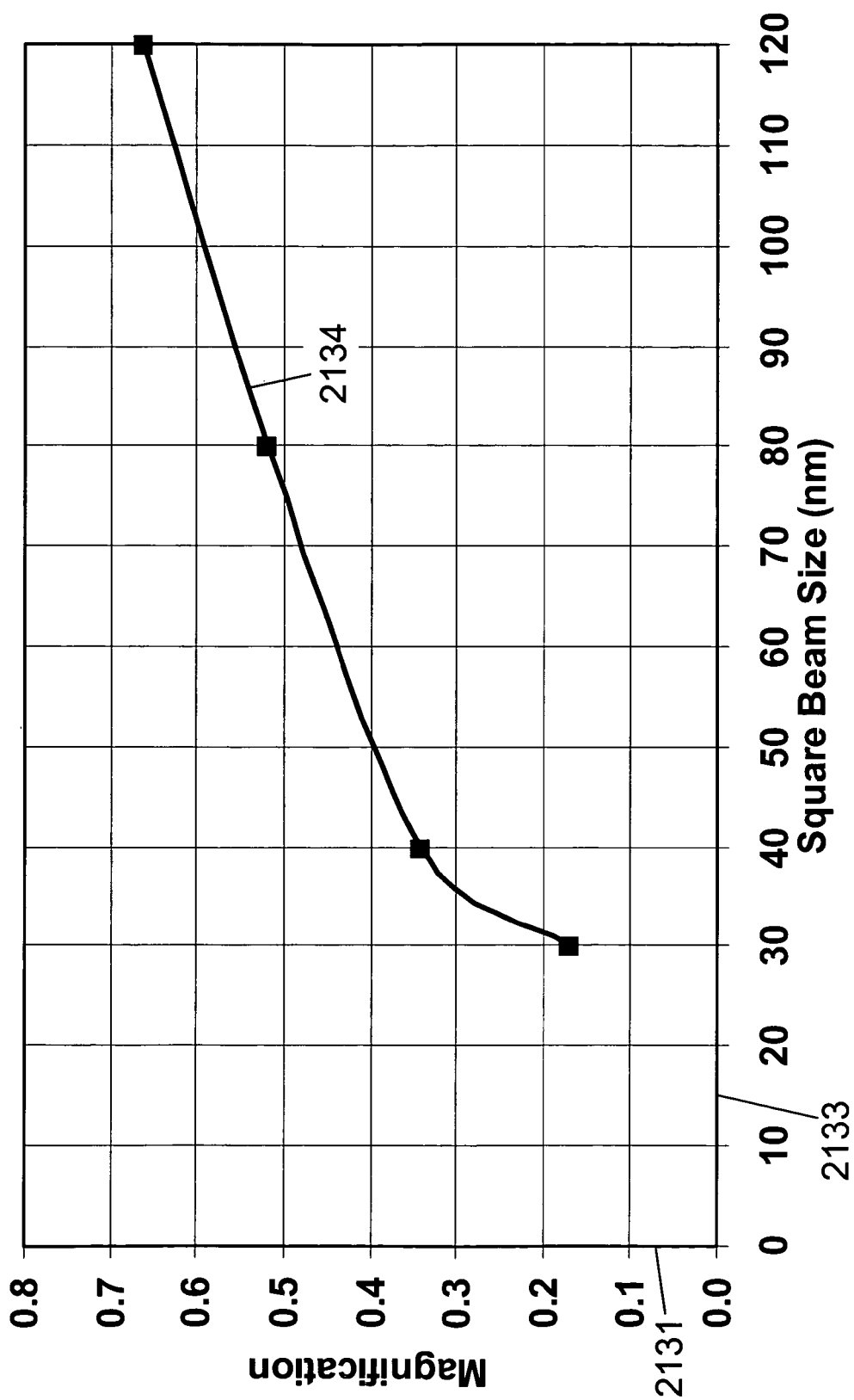
FIG. 21D is a graph of the magnification of the virtual source at the wafer surface against the desired square beam size.

FIG. 21D is a graph of the magnification 2134 (left axis 2131) of the virtual source at the wafer surface 221 against the square beam size 2133. The magnification 2134 determines how much rounding of the corners of the square beam occurs due to the image of the virtual source—the lower the magnification 2134, the sharper the corners. For a Schottky electron source, the virtual source radius is 10 nm, so a magnification of 0.17× corresponds to (0.17)(10 nm)=1.7 nm radius of the square beam corners at the wafer surface 221 due to the virtual source. Chromatic and geometric aberrations add additional rounding.

Figure 22:
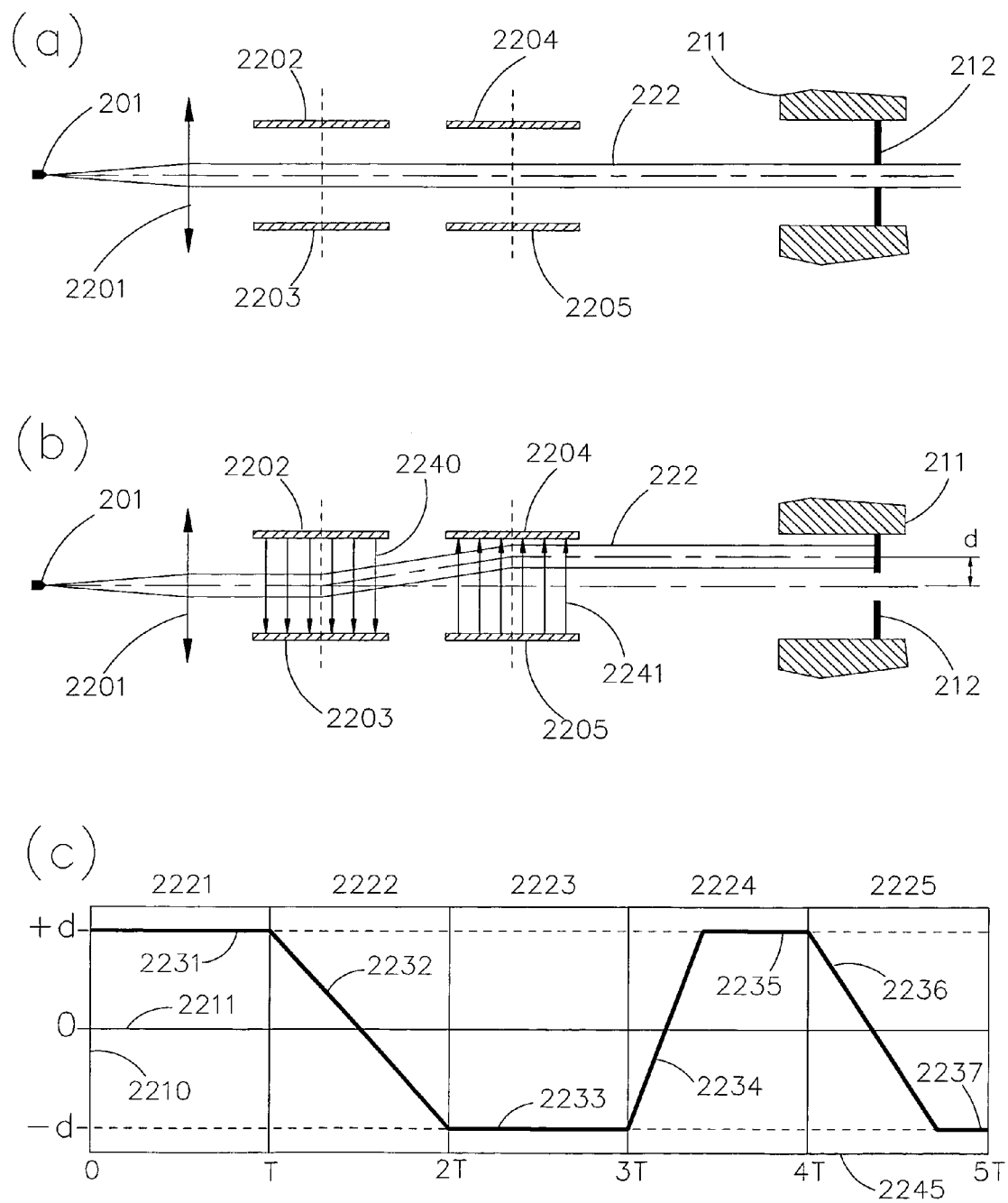
FIG. 22 is a diagram of a beam-blanking strategy, which can be used to vary the exposure dose on a subfield basis in order to implement proximity effect correction.

FIG. 22 is a diagram of a beam-blanking strategy which can be used to vary the exposure dose on a subfield-by-subfield basis in order to implement proximity effect correction. For simplicity, in FIG. 22 the upper blanker is shown as two planar electrodes 2202 and 2203, one on each side of the beam 222. Similarly, the lower blanker is shown as two planar electrodes 2204 and 2205, one on each side of the beam 222. Electrons emitted from the source tip 201 are focused by the source lens 2201 to an approximately parallel beam 222 which illuminates the beam-defining aperture (BDA) 212, supported by BDA mount 211.

View (a) shows an unblanked beam 222 passing through the beam-defining aperture 212 and into the lower part of the optical column, where it is focused onto the wafer surface 221 by the main lens assembly. In this case, the blanker plates 2202, 2203, 2204 and 2205 are at the same voltage (typically 5000 V) and thus do not induce transverse electric fields. With no transverse electric fields, no deflection of the beam 222 occurs at the blanker.

View (b) shows the beam being blanked. The voltage on electrode 2202 has been changed by +1.7 V and the voltage on electrode 2203 has been changed by −1.7 V—this creates a transverse electric field 2240 which deflects beam 222 upward as it passes through the upper blanker. Similarly, the voltage on electrode 2204 is changed by −1.54 V and the voltage on electrode 2205 has been changed by +1.54 V, creating a transverse electric field 2241 in the opposite direction from that in the upper blanker, which deflects the beam downwards as it passes through the lower blanker. The net result of the two deflections is that the beam 222 reaches the plane of the patterned beam-defining aperture (PBDA) 212 off-axis and does not pass through the opening. With proper adjustment of the voltages on the upper and lower blankers, the virtual source position remains on-axis, giving conjugate blanking.

View (c) is a timing diagram showing a possible method for controlling the exposure dose at the wafer surface 221 as part of a method for proximity effect correction. The center of beam 222 has three possible positions at the PBDA 212: +d, 0 (unblanked), and −d. The beam may dynamically have intermediate positions between −d and +d as it sweeps across the PBDA 212. Five intervals 2221-2225 are shown, each a period T long, for a total of 5T as shown along the time axis 2245. Displacement at the PBDA 212 is plotted on the axis 2210. According to the requirements of proximity effect correction (PEC), it may be necessary to vary the dose for different subfields, as illustrated in intervals 2222, 2224 and 2225.

(1) In the first interval 2221, the beam is blanked by being held at a distance +d 2231 off-axis as shown in view (b).
(2) The second interval 2222 illustrates a high dose blanking signal for which the beam 222 is linearly ramped 2232 across the PBDA 212. Because ramp 2232 takes the full interval period T, it represents the maximum exposure dose possible, corresponding to writing in sparsely-patterned areas with essentially no proximity effect correction needed.
(3) The third interval 2223, shows the alternative blanking position to interval 2221. In interval 2223, the beam is held at a distance −d 2233, corresponding to the mirror-image (around the optical axis) of view (b).
(4) The fourth interval 2224 shows a very low dose blanking signal, where the beam 222 is quickly ramped 2234 across the beam-defining aperture 212 from −d to +d then kept at the +d 2235 position (blanked) during the remainder of the interval period T. This corresponds to writing in densely-patterned areas with a large proximity effect correction.
(5) The last interval 2225 shows an intermediate situation between intervals 2222 and 2224, where the beam is ramped 2236 for most of the interval 2225 from +d to −d, and then held at −d 2237 for the remainder of the interval period T. This corresponds to writing in an area with a lower pattern density than in interval 2224, but higher than in interval 2222.

A possible advantage of this blanking approach may be ease of implementation electronically, since it can be very difficult to generate ns blanking pulses with sub-ns precision in the pulse length. In this proposed approach, only the ramp rate need be controlled, with lower blanking bandwidth required since there are no short rise and fall requirements on the voltages applied to the blanker plates 2202, 2203, 2204 and 2205.

An alternative blanking scheme would be to employ the more conventional approach in which the beam is rapidly deflected from a first blanked position (for example, +d) onto the optical axis (thereby unblanking the beam 222). After the beam has remained centered on the PBDA 212 for the required exposure time, the beam would then be rapidly deflected to its second blanked position (for example, −d). The disadvantage of this approach is the need for higher-bandwidth blankers, since now the slew rate represents a possible error in the pixel exposure time. The advantage of going from the first blanked position and ending at the second blanked position is that every point of the PBDA 212 has the same total beam dwell time, thereby equalizing the dose across the shaped beam. For the next pixel to be exposed, the first blanked position would be −d and the second blanked position would be +d. Successive pixels would be exposed using alternating blanking positions, with the beam toggling back-and-forth across the PBDA 212 as shown in FIG. 22.

FIG. 23 is a cross-sectional close-up side view of the main lens illustrating the calculated set-up for the focus-1 and focus-2 octupole voltages. The beam 222 enters the main lens after exiting the subfield deflector/stigmator 215. The beam 222 at this point may have been already deflected off-axis by up to ±20 μm—to avoid off-axis geometrical aberrations (coma, astigmatism, curvature of field, distortion) and off-axis chromatic aberration (variation in magnification), it is necessary to move the electrostatic fields generated by the focus-1 assembly 216 and the focus-2 assembly 217 off-axis also by ±20 μm. In the prior art, various complex schemes are utilized to achieve a "moving objective lens" or a "variable axis lens", employing the higher-order derivatives of the on-axis electrostatic and/or magnetic lens fields to control the application of dipole, quadrupole, hexapole, octupole and higher-order fields to the on-axis lens fields to offset the effective lens axis to match the beam deflection. If larger off-axis deflections of the shaped beam are required, it might be necessary to incorporate a more complex moving lens scheme utilizing some or all of these additional optical elements. In the present invention, a much simpler approach is proposed, wherein pure dipole fields are added to the focus-1 216 and focus-2 217 fields.

The focus-1 assembly 216 comprises the support electrode 230 and the octupole electrodes 231-238 (in the cross-sectional view in FIG. 23, only electrodes 232 and 237 are visible). In the discussion of FIGS. 3K-3L, the various voltages employed to offset the electrostatic field to match the beam deflection are discussed. FIG. 23 shows the resulting electrostatic equipotential lines. Lines 2301 bulge into the area between the subfield deflector/stigmator 215 and focus-1 assembly 216, while lines 2310 bulge out into the area between the focus-1 assembly 216 and focus-2 assembly 217. The shape of lines 2301 and 2310 is determined by the voltages on the subfield deflector/stigmator 215, support electrode 230, and the eight focus-1 octupole electrodes 231-238. The voltages on the focus-2 assembly 217 have a minor effect on lines 2301 but an important effect on lines 2310. The inner diameter (ID) of the eight octupole electrodes 231-238 is smaller than the ID of the support electrode 230 so that electrodes 231-238 will have the dominant effect on the position and shape of equipotential lines 2301 and 2310. By adding a small (<3 V) electrostatic dipole component to the octupole electrodes 231-238, on top of their 5000 V common-mode voltage (see table in FIG. 3K description), it is possible to move the lines 2301 and 2310 off-axis by ±20 μm to match the beam deflection arising from the mainfield deflectors 213 and 214. The beam position radially off-axis is determined theoretically at location 2305 and the voltages on electrodes 231-238 are then adjusted to eliminate any deflection of the beam 222 when passing through the focus-1 assembly 216. Lack of beam deflection is taken as an indication that the lines 2301 have been properly offset, matching the beam 222 offset.

The beam 222 enters the focus-2 assembly 217 after exiting the focus-1 assembly 216. The beam 222 at this point should be undeflected by the focus-1 assembly 216 (if the setup procedure above has been done properly), so beam 222 may be deflected off-axis by up to ±90 μm. The focus-2 assembly 217 comprises the support electrode 240 and eight focus-2 octupole electrodes 241-248 (in the cross-sectional view in FIG. 23, only electrodes 242 and 247 are visible). In FIG. 3L, the various voltages employed to offset the electrostatic field to match the beam deflection are discussed. FIG. 23 shows the resulting electrostatic equipotential lines. Lines 2303 and 2310 bulge into the area between the focus-1 assembly 216 and focus-2 assembly 217. The shape of lines 2303 and 2310 is determined by the voltages on the eight focus-1 octupole electrodes 231-238, support electrode 240, and the eight focus-2 octupole electrodes 241-248. The voltage on the field-free tube 218 has a minor effect on the spacing of lines 2303 and line 2302. The ID of the eight focus-2 octupole electrodes 241-248 is much smaller than the ID of support electrode 240 so that electrodes 241-248 will have the dominant effect on the position and shape of lines 2303 and 2310. By adding an electrostatic dipole component (~100 V) to electrodes 241-238, on top of their ~4900-5200 V common-mode voltage (see table in FIG. 3L description), it is possible to move the lines 2303 and 2310 off-axis to match the beam deflection arising from the mainfield deflectors 213 and 214. The beam position radially off-axis is determined theoretically at location 2306 and the voltages on electrodes 241-248 are then adjusted to eliminate almost all deflection of the beam 222 when passing through the focus-2 assembly 217. Lack of beam deflection is taken as an indication that the lines 2303 and 2310 have been properly offset, matching the beam 222 offset.

The above procedure for setting the voltages on the focus-1 octupole 231-238 and the focus-2 octupole 241-248 have been theoretically determined. In practice, at least two iterations between the focus-1 216 setup and the focus-2 217 setup are usually required before the deflections at locations 2305 and 2306 are both eliminated. In the electron optical modeling, the dipole voltages on octupoles 231-238 and 241-248 vary linearly with the beam offset, and the sensitivity of the final result on the beam shape at the wafer 221 is not excessive. Because of this, the voltages obtained through the theoretical modeling (tables in FIGS. 3K and 3L descriptions), combined with the line-scan procedures described in FIGS. 17A-17B should be adequate to implement this proposed lens offsetting scheme.

Figure 24:
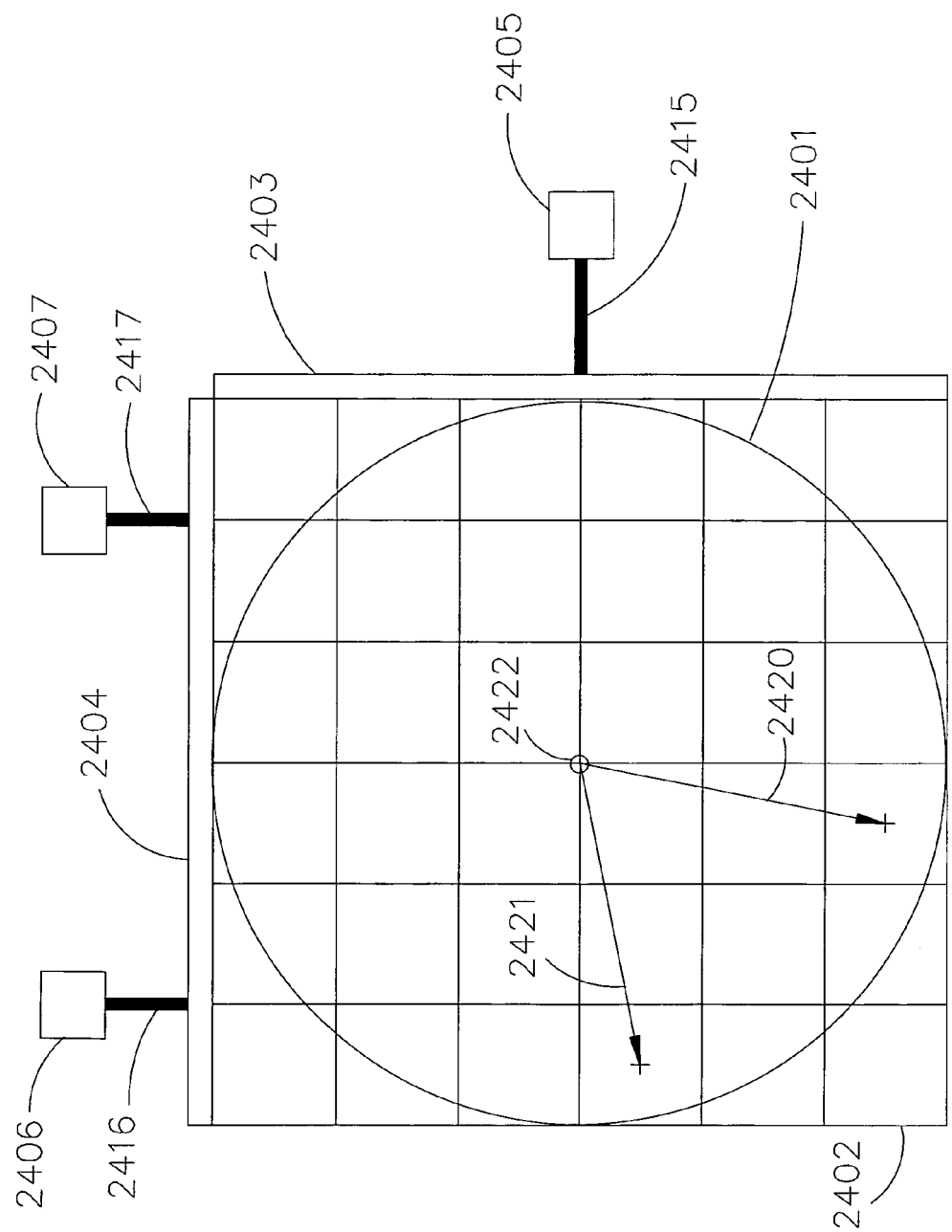
FIG. 24 is a diagrammatic illustration of one embodiment of the wafer stage and position sensors.

FIG. 24 is a diagrammatic illustration of one embodiment of the wafer stage and position sensors. In a lithography system, the substrate, shown as a 300 mm wafer 2401 here, is typically mounted on a precision stage 2402, capable of X-Y motion, and sometimes additional axes of motion such as yaw (rotation around the Z-axis, which is perpendicular to the wafer), Z-motion, and roll and pitch (rotation around two perpendicular axes X and Y in the plane of the wafer). Here we are concerned with just motion in the first three axes: X, Y and Yaw. Y-interferometer #1 2406 and Y-interferometer #2 2407 direct their respective laser beams 2416 and 2417 at stage mirror 2404. It is important that the wafer 2401 be tightly clamped to the stage 2402 and also that the mirror 2404 be extremely flat and rigidly mounted to the stage 2402, because any relative motion between the wafer 2401 and the mirror 2404 will adversely impact the positioning accuracy of the beam 222 in the Y-direction and around the Yaw axis at the wafer surface 221. The X-interferometer 2405 directs its laser beam 2415 at stage mirror 2403, which must be extremely flat and rigidly mounted to the stage 2402 to avoid beam positioning errors in the X-direction. The X- and Y-axes of stage 2402 travel are defined by the relative positioning of mirrors 2403 and 2404—if these mirrors are not perpendicular to each other, then the X and Y axes will not be, either. The following formulas are used to calculate the X, Y and Yaw positions of the wafer 2401 relative to the center 2422 of the stage 2402:

Y=[(Y-interferometer #1 2406 data)+(Y-interferometer #2 2407 data)]/2*$K_1$

X=(X-interferometer 2405 data)*$K_2$

Yaw=[(Y-interferometer #1 2406 data)−(Y-interferometer #2 2407 data)]/2*$K_3$

Where $K_1$, $K_2$, and $K_3$ are scale factors.

Each column in the column array has a unique X-Y displacement vector, such as 2420 and 2421, from the stage center 2422. The position of each die on the wafer relative to a particular column is then calculated by combining the following data:

1) the (X, Y, Yaw) position of the stage from its (0, 0, 0) position
2) the (X, Y) displacement vector of the particular column from the stage (0, 0, 0) position
3) the (X, Y, Yaw) location of the wafer on the stage (measured by imaging several alignment marks on the wafer)

This scheme for wafer position measurement is familiar to those skilled in the art, with the only additional considerations stemming from the use of multiple columns. An example of one wafer stage which is appropriate for use with the multiple beam column assembly is described in U.S. Pat. No. 6,355,994, incorporated herein by reference. An example of a control system incorporating a scheme for wafer position measurement is described in U.S. patent application Ser. No. 10/059,048, incorporated herein by reference.

Figure 25:
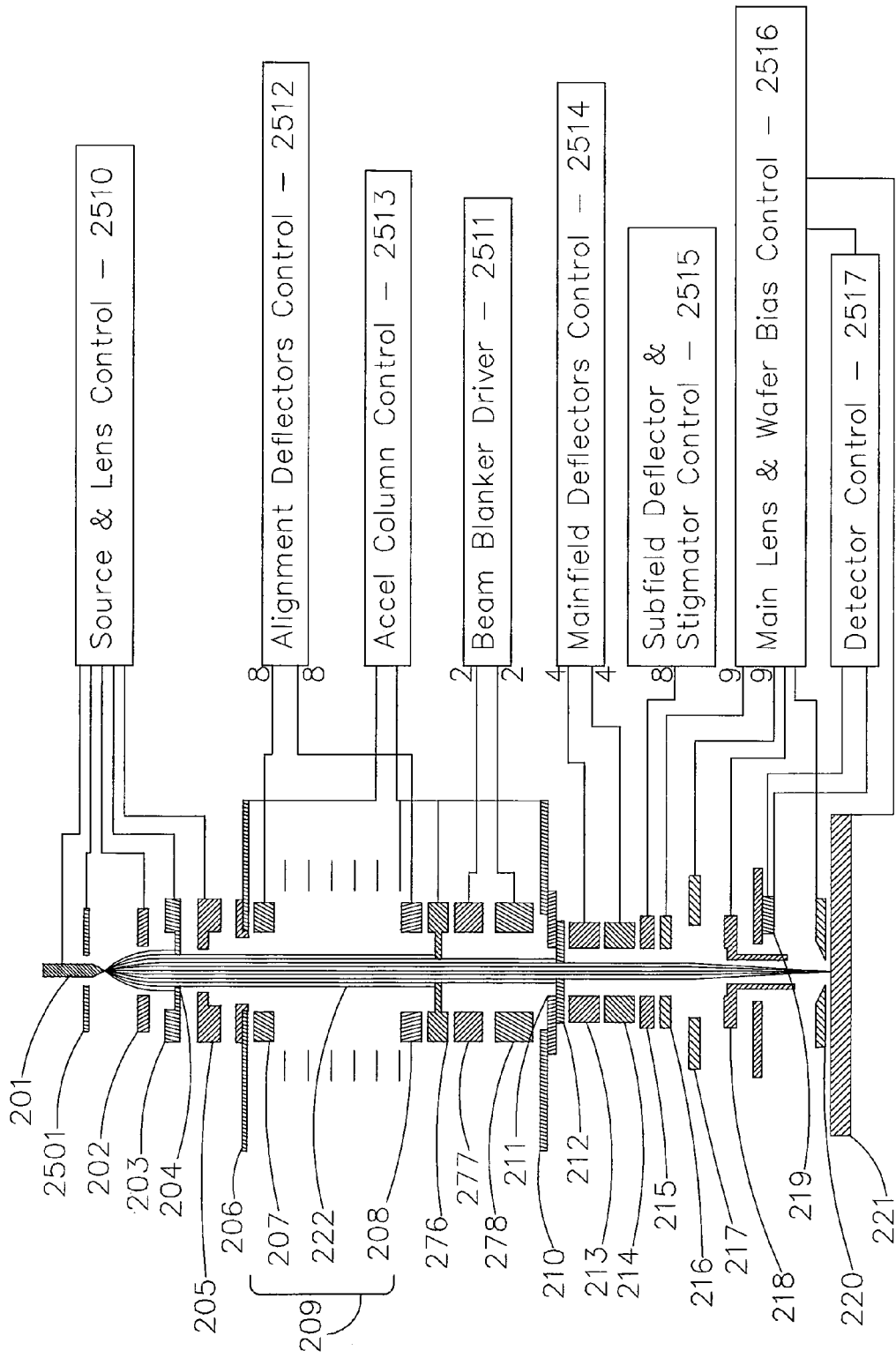
FIG. 25 is a schematic diagram of an embodiment of the optical column and its control electronics.

FIG. 25 is a schematic diagram of an embodiment of the optical column and its control electronics (compare with FIG. 2A). The source and lens control 2510 applies voltages to the electron source tip 201, source heater filament (not shown), suppressor electrode 2501, extraction electrode 202, first source lens electrode 203, beam-limiting aperture 204, and second source lens electrode 205. The alignment deflectors control 2512 applies voltages to the eight electrodes 260-267 in the upper alignment deflector/stigmator 207 and to the eight electrodes 268-275 in the lower alignment deflector 208. The accel column control 2513 supplies voltages to all of the electrodes in the accelerating assembly 209, beam-trimming aperture 276, and to the optics mounting plate 210. The beam blanker driver 2511 applies voltages to the electrodes 280-282 in the upper blanker 277 and to the electrodes 283-285 in the lower blanker 278. The mainfield deflectors control 2514 applies four voltages to the electrodes 4001, 4009, 4012, and 4020 in the upper mainfield deflector 213 and the same four voltages (connected with the opposite polarity—see FIGS. 3H and 3I) to the electrodes 4101, 4109, 4112, and 4120 in the lower mainfield deflector 214. The subfield deflector and stigmator control 2515 supplies voltages to the eight electrodes 223-230 of the subfield deflector/stigmator 215. The main lens and wafer bias control 2516 supplies voltages to the nine electrodes 230-238 of the focus1 electrode assembly 216, to the nine electrodes 240-248 of the focus2 electrode assembly 217, to the field-free tube 218, to the voltage contrast plate 220, and to the wafer 221. The main lens and wafer bias control 2516 also supplies the common-mode voltage to the detector control 2517. The detector control 2517 supplies bias voltages to the detector assembly 219.

For a multi-column assembly, only one Accel Column Control 2513 may be required, if all of the multiple beams pass through the same accelerating column. In some embodiments, it might be possible to utilize a single Mainfield Deflectors Control 2514. The other column controls 2510-2512 and 2515-2517 would generally apply to one column only.

Figure 26:
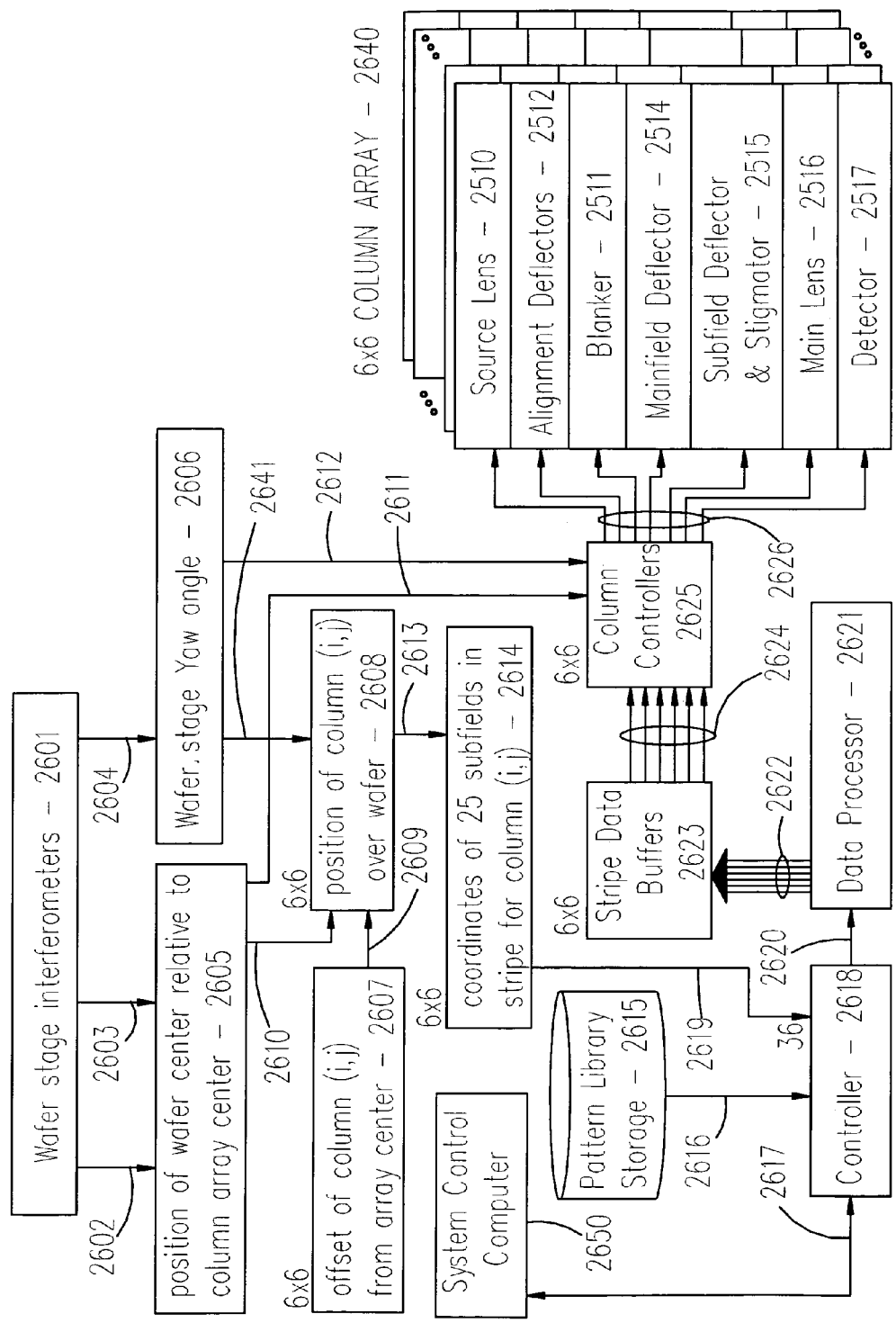
FIG. 26 is a schematic diagram of one embodiment of the data path and system control electronics.

FIG. 26 is a schematic diagram of one embodiment of the data path and system control electronics. Datablock 2601 supplies X, Y1 and Y2 data from the three interferometers 2405, 2406, and 2407, respectively (see FIG. 24), to the data path and system control electronics along three high-speed data links, X 2602, (Y1+Y2)/2 2603, and (Y1−Y2)/2 2604. Datalinks X 2602 and (Y1+Y2)/2 2603 connect to block 2605, which determines the (X,Y) position of the center 2422 of the wafer stage 2402 relative to the (X, Y) position of the column array center. Datalink (Y1−Y2)/2 2604 connects to block 2606 which determines the yaw angle of the wafer stage 2402 relative to the column array 2640. Block 2607 contains the (X, Y) coordinates of each of the columns (i, j) in the column array 2640, which have been previously determined empirically—this (X,Y) coordinate data is supplied by datalink 2609 to block 2608, which combines data supplied by datalinks 2609, 2610, and 2641 to determine the (X, Y) position of each column (i, j) relative to the wafer 2401. Block 2614 uses the data from block 2608 to determine the (X, Y) coordinates of the subfields to be written by each column (i, j). Block 2618 receives the (X,Y) subfield coordinates generated by block 2614 through datalink 2619. Given the (X, Y) subfield coordinates, then block 2618 receives the subfield pattern data through datalink 2616 from the pattern library storage 2615 where (50 μm stripe width)/(2 μm subfield width)= 25 subfield pattern datasets are required for each column. In the embodiment shown, there are 6×6=36 columns, so the total number of datasets downloaded through datalink 2616 to block 2618 is 25×36=900 subfield datasets. Block 2618 is connected to the system control computer 2650 through datalink 2617. Subfield pattern data from block 2618 is sent to the Data Processor 2621 through datalink 2620. From the Data Processor 2621, subfield pattern data is fed in 36 parallel datalinks 2622 to the Stripe Data Buffers 2623 (one per column), which buffer this data in preparation for writing. Column controllers 2625 (one per column) receive this data through 36 datalinks 2624. along with data from block 2605 (datalink 2611 ) and block 2606 (datalink 2612 ). The 36 column controllers 2625 supply the subfield data through datalinks 2626 to the various column power supplies as shown in FIG. 26: the Source Lens Control 2510, the Alignment Deflectors Control 2512, the Beam Blanker Driver 2511, the Mainfield Deflectors Control 2514, the Subfield Deflector and Stigmator Control 2515, the Main Lens and Wafer Bias Control 2516, and the Detector Control 2517.

Figure 27A:
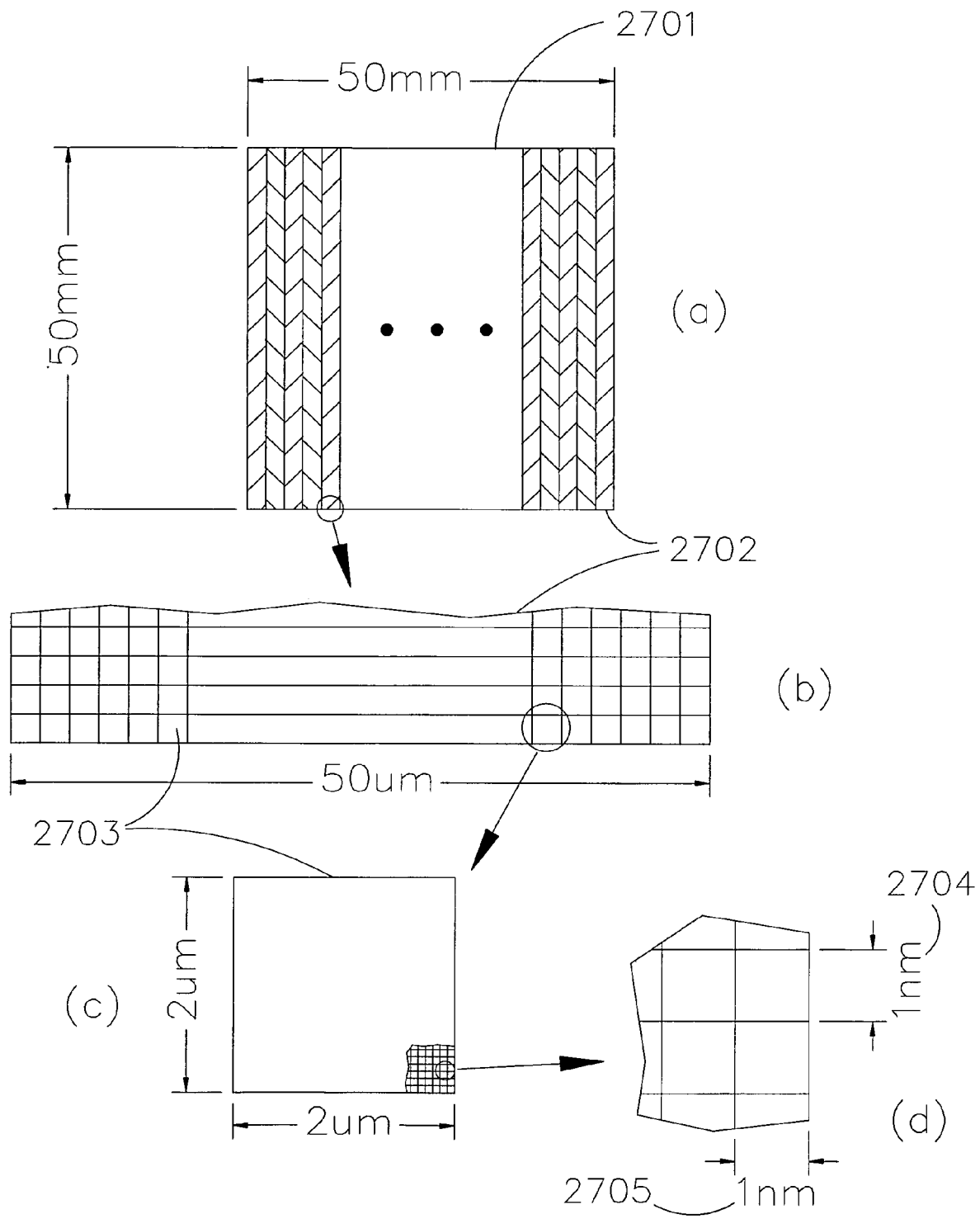
FIG. 27A is a diagram showing how the column writing area can be broken down into 50 µm-wide stripes, each of which is subsequently subdivided into 2 µm-square subfields having a 1 nm X-Y address grid.

FIG. 27A (a) shows how (for the example of a 300 mm wafer and a 6×6 column array) the 50 mm×50 mm column writing area 2701 can be broken down into 50 μm-wide stripes 2702. The number of writing stripes 2702 in area 2701 is:

$$\text{Number of stripes} = (\text{column spacing})/(\text{stripe width})$$
$$= (50 \text{ mm})/(50 \ \mu\text{m})$$
$$= 1000 \text{ writing stripes}$$

View (b) shows the end of a typical writing stripe 2702, where the individual 2 μm square subfields 2703 are shown. The total number of subfields 2703 per scan is then:

$$\text{\# Subfields/scan} = (\text{stripe width})/(\text{subfield dimension})$$
$$= (50 \ \mu\text{m})/(2 \ \mu\text{m})$$
$$= 25 \text{ subfields}$$

A close-up of one subfield 2703 is shown in view (c), where the 1 nm X-Y address grid is expanded at the lower right corner. View (d) shows the 1 nm address grid 2704 and 2705. The number of steps in the address grid per subfield is then:

$$\text{\# Address Steps} = (\text{subfield dimension})/(\text{address grid})$$
$$= (2 \ \mu\text{m})/(1 \text{ nm})$$
$$= 2000 \cong 2^{11}$$

To address $\sim 2^{11}$ address grid steps in one axis requires the following number of address bits:

$$\text{\# Address Bits} = \log_2 (\text{\# address steps}) \cong 11 \text{ bits}$$

Since addressing is two-dimensional, a total of 22 address bits is sufficient to define the beam position anywhere within a given 2 μm square subfield 2703.

Figure 27B:
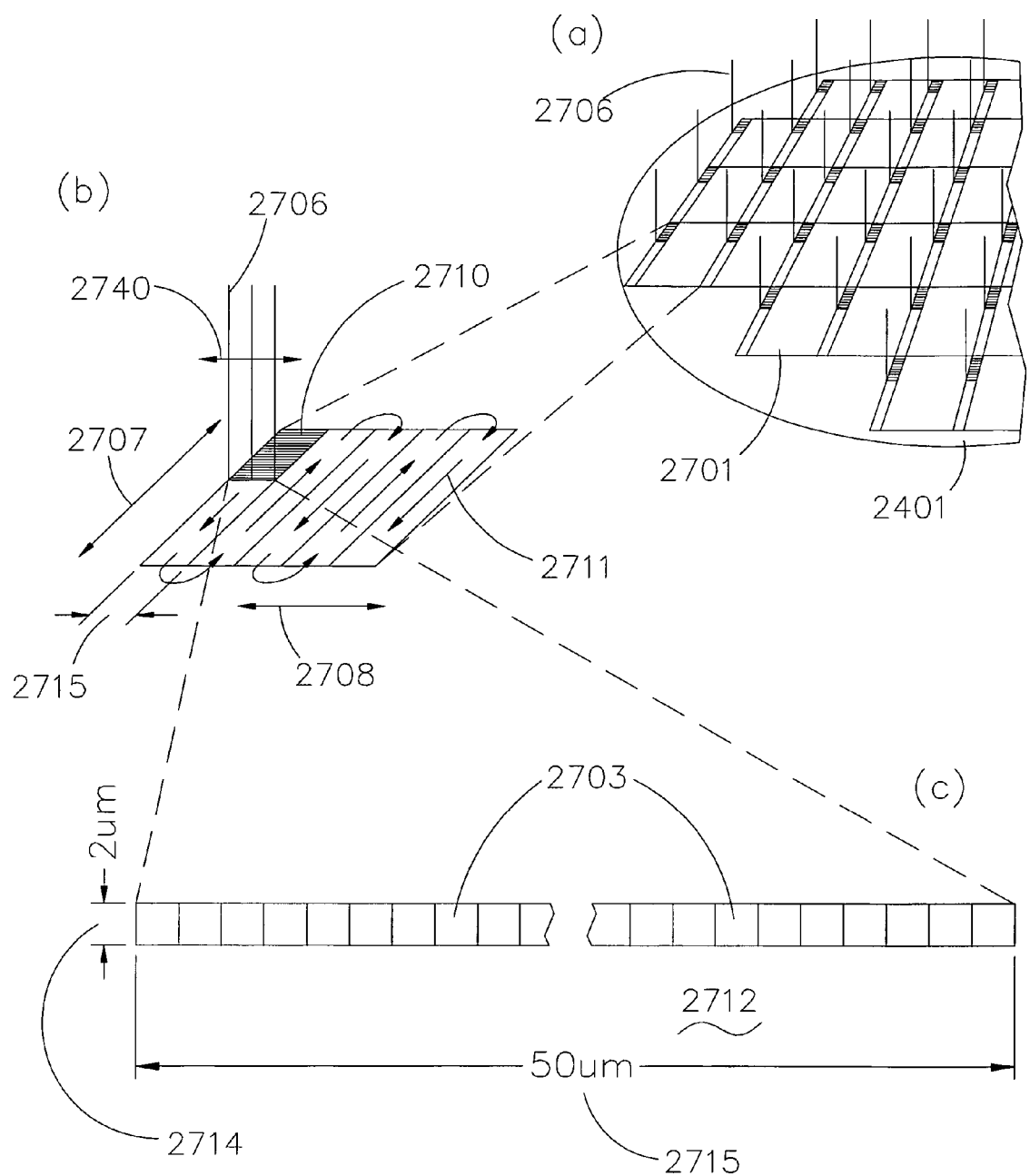
FIG. 27B is an illustration of an embodiment of the method for writing 50 µm-wide stripes simultaneously with a large number of columns positioned in an X-Y array.

FIG. 27B is an illustration of an embodiment of the method for writing 50 μm-wide stripes simultaneously with a large number of columns positioned in an X-Y array. View (a) is a perspective view of an array of beams 2706 (each equivalent to beam 222 in FIG. 2A), writing on a 300 mm wafer 2401 in parallel. Each beam 2706 writes an area 2701.

View (b) is a close-up of one area 2701, showing a beam 2706 writing the area 2710. Note that scan deflection 2740 maintains beam 2706 always perpendicular to the wafer surface 221, thereby giving telecentric scanning. In FIG. 27A, each scan writes a total of 25 subfields 2703, each 2 μm square. The wafer stage 2402 travels in a serpentine pattern 2711, alternately in the +Y, −Y, +Y, . . . directions, while beam scanning is in the X-direction 2740. Between scans 2707, the wafer steps 2708 along the X-direction over to the beginning of the next stripe 2702 to be written. View (c) is a detail view of the scan 2712, showing the 25 subfields 2703 and the 50 μm scan width 2715. During the writing of a scan 2715, the stage moves a distance 2714, in a "write-on-the-fly" process familiar to those skilled in the art.

Figure 27C:
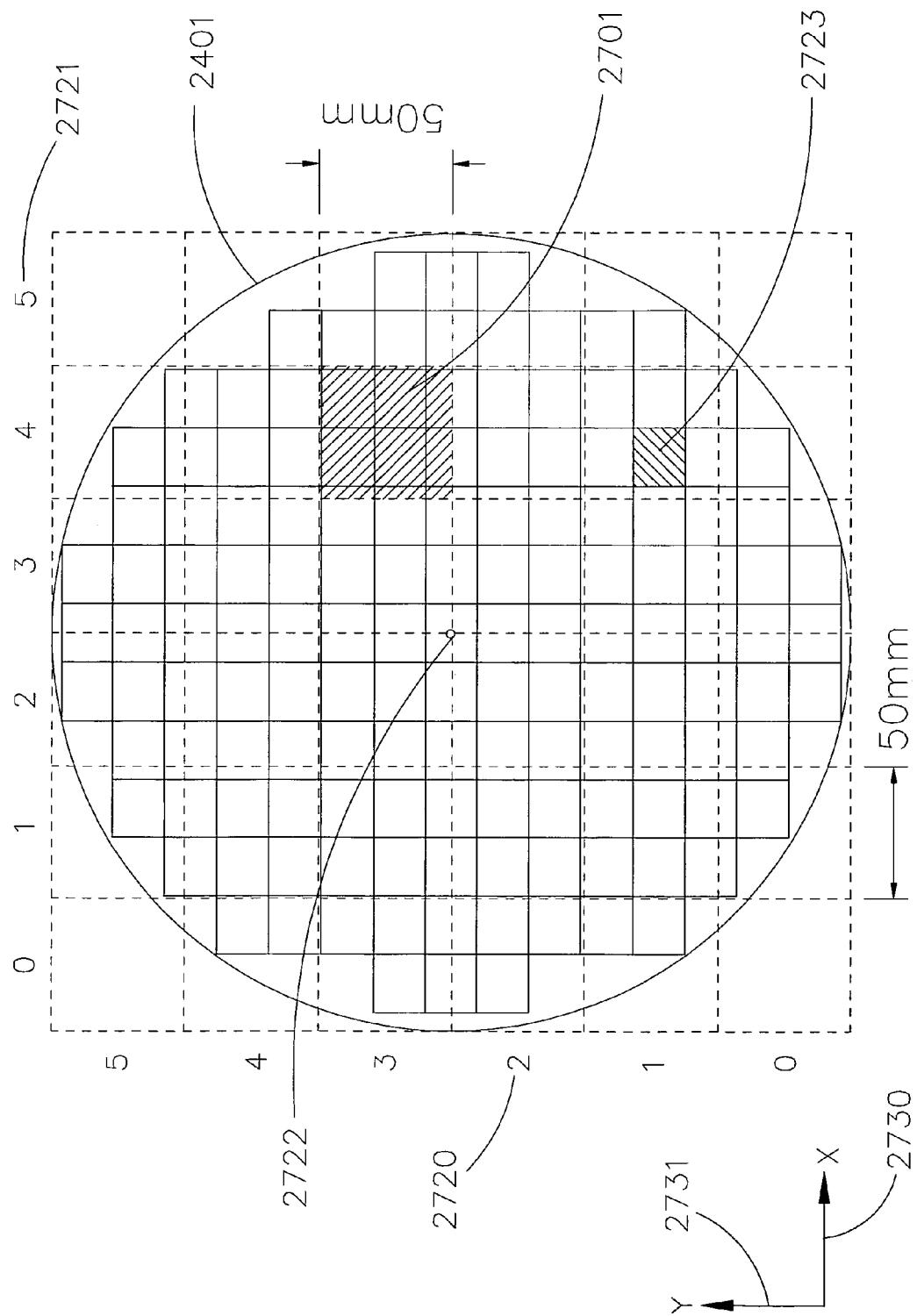
FIG. 27C is a diagram showing an example of the correspondence between the die arrangement on a typical 300 mm wafer and the column X-Y array.

FIG. 27C is a diagram showing an example of the correspondence between the die arrangement on a typical 300 mm wafer 2401 and the column X-Y array with X-axis 2730 and Y-axis 2731. Column writing areas 2701 have X-Y dimensions determined by the calculations for FIG. 27A, in this example (a 6×6 column array), 50 mm×50 mm. As shown, the corner columns [such as (0, 0), (0, 5), (5, 0) and (5, 5)] write very little area on the wafer. For larger column arrays (such as 7×7, 8×8 . . . ) it is possible to delete one or more columns at each of the four corners of the column array. The columns have X-labels 2721 and Y-labels 2720, where for a 6×6 column array, the labels range from 0 to 5. The column array center 2722 will be between columns for even-numbered arrays(such as 6×6, 8×8, . . . ) and will be at the center of a column for odd-numbered arrays (such as 7×7, 9×9, . . . ).

In this example, die 2723 dimensions have been assumed to be: X-dimension=22 mm, Y-dimension=19.5 mm. With no edge exclusion at the edge of wafer 2401, this gives 143 dies total. There is no requirement for the X-Y spacings of the column array to match the X-Y spacings of the die array on the wafer 2401.

Figure 28A:
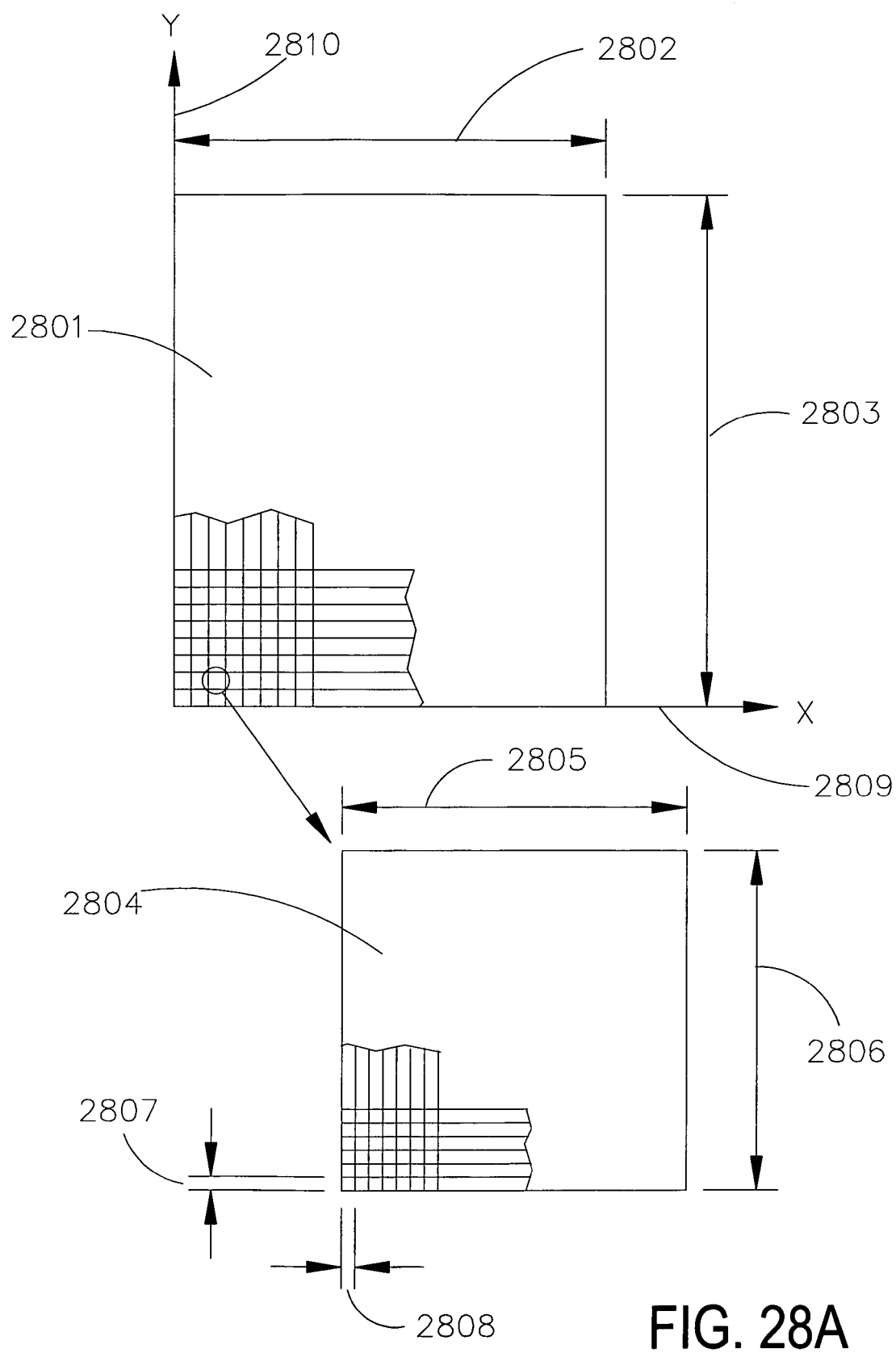
FIG. 28A is a diagram of integrated circuit (IC) pattern data broken down into 2 µm-square subfields having a 1 nm X-Y address grid.

FIG. 28A is a diagram of integrated circuit (IC) pattern data 2801 broken down into subfields 2804, each with a 2 μm X-dimension 2805 and with a 2 μm Y-dimension 2806. Subfields 2804 each have a 1 nm X-Y address grid 2807 and 2808. The exact same subfield and address-grid values are used for both the column beam addressing and for the IC pattern data—the requirement on the data path electronics is then to adjust the position of the writing beams (a maximum offset of ±1 μm in X-Y) to overlay the pattern data on the writing grid. The IC pattern data is aligned with the X-axis 2809 and Y-axis 2810, corresponding to the X-axis 2730 and Y-axis 2731 for the column array in FIG. 27C.

Figure 28B:
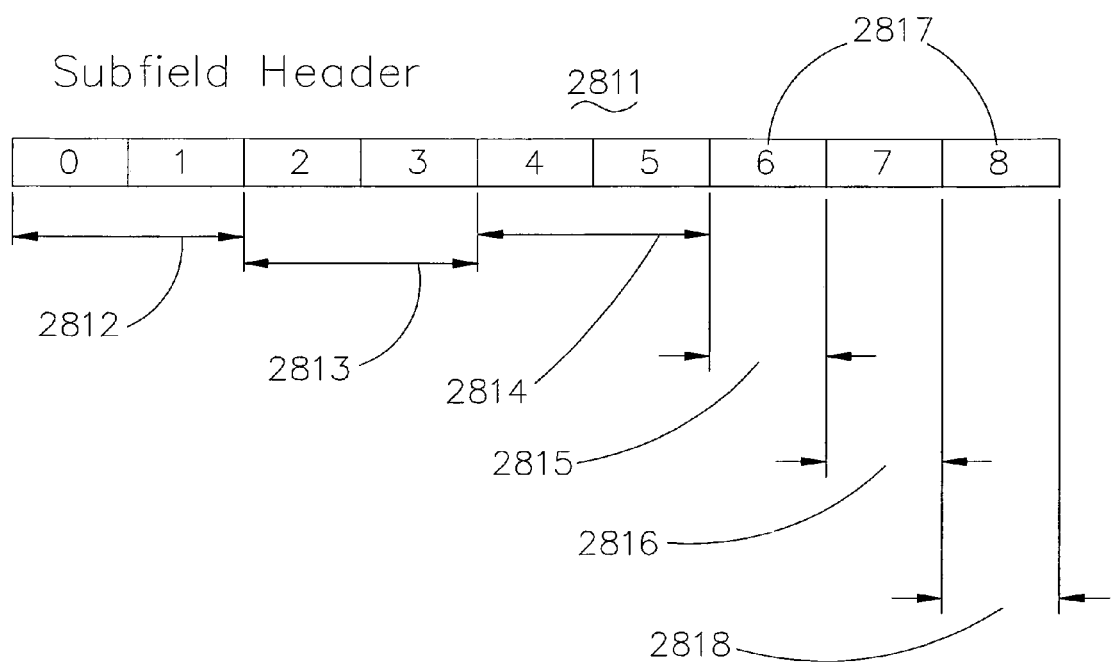
FIG. 28B is a diagrammatic representation of an example of a subfield header data format.

FIG. 28B shows an example of a subfield header data format. The subfield addressing requirements for the IC pattern data are as follows:

64 mm×64 mm maximum IC size (4096 mm²)
2 μm×2 μm subfield address grid within the IC
16-bit X-address of the subfield within the IC
16-bit Y-address of the subfield within the IC Within each 2 μm square subfield, the pattern addressing requirements are:

- 1 nm×1 nm pattern address grid within the subfield
- 16-bit X-coordinate of the pattern within the subfield
- 16-bit Y-coordinate of the pattern within the subfield For each subfield 2804 in the IC pattern data 2801, a subfield header 2811 is defined, consisting of 9 bytes 2817, and containing the following data fields:

| | |
|---|---|
| Bytes #0-1 2812 = | total number of patterns to be exposed within the 2 μm square subfield—the maximum number is $2^{16} - 1 = 65535$. |
| Bytes #2-3 2813 = | X-address of the subfield (−32768 μm to +32767 μm in 2 μm units). |
| Bytes #4-5 2814 = | Y-address of the subfield (−32768 μm to +32767 μm in 2 μm units). |
| Byte #6 2815 = | PEC dose level (from no correction = 255 to maximum correction = 0—see FIG. 29C). |
| Byte #7 2816 = | fraction of subfield area written (no writing = 0 to completely written = 255—see FIG. 29A). |
| Byte #8 2818 = | square beam size for writing this subfield (beam size = byte #8 value in nm: from 0 nm to 255 nm). |

If it were more efficient to write a subfield with more than one beam size, then multiple subfield data definitions (each with its own subfield header) would be required.

FIG. 28C is a diagrammatic representation of examples of pattern data formats for writing a single flash and multiple flashes. The data format 2820 for a single flash requires five bytes 2817:

| | |
|---|---|
| Byte #0 2821 | = pattern type (=1). |
| Bytes #1-2 2822 | = X-address of flash (−1000 nm to 1000 nm) |
| Bytes #3-4 2823 | = Y-address of flash (−1000 nm to 1000 nm) |

The data format 2838 for multiple (number=N) flashes requires 4N+2 bytes 2817:

| | |
|---|---|
| Byte #0 2821 | = pattern type (=2). |
| Byte #1 2825 | = number of flashes (2 to 255) |
| Bytes #2-3 2826 | = X-address of flash #1 (−1000 nm to 1000 nm) |
| Bytes #4-5 2827 | = Y-address of flash #1 (−1000 nm to 1000 nm) |
| Bytes #6-7 2829 | = X-address of flash #2 (−1000 nm to 1000 nm) |
| Bytes #8-9 2830 | = Y-address of flash #2 (−1000 nm to 1000 nm) |
| Bytes #10-11 2832 | = X-address of flash #3 (−1000 nm to 1000 nm) |
| Bytes #12-13 2833 | = Y-address of flash #3 (−1000 nm to 1000 nm) |
| ... | ... |
| Bytes #4N − 2 & 4N − 1 2835 | = X-address of flash #N (−1000 nm to 1000 nm) |
| Bytes #4N & 4N + 1 2836 | = Y-address of flash #N (−1000 nm to 1000 nm) |

FIG. 28D is a diagrammatic representation of examples of pattern data formats for writing a single line and a polyline. The data format 2840 for a single line requires nine bytes 2817:

| | |
|---|---|
| Byte #0 2821 | = pattern type (=3). |
| Bytes #1-2 2841 | = X-address of line start (−1000 nm to 1000 nm) |
| Bytes #3-4 2842 | = Y-address of line start (−1000 nm to 1000 nm) |
| Bytes #5-6 2844 | = X-address of line end (−1000 nm to 1000 nm) |
| Bytes #7-8 2845 | = Y-address of line end (−1000 nm to 1000 nm) |

The data format 2847 for a polyline (number=N) requires 4N+6 bytes 2817:

| | |
|---|---|
| Byte #0 2821 | = pattern type (=4). |
| Byte #1 2848 | = number of lines in the polyline (2 to 255) |
| Bytes #2-3 2849 | = X-address of line #1 start (−1000 nm to 1000 nm) |
| Bytes #4-5 2850 | = Y-address of line #1 start (−1000 nm to 1000 nm) |
| Bytes #6-7 2852 | = X-address of line #1 end (−1000 nm to 1000 nm) |
| | = X-address of line #2 start (−1000 nm to 1000 nm) |
| Bytes #8-9 2853 | = Y-address of line #1 end (−1000 nm to 1000 nm) |
| | = Y-address of line #2 start (−1000 nm to 1000 nm) |
| Bytes #10-11 2855 | = X-address of line #2 end (−1000 nm to 1000 nm) |
| | = X-address of line #3 start (−1000 nm to 1000 nm) |
| Bytes #12-13 2856 | = Y-address of line #2 end (−1000 nm to 1000 nm) |
| | = Y-address of line #3 start (−1000 nm to 1000 nm) |
| ... | ... |
| Bytes #4N+2-4N+3 2858 | = X-address of line #N end (−1000 nm to 1000 nm) |
| Bytes #4N+4-4N+5 2859 | = Y-address of line #N end (−1000 nm to 1000 nm) |

FIG. 28E is a diagrammatic representation of examples of pattern data formats for writing an entire subfield, for writing a rectangle, or for writing a triangle in the upper right quadrant. The data format 2861 to fill an entire subfield requires only one byte 2817:

| | |
|---|---|
| Byte #0 2821 | = pattern type (=5). |

The data format 2862 for a rectangle requires nine bytes 2817:

| | |
|---|---|
| Byte #0 2821 | = pattern type (=6). |
| Bytes #1-2 2863 | = X-address of upper left corner (−1000 nm to 1000 nm) |
| Bytes #3-4 2864 | = Y-address of upper left corner (−1000 nm to 1000 nm) |
| Bytes #5-6 2866 | = X-address of lower right corner (−1000 nm to 1000 nm) |
| Bytes #7-8 2867 | = Y-address of lower right corner (−1000 nm to 1000 nm) |

The data format 2869 for a triangle in the upper right quadrant requires nine bytes 2817:

| | |
|---|---|
| Byte #0 2821 | = pattern type (=7). |
| Bytes #1-2 2870 | = X-address of upper left corner (−1000 nm to 1000 nm) |
| Bytes #3-4 2871 | = Y-address of upper left corner (−1000 nm to 1000 nm) |
| Bytes #5-6 2873 | = X-address of lower right corner (−1000 nm to 1000 nm) |
| Bytes #7-8 2874 | = Y-address of lower right corner (−1000 nm to 1000 nm) |

For writing triangles in the upper left, lower left and lower right quadrants, the pattern types are 8, 9 and 10, respectively. The data formats for pattern types 8-10 are identical to that for pattern type 7, above.

Figure 28F:
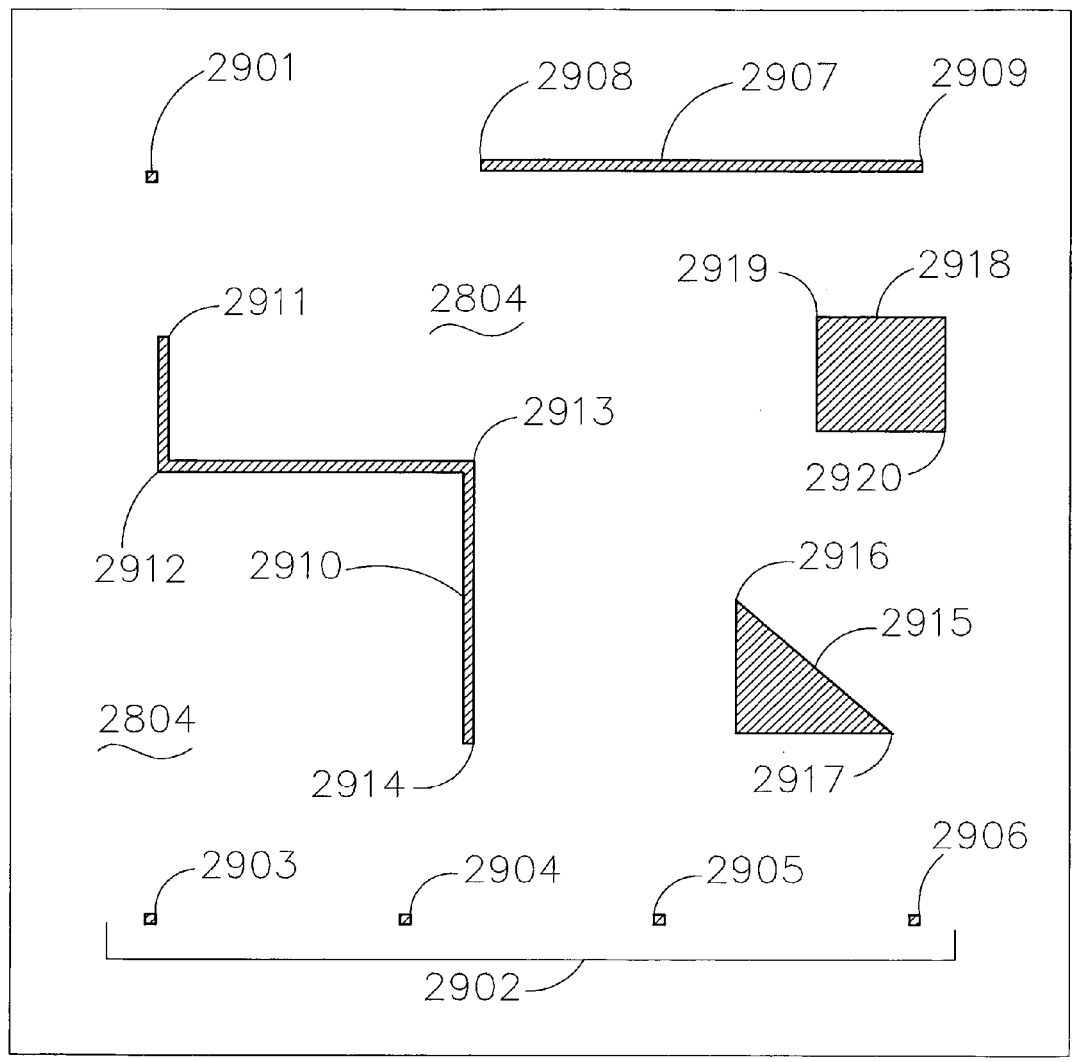
FIG. 28F shows an illustrative example of a typical subfield containing multiple written pattern types.

FIG. 28F shows an illustrative example of a typical subfield 2804 containing multiple written pattern types:

Type #1—single flash at location ($X_{sf}, Y_{sf}$) 2901, where the subscript "sf" denotes a single flash.

Type #2—multiple flashes 2902 at locations ($X_{mf1}, Y_{mf1}$) 2903, ($X_{mf2}, Y_{mf2}$) 2904, ($X_{mf3}, Y_{mf3}$) 2905, and ($X_{mf4}, Y_{mf4}$) 2906. The subscripts "mfX" denote multiple flashes, and X is the flash number (1-4 in this example).

Type #3—a single line 2907 starting at location ($X_{sl0}, Y_{sl0}$) 2908 and ending at location ($X_{sl1}, Y_{sl1}$) 2909. The "sl" subscripts denote a single line.

Type #4—a polyline 2910 starting at location ($X_{pl0}, Y_{pl0}$) 2911, going to point ($X_{pl1}, Y_{pl1}$) 2912, then point ($X_{pl2}, Y_{pl2}$) 2913 and ending at point ($X_{pl3}, Y_{pl3}$) 2914. The "pl" subscripts denote a polyline.

Type #6—a rectangle 2918 with upper left corner at ($X_{r0}, Y_{r0}$) 2919 and lower right corner at ($X_{r1}, Y_{r1}$) 2920. The "r" subscripts denote rectangle.

Type #9—a triangle 2915 in the lower left quadrant with upper left corner at ($X_{tc0}, Y_{tc0}$) 2916 and lower right corner at ($X_{tc1}, Y_{tc1}$) 2917. The "tc" subscripts denote triangle type c (lower left quadrant). Other triangle types are: type a (upper right quadrant)—"ta", type b (upper left quadrant)—"tb", and type d (lower right quadrant)—"td".

Figure 29A:
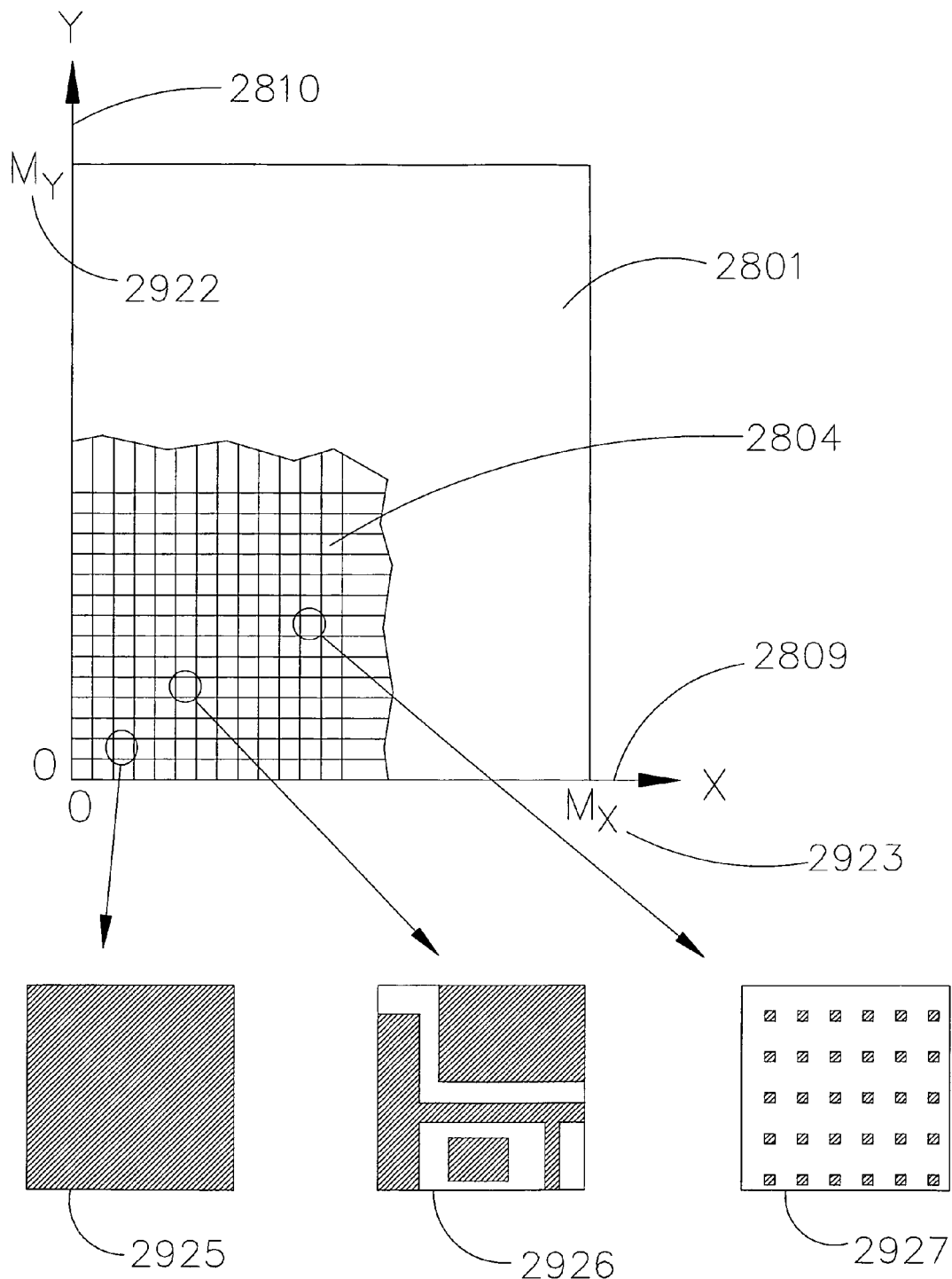
FIG. 29A shows a diagrammatic representation of the first step in the proximity effect correction (PEC) scheme, where the fractions written in each subfield are calculated.

FIG. 29A shows a diagrammatic representation of the first step in the proximity effect correction (PEC) scheme, where the area fractions written in each subfield 2804 are calculated. Given the IC pattern data 2801, defined relative to the X-axis 2809 and Y-axis 2810, the numbers of subfields $M_X$ 2923 and $M_Y$ 2922 along each axis are:

$M_X$=(IC X-dimension in µm)/(2 µm) (rounded down)

$M_Y$=(IC Y-dimension in µm)/(2 µm) (rounded down)

Note that the subfield numbering along the X-axis 2809 goes from 0 to $M_X$ 2923 and along the Y-axis 2810 from 0 to $M_Y$ 2922, so the total number of subfields in the IC pattern data =M=($M_X$+1)($M_Y$+1). If all subfields are to be written with a single beam size, then $M_{datasets}$=M, where $M_{datasets}$ is the number of subfield datasets required. If some subfields are to be written with multiple beam sizes, then $M_{datasets}$>M. For example, if $N_j$=the number of subfields to be written with j different beam sizes Where j=1, 2, . . .

Then $$\sum_{j=1}^{\infty} N_j = M \text{ and } \sum_{j=1}^{\infty} (jN_j) = M_{datasets}$$

It is unlikely that more than 2-3 different beam sizes will be optimal for any one subfield due to the time overheads required for setting up each beam size.

Now for each subfield 2804, the total fraction of the subfield area to be written is calculated. Examples are:

subfield (2,1) 2925 which is fully written [could be part of a bonding pad] so its fraction=1.0 and the value of byte #7 2816 in the subfield header 2811 would be=255.

subfield (5,4) 2926 which is heavily written at around 70% of the subfield area, so its fraction=~0.7 and the value of byte #7 2816 in the subfield header 2811 would be=179≈0.7×255.

subfield (11,7) 2927 which is sparsely written at around 15%, giving a fraction of ~0.15 and the value of byte #7 2816 in the subfield header 2811 would be=38 0.15× 255.

Once the total fraction to be written is calculated for each subfield 2804, the data is stored in byte #7 2816 of the subfield data header. If multiple beam sizes are to be used for any particular subfield, the value for the total area to be written is stored in byte #7 2816 of each subfield dataset—the total area to be written in this case would be the sum of the values of byte #7 2816 for all of the datasets for that particular subfield 2804. Note that the calculation of total area to be written for each subfield 2804 is completely independent of the areas to be written in other subfields 2804.

Figure 29B:
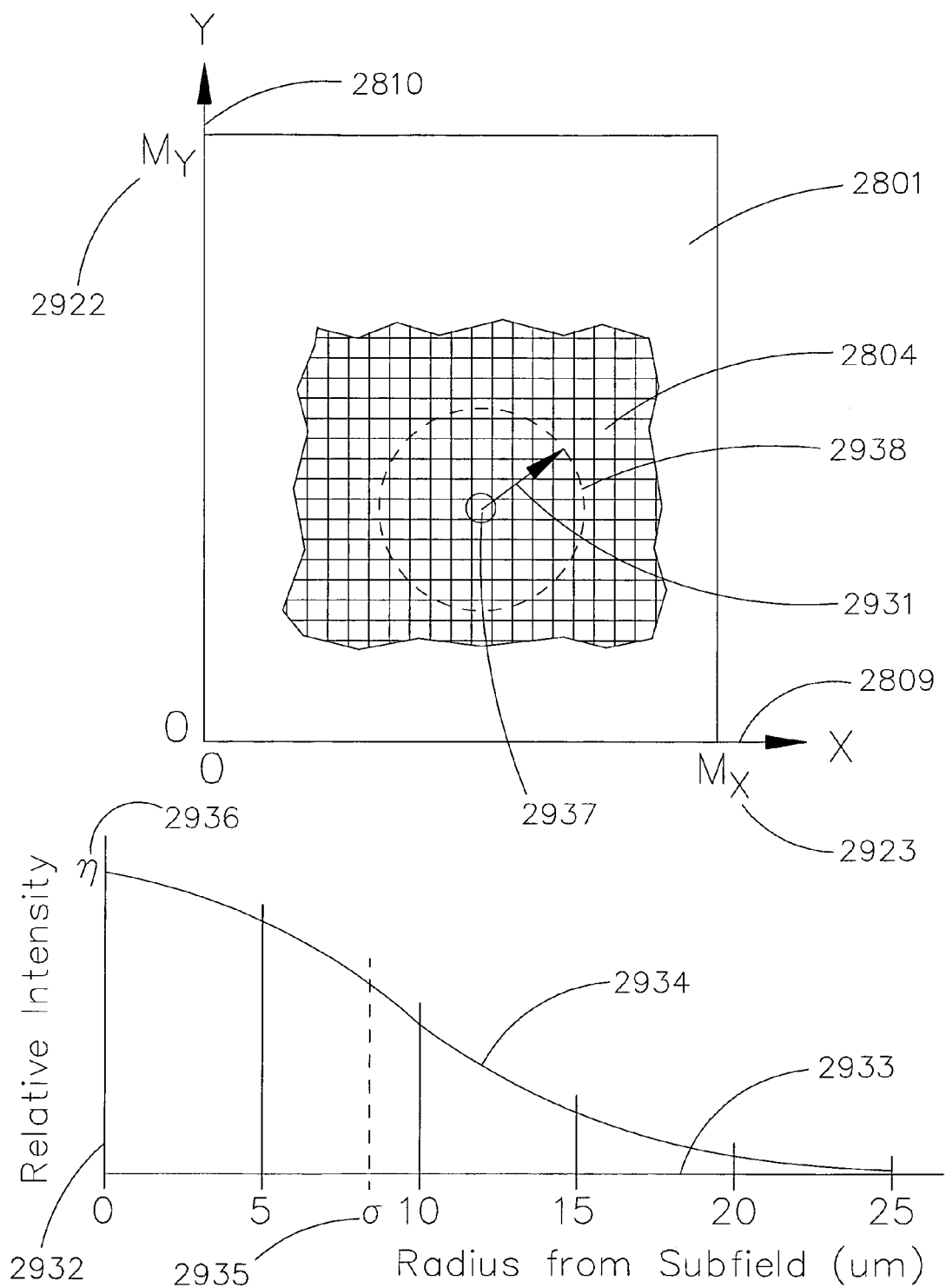
FIG. 29B shows a diagrammatic representation of the second step in the PEC scheme, where the total backscattered electron (BSE) dose for each subfield is calculated, assuming no PEC corrections to the primary beam doses.

FIG. 29B shows a diagrammatic representation of the second step in the PEC scheme, where the backscattered electron (BSE) dose at subfield 2937 is being calculated, assuming no PEC corrections to the primary beam doses in any subfields 2804. The IC pattern data 2801 is the same as in FIG. 29A. For each subfield (i, j), [where i=0 to $M_X$ and j=0 to $M_Y$], a weighted sum of the backscattered electron dose from all neighboring subfields is calculated using the relative intensity graph shown. With increasing radius 2931 away from subfield (i, j) 2937, the contributions drop off as shown by curve 2934, plotted against the relative intensity scale 2932. The BSE distribution is assumed to be isotropic, so that the BSE contributions to the total dose at subfield 2937 will be the same around the circle 2938. The maximum possible backscattered contribution is η 2936, the backscattered electron coefficient—this is relevant for the eight subfields directly around subfield (i, j) and for subfield (l, j), itself. The contribution from each subfield is proportional to the fraction of that subfield being written, as calculated in step 1. (FIG. 29A). The formula for the total backscattered dose d(i, j) at subfield (i, j) is then:

R(m, n; i, j)≡$\sqrt{[(m-i)^2+(n-j)^2]}$(2 µm)=radius from (m, n) to (i, j)

s[R(m, n; i, j)]=relative intensity at subfield (i, j) from BSE scattering at subfield (m, n)

f(m, n)=fraction of area written in subfield (m, n)

p(m, n)≡1 for now (will be varied in the next step)

K=scale factor $$d(i, j) = K \sum_{m=0}^{M_X} \sum_{n=0}^{M_Y} s[R(m, n; i, j)] f(m, n) p(m, n) \quad \text{(eq. 1)}$$

Note that the summation over m and n includes subfield (i, j) since backscattered electrons from within the subfield (i, j) being calculated also contribute to the BSE background dose.

Figure 29C:
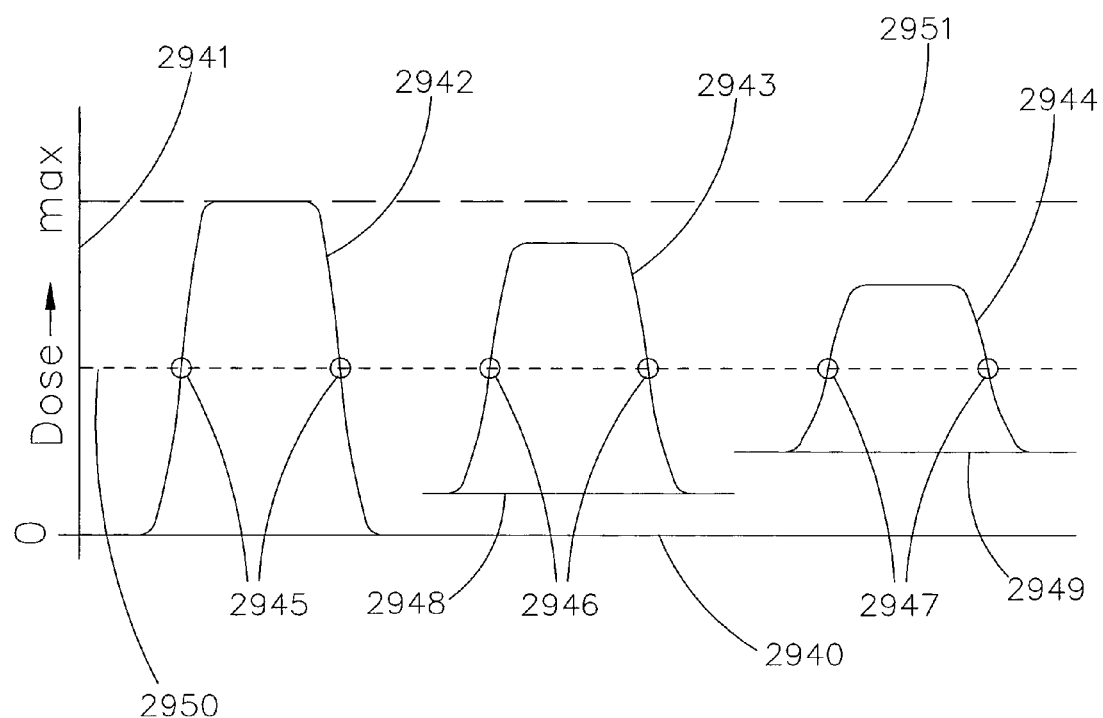
FIG. 29C shows a diagrammatic representation of the third step in the PEC scheme, where the total dose at each subfield is calculated by combining the primary beam dose plus the BSE dose.

FIG. 29C shows a diagrammatic representation of the third step in the PEC scheme, where the total dose at each subfield is calculated by combining the primary beam dose plus the BSE dose. The physical process occurring is that within each pattern being written in subfield (i, j), there are three contributions to the resist dose:

(1) primary electrons in the writing beam for the pattern being written (2) backscattered electrons from other patterns within subfield (i, j)

(3) backscattered electrons from neighboring subfields (m, n).

FIG. 29C shows how the writing dose can be reduced to compensate for contributions (2) and (3), a process familiar to those skilled in the art called proximity effect correction (PEC). At the left, the dose profile 2942 (plotted against the relative axis 2941) corresponds to the case of a minimal BSE background dose, thus no PEC is needed. For maximum process latitude, it is beneficial to adjust the writing dose so that the resist exposure dose occurs at the points of maximum slope in the dose profile, in this case at points 2945. Variations in resist processing or writing beam currents will then have a minimal effect on line width variation. The writing dose 2951 is twice the level of the required exposure dose 2950 with no PEC.

The middle example shows the case for a medium level of BSE background 2948 at about 30% of the exposure dose. To maintain process latitude, the writing dose 2943 has been reduced by the same percentage, or twice the amount of BSE background 2948 as shown, thus maintaining points 2946 at the exposure dose indicated by the dashed line. The exposure dose is reduced by twice as much because the writing dose 2951 is twice the exposure dose 2950.

The right example represents dense lines and spaces, where the largest BSE background occurs. In this example, the BSE background 2949 is about 60% of the exposure dose 2950, requiring a 60% reduction in the writing dose 2944, in order to maintain points 2947 at the exposure dose 2950.

After the BSE background d(i, j) for all i=0, . . . , $M_X$ and j=0, . . . , $M_Y$ has been determined, the first-pass dose correction can be done. For all subfields (i, j), calculate the correction factor p(i, j):

$$p(i,j) = 1 - 2\, d(i,j)$$

Now recalculate all the values of d(i, j) using these new values for p(i, j)—the result will give smaller values for d(i, j), which, in turn will give larger values for p(i, j). Thus, the process of finding a self-consistent solution for p(i, j) is oscillatory, but typically converges within a few cycles. Once the values for p(i, j) are no longer changing by some preset limit, the process is terminated and the calculated values for p(i, j) are multiplied by 255 and stored in byte #6 2815.

Typical Electrode Voltages for the Column in FIG. 2A

| | |
|---|---|
| Tip Voltage 201 | 0 V |
| Extraction Electrode 202 | 2800-3400 V typical |
| First Source Lens Electrode 203 | 432-638 V in this example (FIG. 16D) |
| Beam-limiting Aperture 204 | = First Source Lens Electrode 203 |
| Second Source Lens Electrode 205 | 512 V |
| Source Mounting Plate 206 | 512 V |
| Upper Alignment Deflector/Stigmator 207 | 818 V ± Deflection and Stigmation Voltages |
| Lower Alignment Deflector 208 | 5000 V ± Deflection Voltages |
| Beam-Trimming Aperture 276 | 5000 V |
| Upper Blanker 277 | 5000 V ± Blanking Voltages (~1.7 V) |
| Lower Blanker 278 | 5000 V ± Blanking Voltages (~1.54 V) |
| Beam-Defining Aperture Mount 220 | 5000 V |
| Patterned Beam-Defining Aperture 212 | 5000 V |
| Upper Mainfield Deflector 213 | 5000 V ± Deflection Voltages (<3 V) |
| Lower Mainfield Deflector 214 | 5000 V ± Deflection Voltages (<3 V) |
| Subfield Deflector/Stigmator 215 | 5000 V ± Deflection & Stigmation Voltages (<1 V) |
| Focus-1 Electrode Assembly 216 | 5000 V ± Lens Offset Voltages (<3 V) |
| Focus-2 Electrode Assembly 217 | ~4906 V to ~5220 V ± Lens Offset Voltages (<100 V) |
| Field-Free Tube 218 | 49986 V |
| Detector Assembly 219 | 54000 V |
| Voltage Contrast Plate 220 | 49986 V |
| Substrate 221 | 50000 V |

One possible writing strategy to utilize one or more electron optical columns to write a series of stripes on a resist-covered wafer is shown in FIG. 27B. As an example, assume a 6×6 array of identical columns is positioned above a 300 mm wafer. The column spacing can then be determined:

$$\text{Column spacing} = (\text{wafer diameter}) / \sqrt{(\text{number of columns})}$$
$$= (300 \text{ mm}) / \sqrt{(6 \times 6)}$$
$$= (300 \text{ mm}) / 6 = 50 \text{ mm}$$

Each column will only need to write a 50 mm×50 mm square area of the wafer. When a particular column has completed writing its area, each of the other 35 columns will have simultaneously completed writing their respective areas and the wafer is complete. The area to be written by each column is broken down into a series of 50 μm wide parallel stripes as shown in FIG. 27A, where the total number of stripes was determined to be 1000.

Within each stripe, a column writes on the resist in a series of "flashes", each exposing a square area using the high current density beam on a resist with a pre-determined sensitivity (assumed to be 5 μC/cm$^2$). The time per flash is then determined by the beam current density at the outer edges of the shaped beams. As shown in FIG. 21C, the beam current densities range from 2000 A/cm$^2$ (30 nm and 120 nm square beams), to 2500 A/cm$^2$ (~80 nm square beam) up to 3000 A/cm$^2$ (40 nm square beam):

$$\text{Time per flash} = (\text{resist sensitivity})/(\text{beam current density})$$
$$= (5\ \mu C/cm^2) / (3000 A/cm^2) = 1.67 \text{ ns}$$
$$= (5\ \mu C/cm^2) / (2500 A/cm^2) = 2.00 \text{ ns}$$
$$= (5\ \mu C/cm^2) / (2000 A/cm^2) = 2.50 \text{ ns}$$

These calculated flash times are graphed in FIG. 21C.

Each flash requires that the beam be deflected to a new position on the wafer surface, thus a 1 ns set-up time has been assumed. The total pixel writing time is then determined by:

Total pixel writing time=(# flashes/subfield)[(time/flash)+(set-up time)]

where a subfield is assumed to be 2.0 μm×2.0 μm.

Figure 30:
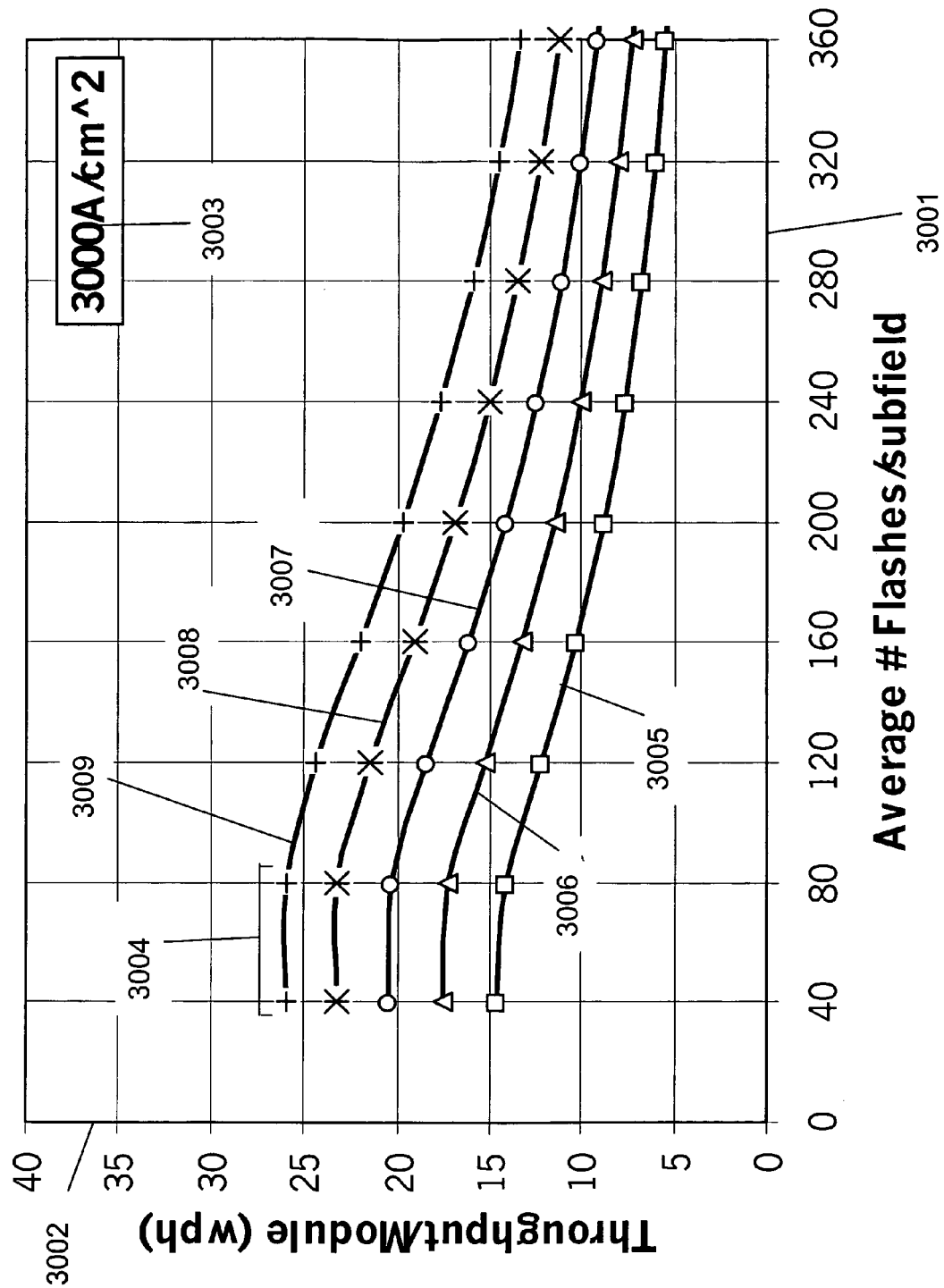
FIG. 30 is a graph of calculated throughput against the average number of flashes per subfield for one lithographic module having various numbers of columns from 6×6 up to 10×10, assuming a required exposure current of 3000 A/cm².

The overall pattern density determines the average # flashes/subfield—this is left as a variable in FIG. 30. As would be expected, higher pattern densities require more flashes/subfield 3001 on average, with a resultant lower patterning throughput 3002.

As the stage moves along the length of the stripe (alternately in the +Y and -Y directions 2707—see FIG. 27B), the electron beam is electrostatically scanned perpendicularly 2740 (along the X-axis) across the width 2715 of the stripe. With the 50 μm stripe assumed here, the total number of subfields/scan was determined in FIG. 27A to be 25. Including a 10 ns scan retrace time, the total time per scan will then be:

Time/scan=(# subfields/scan)(time/subfield)+(scan retrace time)

In this writing strategy, scanning is accomplished using electrostatic beam deflection=±(scan width)/2 relative to the optical axis. The total number of scans required to write the length of an entire stripe can now be found (where the stripe length=column spacing):

$$\# \text{ scans} = (\text{column spacing})/(\text{subfield dimension})$$
$$= (50 \text{ mm})/(2.0 \text{ }\mu\text{m}) = 25000$$

One strategy for the stage motion during writing is to move continuously under the writing beams (one per column). In this case, the stage speed will be:

Stage speed=(subfield dimension)/(time/scan)

With the number of flashes/subfield as a variable, the stage speed ranges from ~550 mm/s (limited by the 1 g=9800 mm/s$^2$ stage acceleration and the 50 mm length of stripes 2702) down to <50 mm/s, decreasing as either the number of flashes/subfield increases or as the beam current density decreases.

Finally, a 45 s overhead has been assumed for each wafer to allow for wafer transfer, global alignment, local alignment, and all other functions required between the end of writing one wafer and beginning writing on the next. The total time per wafer then consists of the combination of the writing times for all stripes+stage turn-around times for all stripes+wafer overhead. Throughput is inversely proportional to the total time per wafer.

FIG. 30 is a graph of calculated throughput 3002 against the average number of flashes per subfield 3001 for one lithographic module having various numbers of columns from 6×6 up to 10×10, assuming a required exposure current 3003 of 3000 A/cm$^2$—this corresponds to an optimized 40 nm square beam. Subfields are assumed to be 2 μm square with average numbers of flashes/subfield ranging from 40 to 360. Curve 3005 corresponds to a 6×6 column array, with each column writing an area of 50 mm×50 mm. Curve 3006 corresponds to a 7×7 column array, where each column writes no more than 42.9 mm×42.9 mm. Curve 3007 corresponds to an 8×8 column array, where each column writes no more than 37.5 mm×37.5 mm. Curve 3008 corresponds to a 9×9 column array, where each column writes no more than 33.4 mm×33.4 mm. Finally, curve 3009 corresponds to a 10×10 column array, where each column writes no more than 30 mm×30 mm. For large numbers of flashes (>160/subfield), throughput is roughly inversely proportional to the average number of flashes, while, for smaller numbers of flashes in region 3004, throughput is limited by the maximum stage acceleration (assumed to be 9800 mm/s$^2$=1 g). Note that if the entire 2 μm square subfield were to be written with a 40 nm beam, this would require a prohibitively large number of flashes: [(2 μm)/(40 nm)]$^2$=2500 flashes—this underlines the need for variable-sized beams.

Similar graphs for 30 nm, ~80 nm and 120 nm beams can be plotted, wherein the current densities shown in FIG. 21C are used. For all beam sizes other than the (optimized) 40 nm square beam, the throughputs are slightly decreased from those shown in FIG. 30.

With a 120 nm square beam spaced on 125 nm centers, an entire 2 μm square subfield could be written with: [(2 μm)/(125 nm)]$^2$=256 flashes—this is an acceptable number, even allowing for the required 2.50 ns dwell time. It is important to be able to completely fill entire subfields in a reasonable time because with the large numbers of columns possible using the column design described here, it is likely that at least one column at any time will be writing a bonding pad, while the other columns are writing areas with finer features. To maintain throughput, it is necessary that the system is able to maintain the writing speed of all columns since the writing strategy requires that all columns stay in synchronism while writing.

The invention described above can be extended to include the case of two beam-defining apertures in a single electron beam column. The two apertures could be used together to define the beam at the substrate. The two apertures are both centered on the optic axis and are axially separated from each other. Further patterned beam-defining apertures may be added, as described above, to give a multiplicity of apertures in a single column.

Multiple beam-defining apertures may be incorporated in an electron beam column to allow a choice of different beam shapes at the substrate. The apertures may be attached to a single aperture blade and then moved on axis as needed; alternatively, they may be attached to separate retractable aperture blades in different parts of the column; in a further alternative they may be positioned close to the optic axis between upper and lower deflection optics, allowing the desired aperture to be selected by deflection of the beam (using the upper deflection optics) with the beam then redeflected onto the optic axis (after passing through the selected aperture) using the lower deflection optics; etc.

The electron optics may be configured to allow the electron beam to be expanded, reduced, or distorted, such that the beam at the substrate becomes an expanded, reduced or distorted version of the shape determined by the beam-defining aperture. An example of a useful distortion of a square beam would be a reduction along one axis so as to form a rectangle. Other distortions might include conversion of a square beam into a beam shaped as a parallelogram. Electron optical elements that might be used to achieve such effects include quadrupole and octupole lenses.

Although the design procedure for the patterned beam-defining aperture 212 described herein employed numerical methods, an alternative analytical method is also possible. Referring to FIG. 1, the functions of blocks 102-106 remain the same, however, in block 108, instead of numerical ray-tracing, an analytical model of the operation of the optics is generated and then used to determine which rays of the circular beam pass within the desired patterned beam profile, and which rays pass outside the desired patterned beam profile. The analytical model of the optics is generated using ray-tracing, however, this analytical approach offers the opportunity to potentially improve the PBDA 212 design by reducing the effects of numerical errors in the ray-tracing calculations. This improvement is accomplished by smoothing the analytical model derived from the ray-tracing calculations to even out small (nm-scale) fluctuations in ray intercept values at the wafer surface 221. Once this analytical procedure has been used to generate the PBDA design in block 112, the remainder of the PBDA design procedure described in FIG. 1 is the same.

For the design illustrated in the example herein, the practical range of beam sizes is approximately 30 nm up to 120 nm. For other electron optical designs embodying the present invention, the range in beam sizes could be from 15-20 nm up to 400-500 nm.

What is claimed is:

1. A lithography tool for patterning resist coated substrates comprising:
   a charged particle source, configured to produce a charged particle beam;
   a first lens positioned below said charged particle source, said first lens being configured to form said charged particle beam into a substantially laminar charged particle beam;
   a stage positioned below said first lens, for carrying said resist coated substrates;
   a second lens positioned between said first lens and said stage, said second lens being configured to focus said substantially laminar charged particle beam onto the surface of said resist coated substrate;
   a patterned beam-defining aperture positioned between said first lens and said second lens, said patterned beam-defining aperture being configured to block a large portion of charged particles in said substantially laminar charged particle beam that cannot be focused by said second lens into a predetermined beam profile at the surface of said resist coated substrate; and
   wherein said electron source, first lens, patterned beam-defining aperture, and second lens are configured (1) to form a non-circular shaped beam at the surface of said resist coated substrate and (2) to map charged particle current passing through multiple separated areas of said beam-defining aperture onto a single area at said resist coated substrate.

2. A lithography tool as in claim 1, further comprising a beam blanker positioned between said first lens and said patterned beam-defining aperture, for blanking said substantially laminar charged particle beam.

3. A lithography tool as in claim 2, wherein said beam blanker is a double-deflection beam blanker configured to project the effective blanking plane back to the position of the virtual source.

4. A lithography tool as in claim 2, further comprising a beam-trimming aperture positioned between said first lens and said beam blanker.

5. A lithography tool as in claim 4, wherein said beam-trimming aperture is configured to provide equal exposure time for all open areas of said patterned beam-defining aperture as said substantially laminar beam is swept across said patterned beam-defining aperture during blanking, and wherein said beam-trimming aperture is configured to minimize blanking time.

6. A lithography tool as in claim 5, wherein said beam-trimming aperture has a square-shaped opening and said patterned beam-defining aperture has an opening the shape of which is derived from a square.

7. A lithography tool as in claim 1, further comprising a beam deflector positioned between said patterned beam-defining aperture and said second lens.

8. A lithography tool as in claim 7, wherein said beam deflector is a double deflector, configured to allow telecentric scanning of said beam.

9. A lithography tool as in claim 8, wherein said second lens is configured to allow the effective axis of said second lens to move paraxially with said beam during scanning.

10. A lithography tool as in claim 1, wherein said patterned beam-defining aperture is further configured to transmit a large portion of charged particles in said substantially laminar beam that can be focused by said second lens into said predetermined beam profile at said surface of said resist coated substrate.

11. A lithography tool as in claim 1, wherein said patterned beam-defining aperture is comprised of a patterned conductive material.

12. A lithography tool as in claim 1, wherein said patterned beam-defining aperture is comprised of a patterned thick film supported by a continuous charged-particle-transparent membrane.

13. A lithography tool as in claim 1, wherein said charged particle is an electron.

14. A lithography tool as in claim 1, wherein said mapping of current passing through said multiplicity of separated areas in said patterned beam-defining aperture to said single area at said resist coated substrate surface is an N to 1 mapping, N being an integer greater than 1.

15. A lithography tool as in claim 1, wherein said patterned beam-defining aperture is configured to produce a square shaped beam.

16. A lithography tool for patterning resist coated substrates comprising:
   a charged particle source, configured to produce a charged particle beam;
   a first lens positioned below said source, said first lens being configured to form said charged particle beam into a substantially laminar charged particle beam;
   a stage positioned below said first lens, for carrying said resist coated substrates;
   a second lens positioned between said first lens and said stage, said second lens being configured to focus said substantially laminar charged particle beam onto the surface of said resist coated substrate;
   a multiplicity of patterned beam-defining apertures positioned between said first lens and said second lens, said apertures being configured to block a large portion of charged particles in said substantially laminar beam that cannot be focused by said second lens into a predetermined beam profile at the surface of said resist coated substrate; and
   wherein said electron source, first lens, multiplicity of patterned beam-defining apertures, and second lens are configured (1) to form a non-circular shaped beam at the surface of said resist coated substrate and (2) to map charged particle current passing through multiple separated areas of any one of said multiplicity of beam-defining apertures onto a single area at said resist coated substrate.

17. A lithography tool as in claim 16, wherein said multiplicity of patterned beam-defining apertures is further configured to transmit a large portion of charged particles in said substantially laminar beam that can be focused by said second lens into said predetermined beam profile at said surface of said resist coated substrate.

18. A lithography tool as in claim 16, wherein all of said multiplicity of patterned beam-defining apertures are axially separated from each other along the optic axis of said tool and all of said apertures act upon said beam to produce said predetermined beam profile at said surface of said resist-coated substrate.

19. A lithography tool as in claim 18, wherein said multiplicity of patterned beam-defining apertures is two patterned beam defining apertures.

20. A lithography tool as in claim 16, wherein said multiplicity of patterned beam-defining apertures is positioned on a single aperture blade, and said aperture blade is configured to allow insertion in said beam of any one of said multiplicity of patterned beam-defining apertures.

21. A patterned beam-defining aperture in a charged particle column, wherein said aperture and said column are configured to give an N to 1 mapping of points in the plane of said aperture to points in a focal plane of said column, N is an integer greater than 1, said aperture is configured to produce a non-circular shaped beam in said focal plane of said column, and charged particle current passing through multiple separated areas of said beam-defining aperture is mapped onto a single area at said focal plane of said column.

22. A patterned beam-defining aperture as in claim 21, wherein said aperture is configured to exclude a large portion of charged particles that do not contribute to a desired beam profile in said focal plane of said column.

23. A patterned beam-defining aperture as in claim 21, wherein said aperture is positioned below a beam blanker in said column.

24. A patterned beam-defining aperture as in claim 23, wherein said patterned beam-defining aperture also functions as a blanking aperture.

25. A patterned beam-defining aperture as in claim 21, wherein said patterned beam-defining aperture is configured to produce a square shaped beam in said focal plane.

26. A patterned beam-defining aperture as in claim 21, wherein N equals 3.

27. A method of designing a patterned beam-defining aperture in a charged particle column for generation of a shaped charged particle beam, comprising the steps of:
calculating charged particle trajectories for said charged particle column;
determining whether said trajectories fall within a desired beam profile at a focal plane of said charged particle column; and
defining an ideal patterned beam-defining aperture wherein said ideal aperture blocks all of said trajectories that do not contribute to said desired beam profile at said focal plane.

28. A method as in claim 27, wherein said calculating step comprises calculating a multiplicity of sets of trajectories, each set of trajectories corresponding to a different beam position in a scan field in said focal plane.

29. A method as in claim 28, further including the step of mapping the intersection of said multiplicity of sets of trajectories with the plane of the patterned beam-defining aperture to define charged-particle-transparent regions, and wherein said defining step further includes incorporating said charged-particle-transparent regions into said ideal patterned beam-defining aperture.

30. A method as in claim 27, further comprising the step of modifying said ideal patterned beam-defining aperture design to give a realizable patterned beam-defining aperture design, wherein said realizable aperture is a close approximation to said ideal patterned beam-defining aperture, and wherein a large portion of charged particle trajectories not contributing to said desired beam profile are blocked by said realizable aperture.

31. A method as in claim 27, further comprising the step of modifying said ideal patterned beam-defining aperture design to give a realizable patterned beam-defining aperture design, wherein said realizable aperture is a close approximation to said ideal patterned beam-defining aperture, and wherein a large portion of said charged particle trajectories contributing to said desired beam profile are allowed to pass through said realizable aperture.

32. A method as in claim 31, wherein a large portion of said charged particle trajectories not contributing to said desired beam profile are blocked by said realizable aperture.

33. A method as in claim 31, wherein said realizable aperture has additional structures not present in said ideal aperture, said additional structures being positioned where openings exist in said ideal aperture, said additional structures providing mechanical integrity.

34. A method as in claim 31, wherein said realizable aperture is comprised of a patterned conductive material.

35. A method as in claim 31, wherein said realizable aperture is comprised of a patterned thick film supported by a continuous charged-particle-transparent membrane.

36. A method as in claim 27, wherein said charged particle is an electron.

37. A method as in claim 27, wherein said calculating step comprises using a numerical method of ray-tracing to generate said charged particle trajectories.

38. A method as in claim 27, wherein said calculating step comprises using an analytical model of said column to generate said charged particle trajectories.

39. A method of optimizing the position of a patterned beam-defining aperture in a charged particle column, comprising the steps of:
(a) calculating charged particle trajectories for said charged particle column;
(b) determining whether said trajectories fall within a desired beam profile at a focal plane of said charged particle column;
(c) defining an ideal patterned beam-defining aperture wherein said ideal aperture blocks all of said trajectories that do not contribute to said desired beam profile at said focal plane;
(d) defining a realizable patterned beam-defining aperture, wherein said realizable aperture is a close approximation to said ideal patterned beam-defining aperture, wherein a large portion of said charged particle trajectories not contributing to said desired beam profile are blocked by said realizable aperture, and wherein charged particle current passing through multiple separated areas of said realizable patterned beam-defining aperture is mapped onto a single area at said focal plane of said charged particle column;
(e) performing steps (a) through (d) for different positions of said patterned beam-defining aperture in said column; and
(f) selecting an optimum position for said patterned beam-defining aperture, said optimum position being a position where the beam profile generated by said realizable patterned beam-defining aperture at said focal plane is closest to said desired beam profile at said focal plane.

40. A method as in claim 39, wherein said selecting step includes consideration of manufacturability of said realizable aperture.

41. A method as in claim 39, wherein said selecting step includes consideration of current density in said charged-particle beam at said focal plane.

42. A method as in claim 39, wherein said selecting step includes consideration of the profile of the current density in said charged-particle beam at said focal plane.

43. A method as in claim 39, wherein said selecting step includes consideration of heating of said realizable aperture due to charged-particle bombardment.

44. A lithography tool as in claim 16, wherein said mapping of current passing through said multiplicity of separated areas in any one of said patterned beam-defining apertures to said single area at said resist coated substrate surface is an N to 1 mapping, N being an integer greater than 1.

* * * * *